United States Patent [19]

Suma

[11] Patent Number: 5,770,964

[45] Date of Patent: Jun. 23, 1998

[54] ARRANGEMENT ENABLING PIN CONTACT TEST OF A SEMICONDUCTOR DEVICE HAVING CLAMP PROTECTION CIRCUIT, AND METHOD OF TESTING A SEMICONDUCTOR DEVICE

[75] Inventor: Katsuhiro Suma, Hyogo, Japan

[73] Assignee: Mitsubishi Denki Kabushiki Kaisha, Tokyo, Japan

[21] Appl. No.: 675,759

[22] Filed: Jul. 3, 1996

[30] Foreign Application Priority Data

Aug. 29, 1995 [JP] Japan .................................... 7-220442

[51] Int. Cl.⁶ .................................................. H03K 5/08
[52] U.S. Cl. ......................... 327/328; 327/327; 327/534
[58] Field of Search .................... 327/534, 537, 327/546, 545, 309, 318, 319, 321, 327, 328, 407, 408, 411, 564–566; 365/226, 229, 201

[56] References Cited

U.S. PATENT DOCUMENTS

| | | | |
|---|---|---|---|
| 5,023,476 | 6/1991 | Watanabe et al. ...................... | 327/540 |
| 5,119,337 | 6/1992 | Shimisu et al. ......................... | 327/534 |
| 5,189,316 | 2/1993 | Murakami et al. ..................... | 327/535 |
| 5,321,653 | 6/1994 | Suh et al. ................................ | 327/541 |
| 5,400,290 | 3/1995 | Suma et al. ............................. | 365/226 |
| 5,448,199 | 9/1995 | Park ........................................ | 327/538 |
| 5,467,026 | 11/1995 | Arnold .................................... | 327/530 |
| 5,615,158 | 3/1997 | Ochoa et al. ............................ | 327/52 |

FOREIGN PATENT DOCUMENTS

| | | | |
|---|---|---|---|
| 61-232658 | of 1985 | Japan ............................. | H01L 27/06 |
| 5-242698 | of 1992 | Japan ............................. | G11C 29/00 |
| 6-194424 | of 1993 | Japan ............................. | G01R 31/28 |

OTHER PUBLICATIONS

Fundamentals of MOS Digital Integrated Circuits, by John P. Uyemura, 1988, Chapter 10, p. 586.

*Primary Examiner*—Toan Tran
*Attorney, Agent, or Firm*—McDermott, Will & Emery

[57] ABSTRACT

A clamp circuit for clamping potential of an internal node electrically connected to an external terminal has its clamping function activated and inactivated selectively in accordance with a control signal generated by a control circuit in response to a forced monitor mode activating signal. An output portion of a substrate potential generating circuit generating a prescribed internal voltage is selectively connected to the internal node in response to a control signal generated from a second control circuit in response to the forced monitor mode activating signal. In a semiconductor device having the clamp circuit for absorbing surge current, pin contact test, external monitoring of an internal potential and external application of the internal potential can be realized.

20 Claims, 23 Drawing Sheets

ARRANGEMENT ENABLING PIN CONTACT TEST OF A SEMICONDUCTOR DEVICE HAVING CLAMP PROTECTION CIRCUIT, AND METHOD OF TESTING A SEMICONDUCTOR DEVICE

BACKGROUND OF THE INVENTION

1. Field of the Invention

The present invention relates to a semiconductor device, and more specifically, to a semiconductor device having a protection circuit for clamping potential at an internal node connected to an external terminal, and to a method of testing therefor. More specifically, the present invention relates to an arrangement and method for setting potential of an internal node exactly at a prescribed voltage level.

2. Description of the Background Art

Various semiconductor devices such as microcomputers, memory devices and gate arrays are embedded in various electric products including personal computers and work stations. Of these semiconductor devices, many are formed by MOS transistors (insulated gate type field effect transistors) which are suitable for higher degree of integration and lower power consumption. A DRAM (Dynamic Random Access Memory) is known as a memory constituted by MOS transistors. Memory capacity of the DRAM has been much increased recently, and it comes to be used as a main memory for a personal computer or a work station. Since personal computers and work stations come to have higher performance at lower cost, the DRAM is also required of higher performance at lower cost. However, various characteristics tests necessary for providing high performance and highly reliable DRAM products come to be ever complicated, which results in longer test time, which in turn results in higher product cost.

In order to cope with this problem, in logic devices such as microcomputers and gate arrays, a testability function has been long incorporated in the step of design, so as to facilitate tests. However, also in a semiconductor memory, testability design comes to be essential to solve this problem. As one such testability design, there is JEDEC (Joint Electron Device Engineering Counsel) standardized multibit test related to reduction in test time of the DRAM. In the multibit test, data is compressed so as to reduce number of accesses and to reduce test time. More specifically, to a plurality of memory cells which require a plurality of accesses in total in a normal mode, same data is written in only one access in the test mode. The data which have been written to the plurality of memory cells are read in the chip device, and a signal indicating whether or not the logics of the read data coincide with each other is output in one access cycle. Since a plurality of memory cells are tested simultaneously, test time can be significantly reduced as compared with one-by-one testing of the memory cells.

Various test modes not standardized by JEDEC have also been proposed for the DRAM. For example, there is a method realizing a high temperature operation at a room temperature, as disclosed, for example, in Japanese Patent Laying-Open No. 5-242698. In this method, the number of stages of inverters in a delay chain constituted by a plurality of cascade connected inverters for providing a delay to a specific control signal is reduced in the test mode, and a specific access path (data input/output path) related to the delay chain is short-circuited. As the number of stages of the inverters constituting the delay chain is reduced, delay time is reduced, and as the specific access path is short-circuited, time for data transfer is reduced, and hence the operation at a high temperature is equivalently realized by the operation at an ordinary temperature.

Further, there is a method of testing reliability of a semiconductor device by changing a level of a substrate bias voltage applied to a semiconductor substrate region so as to accelerate failure of the semiconductor device associated with the substrate bias voltage.

Further, a method facilitating external monitoring as to whether an internal voltage is at a prescribed voltage level or not by transmitting an internal voltage generated in the device to a specific pad in a test mode, such as disclosed in Japanese Patent Laying-Open No. 6-194424, has been proposed.

Further, in the semiconductor device, various protection circuits are also provided to ensure reliability during normal operation.

FIG. 34 shows the structure of the input protection circuit disclosed, for example, in Japanese Patent Laying-Open No. 61-232658. Referring to FIG. 34, the input protection circuit is connected between an external pin terminal 7 and an internal circuit 11. The input protection circuit includes a resistor 8, for limiting current, connected between an input node NA of internal circuitry 11 and external terminal 7, a P+/N− junction diode 9a connected in forward direction between internal node NA and a power supply node VCC, and a P−/N+ junction diode 9b connected in reverse direction between internal node NA and a ground node VSS.

Internal circuit 11 has a structure of CMOS inverter constituted by a p channel MOS transistor 11a and an n channel MOS transistor 11b, which inverts a logic of a signal applied to internal node NA for transmission to another internal circuit. Internal circuit 11 simply has a function of an input buffer.

P+/N− junction diode 9a and P−/N+ junction diode 9b have junction breakdown voltages increased, by increasing impurity concentration at portions which are connected to the internal node NA. The operation will be briefly described.

Now, forward voltage drop of junction diode 9a is represented by V9a and forward voltage drop of junction diode 9b is represented by V9b. When the voltage VA at internal node NA becomes equal to or higher than VCC+V9a, junction diode 9a is rendered conductive, preventing the voltage VA at node NA from attaining a voltage level exceeding VCC+V9a. Here, VCC also represents the voltage at power supply node VCC. By contrast, when the voltage VA at node NA becomes equal to or lower than VSS−V9b, junction diode 9b is rendered conductive, supplies current from ground node VSS to internal node NA to increase the voltage at internal node NA, so as to prevent the voltage VA at internal node NA from lowering to be VSS−V9b or lower. Provision of junction diodes 9a and 9b prevents the voltage level at internal node NA from attaining too high or too low when a noise such as surge is applied to external terminal 7, and hence, prevents dielectric breakdown of MOS transistors 11a and 11b caused by application of excessive current to the internal circuit 11. Resistor 8 has a function of preventing breakdown of PN junction caused by a large current flowing through junction diode 9a and/or 9b when excessive voltage is applied to external terminal 7. Further, resistor 8 has a function of suppressing excessive current flow, when such excessive current is generated at external terminal 7.

Since the input protection circuit such as described above is employed, the voltage VA at internal node NA is kept at a voltage level between VCC+V9a and VSS−V9b, application of abnormal voltage to internal circuit can be prevented, and hence malfunction or breakdown of internal circuit 11 caused by abnormal voltage is prevented. Thus reliability of the semiconductor device is ensured.

The semiconductor device is shipped with being sealed in a package by, for example, resin seal. In addition to wafer level tests, the semiconductor device is also subjected to final test before shipment. At this final test, all signals are input/output through an external pin terminal (lead terminal) as the semiconductor device has already been sealed in a package. If, at that time, such an input protection circuit as shown in FIG. 34 is provided and the signal is input/output through external terminal 7, desired test may not be correctly carried out.

FIG. 35 shows an example of an arrangement for internal voltage detection test. FIG. 35 shows an arrangement in which voltage level of a substrate potential VBB generated by a substrate potential generating circuit 15 is externally monitored. Substrate potential generating circuit 15 applies a bias voltage of a negative potential to a p type semiconductor substrate region (well region or semiconductor layer) in a semiconductor memory device, for example, so as to stabilize a threshold voltage of an n channel MOS transistor, to prevent formation of a parasitic MOS transistor and to prevent soft error in the semiconductor memory device. An n channel MOS transistor Q1 for connection, which is rendered conductive in response to a test mode designating signal φc for electrically connecting an output portion of substrate potential generating circuit 15 to internal node NA is provided at the output portion of substrate potential generating circuit 15.

In the normal operation mode, test mode designating signal φc is at a low level corresponding to the level of negative potential VBB, transistor Q1 is off, and the output portion of substrate potential generating circuit 15 is disconnected from internal node NA.

When substrate potential VBB is to be monitored, test mode designating signal φc attains to the high level, and transistor Q1 turns on. The output portion of substrate potential generating circuit 15 is electrically connected to internal node NA, and negative voltage VBB from substrate potential generating circuit 15 is transmitted to internal node NA. Internal node NA is connected to external terminal 7 through resistor 8. Therefore, by externally monitoring the voltage level at external terminal 7, the voltage level of substrate potential VBB generated by substrate potential generating circuit 15 can be detected. Therefore, whether or not the substrate potential generating circuit 15 operates correctly can be identified externally.

However, there is junction diode 9b connected between internal node NA and ground node VSS. Therefore, when the absolute value of the voltage level of substrate voltage VBB transmitted to internal node NA becomes larger than the forward voltage drop V9b of junction diode 9b, junction diode 9b is rendered conductive, clamping the voltage level at internal node NA at the voltage level of −V9b. Therefore, when the absolute value of the negative voltage VBB generated by substrate potential generating circuit 15 becomes larger than the forward voltage drop of junction diode 9b, it becomes impossible to correctly measure the voltage level of the substrate voltage VBB generated by substrate potential generating circuit 15.

More specifically, if the absolute value of negative voltage VBB is larger than the forward voltage drop V9b (=Vclamp) of junction diode 9b as shown in FIG. 36, the voltage level of negative voltage VBB transmitted to internal node NA is clamped by junction diode 9b, and hence the voltage VMON monitored at external terminal 7 would not be the actual voltage level of negative voltage VBB, but rather the voltage level of clamp level Vclamp (=V9b) which is higher than the actual level by the potential ΔV. Therefore, the voltage VMON externally monitored through external terminal 7 has a voltage level different from that of the negative voltage VBB actually generated by substrate potential generating circuit 15, making it impossible to detect correct potential level.

The junction diode 9b shown in FIGS. 34 and 35 is used for an IF leak test which will be described later, and hence it is not possible to remove the junction diode 9b.

FIG. 37A shows an arrangement for IF leak test (pin contact test). As shown in FIG. 37A, resistor 8 is connected to a pad 70a provided in the periphery of the semiconductor device chip. Pad 70a is electrically connected to external terminal 7 through a bonding wire 70b. In the IF leak test (pin contact test), whether or not the external terminal 7 and pad 70a are surely connected electrically is tested. More specifically, at this test, a negative voltage VEN is applied through an ampere meter 70c to external terminal 7. When the absolute value of negative voltage VEN applied to external terminal 7 becomes larger than the forward voltage drop V9b of junction diode 9b, current IA flows from ground node VSS to external terminal 7 through resistor 8, pad 70a and bonding wire 70b.

FIG. 37B shows voltage-current characteristic at the IF leak test (pin contact test). By determining whether or not the current value IM detected by ampere meter 70c is at a prescribed value or higher when the negative voltage VF of a prescribed voltage level is applied to external terminal 7, it is possible to determine whether or not external terminal 7 and pad 70a are electrically connected reliably.

In order to perform the IF leak test (pin contact test) such as described above, it is not possible to remove junction diode 9b. Therefore, as long as there is junction diode 9b in the input protection circuit, exact external monitoring of the voltage level of the substrate potential VBB generated by substrate potential generating circuit 15 such as shown in FIG. 35 is not possible after the semiconductor device is packed.

Further, in the final test of the semiconductor device, when a test voltage of a desired voltage level is applied from external terminal 7 to an internal node (for example, output portion of substrate potential generating circuit 15 of FIG. 35) different from the internal node NA so as to accelerate failure or operating margin and if the test voltage is a negative voltage, it is impossible to apply a negative voltage of which absolute value is larger than the forward voltage drop of junction diode 9b to the desired internal node, because of the clamping function of junction diode 9b shown in FIG. 34 or 35. Accordingly, internal state of the semiconductor device cannot be externally set, and hence desired characteristic test cannot be performed. The characteristic test includes, as will be described in greater detail later, a test in which pause refresh failure is accelerated by making deeper the substrate bias in the semiconductor memory device.

The above described problems caused by the clamp diode in the input protection circuit are experienced not only when the negative voltage is applied but also when a high voltage is applied.

SUMMARY OF THE INVENTION

An object of the present invention is to provide a semiconductor device having internal circuit protection function which allows desired test accurately even after the semiconductor device is sealed in a package.

Another object of the present invention is to provide a semiconductor device in which voltage of a desired level can be exchanged between external and internal nodes during testing, and which can protect internal circuitry from abnormal voltage/current such as external surge in normal operation mode.

A still further object of the present invention is to provide a semiconductor device having internal circuit protection function which allows external monitoring of internal potential after the device is packed in a package, application of external potential to an internal node, and pin contact test.

The semiconductor device in accordance with the present invention includes a first clamp circuit connected between an internal node coupled to an external pin terminal and a first reference voltage source for clamping the potential of the internal node at a first prescribed potential level, and a control circuit responsive to a test mode designating signal for generating a control signal for inhibiting clamping operation of the first clamp circuit and for applying the generated control signal to the first clamp circuit.

A method of testing a semiconductor device in accordance with the present invention includes the steps of applying a test mode designating signal to stop operation of an internal voltage generating circuit, and supplying an external voltage to an output portion of the internal voltage generating circuit.

In the test mode operation, the clamp circuit clamping the internal node at a prescribed potential os inactivated, and hence it becomes possible to accurately apply a voltage of a desired level externally to an internal node without any influence of the clamp level of the clamp circuit, and it becomes possible to externally monitor the voltage at the internal node through an external terminal.

When the test mode designating signal is inactivated, the clamp circuit starts its operation, clamping the internal node at a prescribed potential level. Therefore, test such as pin contact test (IF leak test) can be performed accurately.

Further, since the operation of the internal voltage generating circuit is stopped in test mode operation, it becomes possible to set the internal voltage accurately at the desired voltage level externally, and hence necessary characteristic test can be performed accurately.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
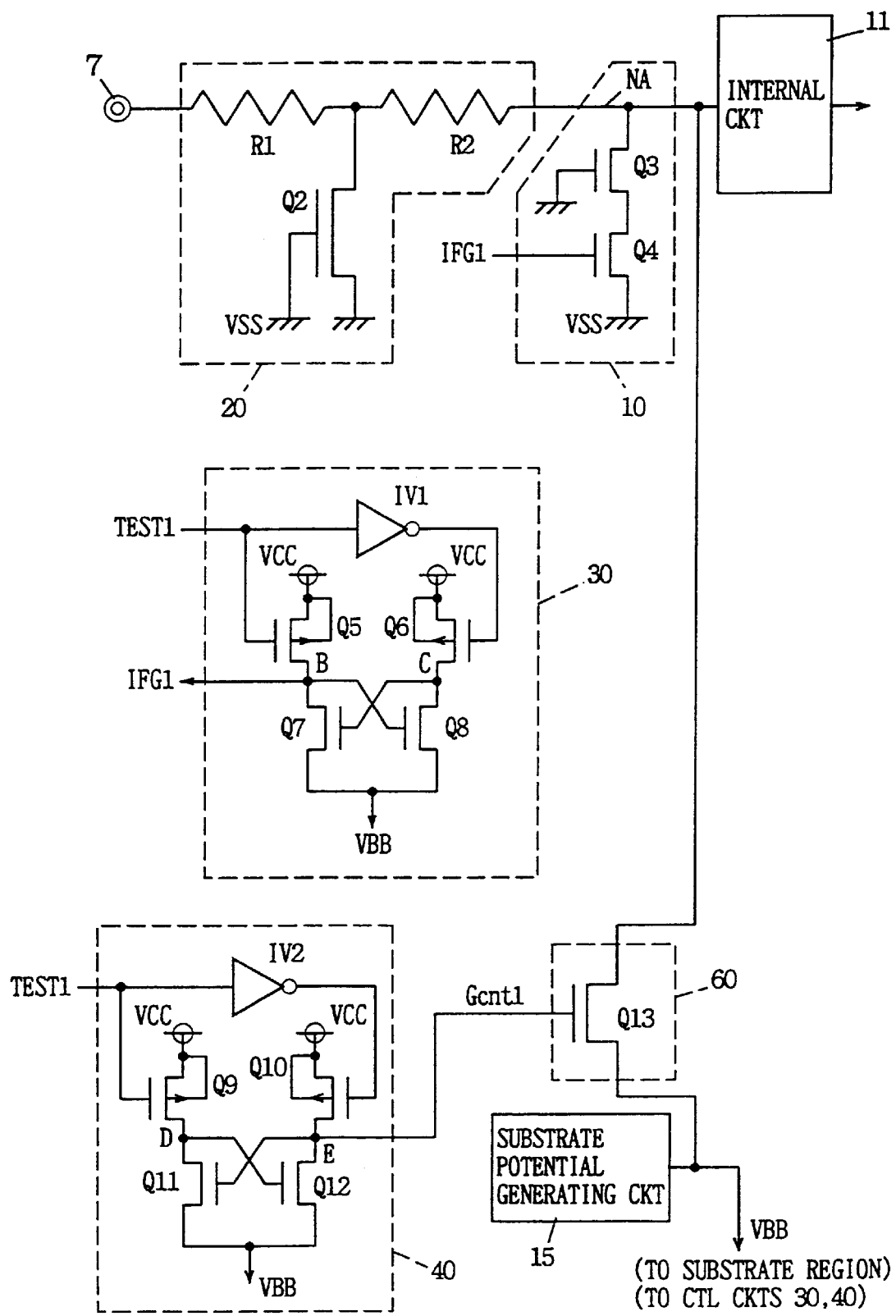
FIG. 1 schematically shows a structure of a main portion of a semiconductor device in accordance with a first aspect of the present invention.

FIG. 1 shows a structure of a main portion of a semiconductor device in accordance with the first embodiment of the present invention. Referring to FIG. 1, the semiconductor device includes a first clamp circuit 10 for clamping a potential at internal node NA at a prescribed potential; a first protection circuit 20 provided between internal node NA and external terminal 7; and a first control circuit 30 responsive to a test mode designating signal TEST1 for generating and applying to the first clamp circuit 10, a control signal IFG1 inhibiting clamping operation of the first clamp circuit 10.

Figure 34:
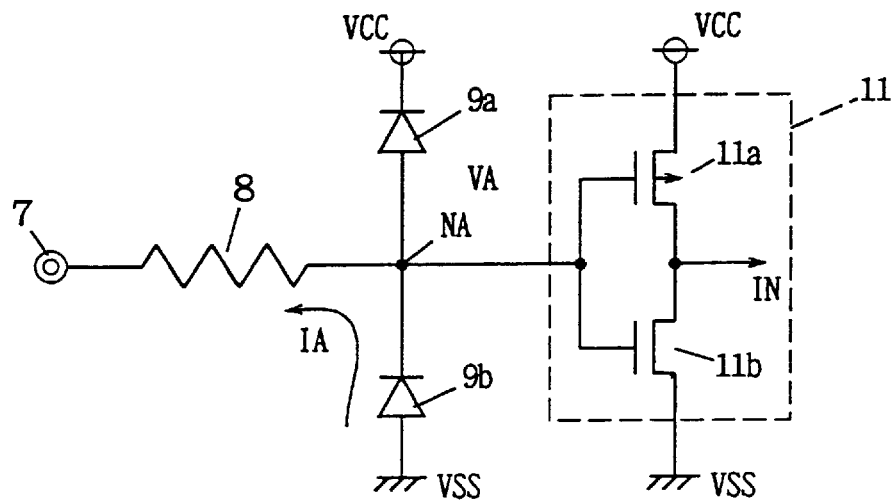
FIG. 34 schematically shows a structure of an input portion of a conventional semiconductor device.
Figure 35:
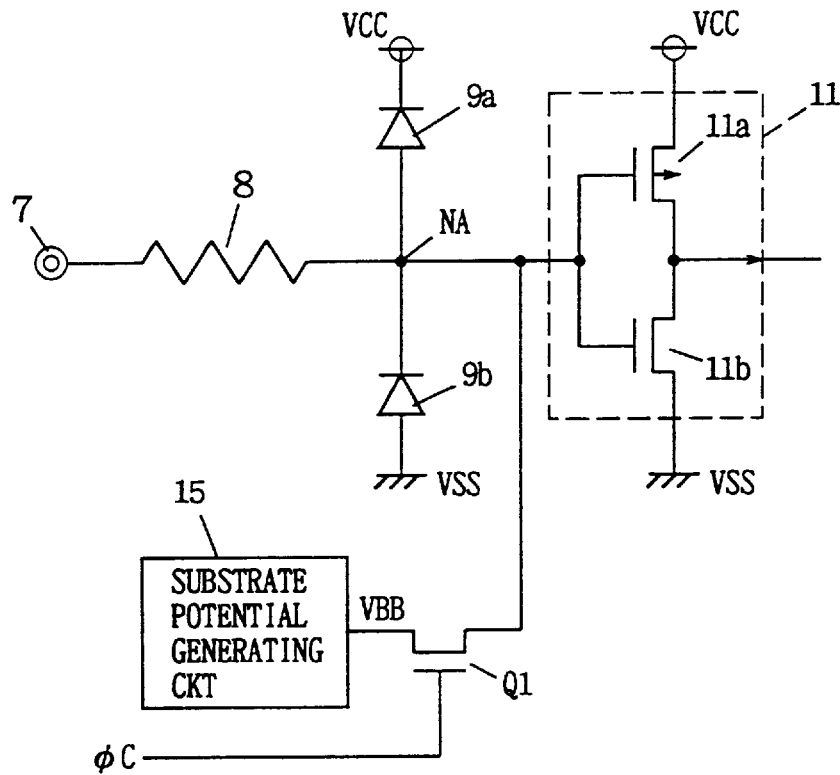
FIG. 35 schematically shows a structure for externally monitoring a substrate potential of a conventional semiconductor device.
Figure 36:
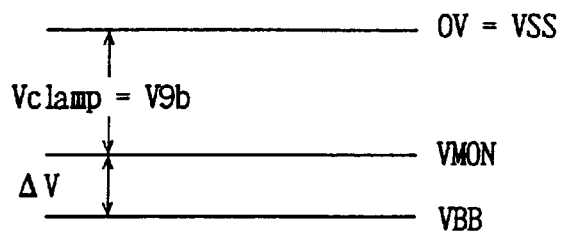
FIG. 36 is an illustration showing the problem experienced in the structure of FIG. 35.
Figure 37A:
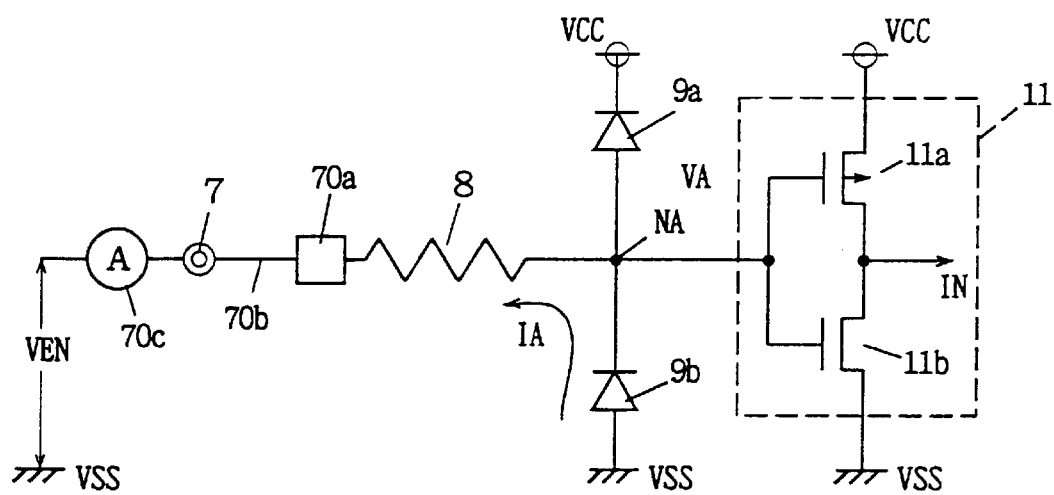
FIG. 37A shows a manner of pin contact test of a conventional semiconductor device.
Figure 37B:
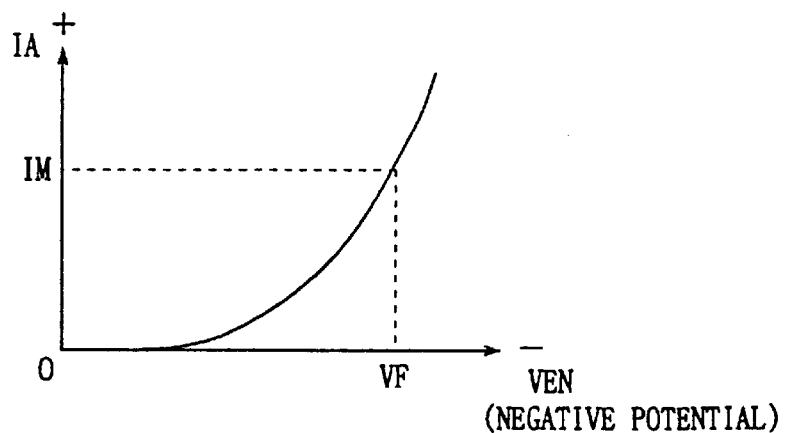
FIG. 37B shows relation between applied voltage and current at the time of pin contact test.

Internal circuit 11 has similar structure as that shown in FIG. 34, which operates using power supply voltage VCC and ground voltage VSS as operational power supply voltages, performs prescribed buffer processing on a signal at internal node NA and transmits the processed signal to another internal circuit.

First clamp circuit 10 includes an n channel MOS transistor Q3 having one conduction electrode node connected to internal node NA, a gate electrode node coupled to receive ground voltage VSS and another conduction node; and an n channel MOS transistor Q4 connected between MOS transistor Q3 and the ground node (reference voltage source) VSS and receiving, at its gate, the control signal IFG1. In the following description, a voltage source and the voltage applied thereto will be denoted by the same reference characters.

The first protection circuit 20 includes resistors R1 and R2 connected in series between external pin terminal 7 and internal node NA, and an n channel MOS transistor Q2 connected between a connection node of resistors R1 and R2 and the ground node VSS. MOS transistor Q2 has, as a gate insulating film, an element isolating insulating film formed, for example, by LOCOS (Local Oxidation of Silicon), and has a large threshold voltage. The MOS transistor Q2 has its gate and one conduction node both connected to ground node VSS, and hence it has the same function as a diode. Resistor R1 has a function of limiting current to prevent a large current from flowing through MOS transistor Q2, and resistor R2 prevents large current causing malfunction such as breakdown of PN junction from flowing through MOS transistors Q3 and Q4 of the first clamp circuit 10.

The first control circuit 30 includes an inverter IV1 inverting test mode designating signal TEST1; a p channel MOS transistor Q5 connected between power supply node VCC and node B and receiving at its gate the test mode designating signal TEST1; a p channel MOS transistor Q6 connected between power supply node VCC and a node C and receiving, at its gate, an output signal from inverter IV1; an n channel MOS transistor Q7 connected between node B and a node VBB to which a negative voltage is applied, and having its gate connected to node C; and an n channel MOS transistor Q8 connected between node C and node VBB to which a negative voltage is applied, and having its gate connected to node B.

MOS transistors Q7 and Q8 have their gates and drains cross coupled, to form a flipflop. Control signal IFG1 to be applied to MOS transistor Q4 included in the first clamp circuit 10 is output from node B. Test mode designating signal TEST1 changes between ground voltage VSS and power supply voltage VCC. The first control circuit 30 has a level converting function that test mode designating signal TEST1 is inverted and low level of the output signal thereof is converted to the level of the negative voltage VBB, as will be described in greater detail later.

The semiconductor device further includes a substrate potential generating circuit 15 for applying a bias voltage VBB, which is at a prescribed negative potential level, to a substrate region; a second control circuit 40 responsive to the test mode designating signal TEST1 for generating a second control signal Gcnt1; and a first internal potential connecting circuit 60 responsive to the second control signal Gcnt1 from the second control circuit 40 for electrically connecting the output portion of substrate potential generating circuit 15 to internal node NA. The first internal potential connecting circuit 60 is formed by an n channel MOS transistor Q13 connected between internal node NA and the output portion of substrate potential generating circuit 15 and receiving at its gate the second control signal Gcnt1.

Figure 2:
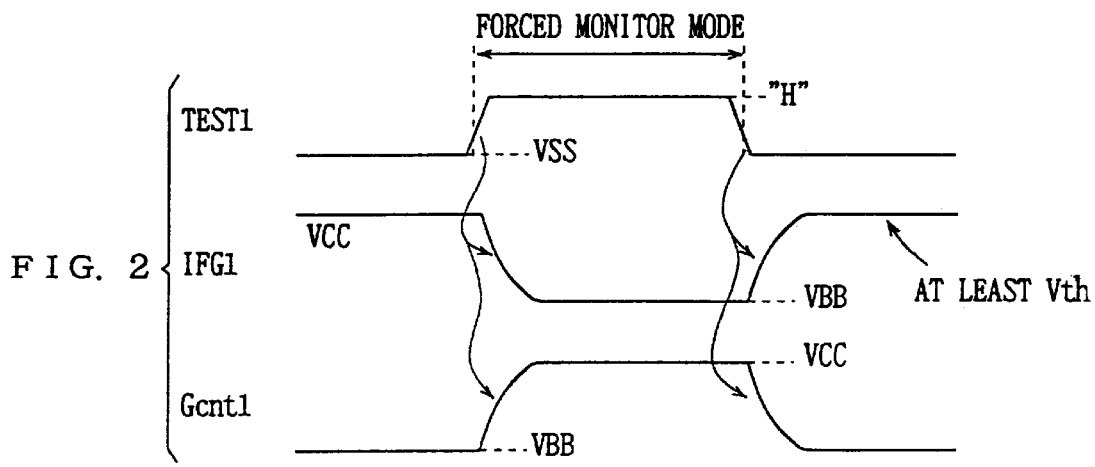
FIG. 2 is a diagram of signal waveforms showing the operation of the semiconductor device shown in FIG. 1.

The second control circuit 40 includes an inverter IV2 for inverting test mode designating signal TEST1; a p channel MOS transistor Q9 connected between a power supply node (second reference voltage source) and a node D and receiving at its gate test mode designating signal TEST1; a p channel MOS transistor Q10 connected between power supply node VCC and a node E and receiving at its gate an output signal from inverter IV2; an n channel MOS transistor Q11 connected between node D and node VBB to which a negative voltage is applied, and having its gate connected to node E; and an n channel MOS transistor Q12 connected between node E and node VBB to which the negative voltage is applied, and having its gate connected to node D. The second control signal Gcnt1 is output from node E. The nodes VBB to which the negative voltage is applied in control circuits 30 and 40 are coupled to the output portion of substrate potential generating circuit 15. The operation of the semiconductor device shown in FIG. 1 will be described with reference to FIG. 2, which is a diagram of signal waveforms.

In the first protection circuit 20, MOS transistor Q2 has the large threshold voltage. When we represent the threshold voltage of MOS transistor Q2 as V2, MOS transistor Q2 is rendered conductive when the potential at a connection portion between resistors R1 and R2 attains to −V2 or lower, and it supplies current from ground node VSS to the connection portion of resistors R1 and R2. MOS transistor Q2 has a field insulating film as a gate insulating film, and hence it has sufficiently large threshold voltage as compared with the threshold voltages of MOS transistors Q3 and Q4 included in the first clamp circuit 10. Therefore, when a large negative surge voltage is applied to external terminal 7, the large surge current is absorbed by MOS transistor Q2, and hence application of unnecessarily large negative potential to the first clamp circuit 10 is prevented, and hence breakdown of MOS transistors Q3 and Q4 included in the first clamp circuit 10 can be prevented.

A mode for monitoring internal potential and a test mode in which a prescribed voltage is externally applied to a specific internal node will be referred to as forced monitor mode, to be distinguished from the pin contact test (IF leak test).

When the forced monitor mode is inactive, forced monitor mode activating signal TEST1 is at a low level, which is at the level of the ground voltage VSS. In the first control circuit 30, the output signal from inverter IV1 attains to the high level, which is at the level of the power supply voltage VCC, MOS transistor Q5 turns on and MOS transistor Q6 turns off. Node B is charged by MOS transistor Q5, MOS transistor Q8 comes to have larger conductance, and hence the potential at node C is lowered to a voltage level of the node VBB to which the negative voltage is applied. As the potential at node C lowers, gate potential of MOS transistor Q7 lowers, and its conductance becomes smaller. When the potential at node B further increases and reaches the level of the power supply voltage VCC, MOS transistor Q8 turns on, the potential at node C attains to the level of the negative voltage VBB, and MOS transistor Q7 turns off. Therefore, in this state, the first control signal IFG1 output from node B attains to the high level at the level of the power supply voltage VCC.

In the first clamp circuit 10, MOS transistor Q4 is receiving the first control signal IFG1 which is at the level of the power supply voltage VCC, and it is turned on to transmit the ground voltage VSS to one conduction node of MOS transistor Q3. In n channel MOS transistor, a conduction node of which potential is lower serves as a source. In this state, MOS transistor Q3 operates in a diode mode, and when the potential at node NA reaches −V3 or lower (where V3 is the threshold voltage of MOS transistor and VSS=0 V), MOS transistor Q3 is rendered conductive, current flows from ground node VSS to internal node NA, and the potential at internal node NA increases. Therefore, the lowermost potential of internal node NA is clamped at the potential level of −V3.

In the second control circuit 40, as in the first control circuit, the forced monitor mode activating signal TEST1 is at the low level, which is at the level of the ground potential VSS. Therefore, the potential at node D is at the level of the power supply voltage VCC, and the potential at node E is at the level of the negative voltage VBB. Therefore, in the first internal potential connecting circuit 60, the potential level of the second control signal Gcnt1 applied to its gate is the same as the potential at its source (output portion of substrate potential generating circuit 15), and hence the transistor is kept off and the internal node NA is electrically disconnected from the output portion of substrate potential generating circuit 15.

Therefore, in this state, the first clamp circuit 10 and the first protection circuit 20 operate as an ordinary input protection circuit, and pin contact test can be performed by first clamp circuit 10. More specifically, a negative voltage VF (VF<−V3) at a prescribed voltage level is applied to external terminal 7 so as to render MOS transistor Q3 conductive, causing current flow from ground node VSS to external terminal 7. Consequently, whether or not external terminal 7 is electrically connected to internal pad (shown in FIG. 1) can be tested. Therefore, even at the final test after the semiconductor device is packed in a package, pin contact test can be surely performed.

Sometimes, pin contact test is performed with the externally applied power supply potential VCC set at a level lower than the normally used voltage level. When substrate potential generating circuit 15 generates a negative voltage (bias voltage) VBB using the external power supply voltage VCC, it may be possible that the negative voltage VBB has smaller absolute value. Though it depends on the structure of substrate potential generating circuit 15 (which will be described later), where the substrate bias potential is to be generated by utilizing charge pump operation of a capacitor, the lowest potential reached by the negative voltage VBB never exceeds −2·VCC. The power supply voltage VCC applied to the power supply node VCC is at the level of the external power supply voltage VCC where a single power source structure is employed, and it is at the voltage level of an internal power supply voltage where an internal power supply voltage is generated by down converting the external power supply voltage, utilizing an internal down converting circuit.

In this case, the difference between the power supply voltage VCC and the negative voltage VBB becomes smaller, a gate-source voltage of the MOS transistor is not sufficiently large, so that MOS transistors Q5 and Q8 are not completely turned on and MOS transistors Q6 and Q7 are not completely turned off, in the first control circuit 30, and hence the first control signal IFG1 from node B is possibly maintained at a voltage level between the power supply voltage VCC and the negative voltage VBB. In this case, by applying a negative voltage sufficiently lower (more negative) than the negative voltage VBB to external terminal 7, it becomes possible to render MOS transistors Q3 and Q4 both conductive. When the voltage level at internal node NA is a negative potential level, the sources of MOS transistors Q3 and Q4 are nodes closer to the internal node. Therefore, by the potential at node NA, MOS transistor Q3 turns on, and if the source potential of MOS transistor Q4 is at a potential level lower by more than the threshold voltage V4 of MOS transistor Q4 than the potential level of the first control signal IFG1, MOS transistor Q4 is turned on. Therefore, as the first control signal IFG1 is higher than the negative voltage VBB, pin contact test can be performed by turning on the MOS transistors Q3 and Q4 by applying a voltage more negative than the negative voltage VBB to the external terminal 7.

The high level of the first control signal IFG1 has only to be a voltage level at which MOS transistor Q4 is kept on. If a voltage not lower than the threshold voltage Vth (=V4) is applied, MOS transistor Q4 turns on (assuming that the ground voltage VSS is 0 V), similar effect can be obtained, and hence the high level of the first control signal IFG1 need not be the power supply voltage VCC.

The operation in the forced monitor mode will be described. In the forced monitor mode, forced monitor mode activating signal TEST1 attains to the high level (the level of the power supply voltage VCC: the level of the external power supply voltage or internally down converted power supply voltage).

In the first control circuit 30, the output signal from inverter IV1 attains to the low level of the ground voltage VSS. Consequently, MOS transistor Q5 turns off and MOS transistor Q6 turns on. Node C is charged by MOS transistor Q6, MOS transistor Q7 comes to have larger conductance, node B is discharged through MOS transistor Q7 and has the potential decreased. As the potential at node B lowers, MOS transistor Q8 comes to have smaller conductance, and the speed of discharging of node C slows down. Thus the potential at node C quickly rises to the high level (the level of the power supply voltage VCC), MOS transistor Q7 turns on, and discharges the node B to the negative voltage level of the node VBB to which the negative potential is applied. Therefore, in MOS transistor Q8, the gate potential and the source potential come to be the same with each other, and thus the transistor turns off. Therefore, in this state, the first control signal IFG1 output from node B is at the low level of negative voltage VBB.

Meanwhile, in the second control circuit 40, in response to the activation (high level) of forced monitor mode activating signal TEST1, the potential at node D attains to the level of the negative voltage VBB, and the potential at node E attains to the high level of the power supply voltage VCC. Therefore, the second control signal Gcnt1 attains to the high level, MOS transistor Q13 included in the first internal potential connecting circuit 60 turns on, and the output portion of substrate potential generating circuit 50 is electrically connected to internal node NA. Consequently, the negative voltage VBB generated from substrate potential generating circuit 50 is transmitted to internal node NA. In this case, even when MOS transistor Q3 turns on by the negative voltage VBB, as the first control signal IFG1 is at the level of the negative voltage VBB, in MOS transistor Q4, the gate potential is the same as or lower than the source potential (in an n channel MOS transistor, a conduction node of lower potential serves as a source), and hence MOS transistor Q4 is kept surely off. Therefore, current path is not formed between internal node NA and ground node VSS, and negative voltage VBB generated by the substrate potential generating circuit 15, which has been transmitted to internal node NA, is transmitted to external terminal 7 with its voltage level precisely maintained. Therefore, by externally monitoring the voltage level applied to external terminal 7, whether or not substrate potential generating circuit 15 is generating the negative voltage VBB of a desired voltage level accurately can be determined, and hence whether the substrate potential generating circuit 15 is acceptable or not can be determined.

Now an example is considered in which negative voltage VBB is externally applied and transmitted to the output portion of substrate potential generating circuit 15. The nodes to which the negative potential is applied in the first control circuit 30 and the second control circuit are connected to the output portion of substrate potential generating circuit 15. Therefore, when a negative voltage is externally applied to internal node NA, the negative voltage is transmitted through the first internal potential connecting circuit 60 to substrate potential generating circuit 15, and in response, the negative voltage VBB of the node VBB to which the negative voltage is applied is set to the level of the externally applied voltage. Therefore, the potential level of the first control signal IFG1 which is at the low level attains to the level of the negative voltage externally applied, the voltage level applied to the internal node NA becomes equal to the potential level of the first control signal IFG1, so that MOS transistor Q4 is surely kept off and current path from internal node NA to the ground node VSS can be shut off. Consequently, it is possible to apply a negative voltage of a desired voltage level externally and to transmit the negative voltage through internal node NA to the output portion of substrate potential generating circuit 15, and hence it is possible to appropriately adjust the voltage level of negative voltage VBB externally. A characteristic test which is performed by externally setting the voltage level of the negative voltage VBB will be described in greater detail later.

MOS transistor Q2 included in the first protection circuit 20 has its threshold voltage set to a value sufficiently larger than the voltage level of the externally applied negative voltage. This is to prevent MOS transistor Q2 from being turned on when the negative voltage is applied (V2>|VM|: V2 represents threshold voltage of MOS transistor Q2 and VM represents negative voltage applied to external terminal 7).

In the first clamp circuit 10, MOS transistors of the same conductivity type, more specifically, n channel MOS transistors are used. In this case, MOS transistors Q3 and Q4 can be formed in the same well or the same substrate region (though element isolating film is necessary), a region for pn isolation is not necessary, and hence area occupied by the first clamp circuit can be reduced. Further, since MOS transistors included in the first protection circuit 20 are formed by n channel MOS transistors, the first clamp circuit 10 and the first protection circuit 20 can be formed together in the same well, a region for well separation is not necessary, and hence area of occupation can be reduced.

By providing the first control circuit 30 for activating/inactivating the clamping function of the first clamp circuit 10 and the second control circuit for generating a control signal for connecting the output portion of substrate potential generating circuit 15 to internal node NA separately from each other, it becomes possible to appropriately arrange the first and second control circuits 30 and 40 in accordance with the arrangement of the first clamp circuit 10 and the first internal potential connecting circuit 60, enabling optimal layout. Further, the first and second control circuits 30 and 40 each drive the gate capacitance of only one MOS transistor, and hence large drivability is not required. Accordingly, area of occupation can be sufficiently made smaller, and hence increase in occupation area in the circuit can be suppressed.

As described above, in accordance with the first embodiment of the present invention, the clamping function of the first clamp circuit clamping the negative voltage level of internal node NA is inactivated when the forced monitor mode is activated. Therefore, in the forced monitor mode, a voltage of a desired voltage level can be externally applied to an internal node, and the level of the internal voltage transmitted to the internal node can be accurately read externally. Further, when the forced monitor mode is inactive, the clamping function of the first clamp circuit is enabled, and hence pin contact test can be performed accurately by applying a negative voltage externally.

Second Embodiment

Figure 3:
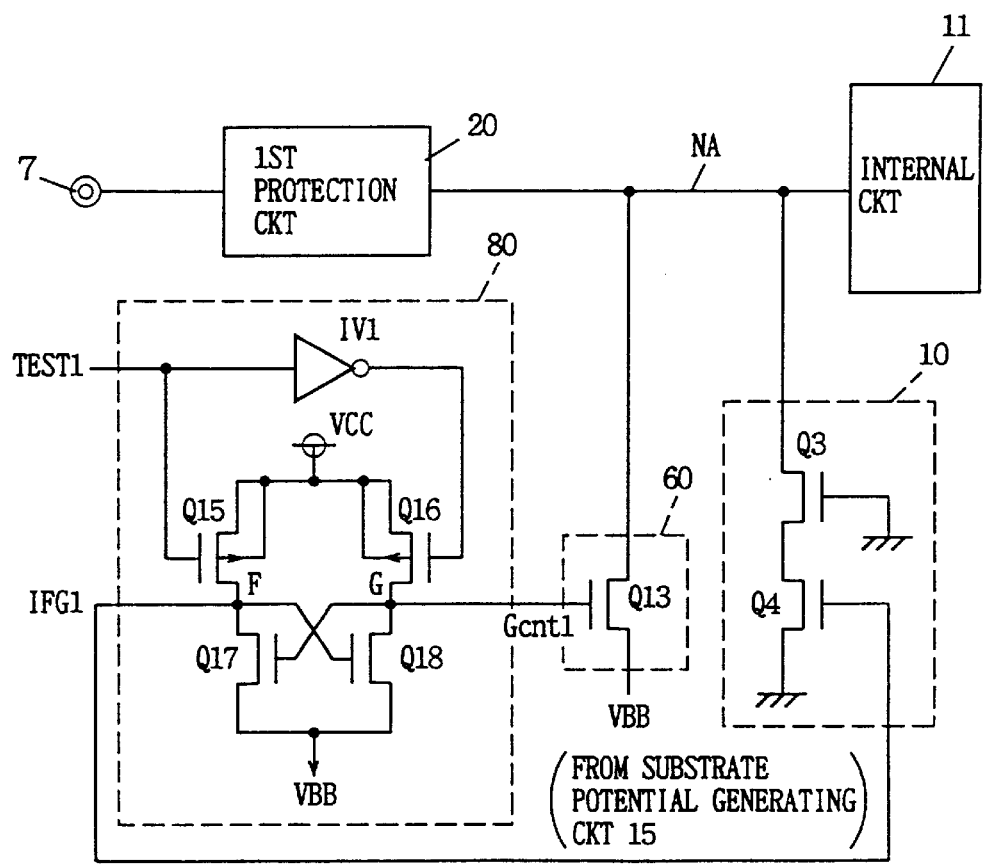
FIG. 3 schematically shows a structure of a main portion of a semiconductor device in accordance with a second embodiment of the present invention.

FIG. 3 shows a structure of a main portion of the semiconductor device in accordance with the second embodiment of the present invention. In the structure shown in FIG. 3, the control signal Gcnt1 for the first internal potential connecting circuit 60 for selectively connecting the output portion of substrate potential generating circuit 15 to the internal node NA and the control signal IFG1 for the first clamp circuit 10 are output from the same control circuit 80. The first protection circuit 20, the first clamp circuit 10 and the first internal potential connecting circuit 60 have the same structure as those shown in FIG. 1, and corresponding portions are denoted by the same reference characters.

Control circuit 80 includes an inverter IV receiving forced monitor mode activating signal TEST1; a p channel MOS transistor Q15 connected between power supply node VCC and a node F and receiving at its gate the forced monitor mode activating signal TEST1; a p channel MOS transistor Q16 connected between power supply node VCC and a node G and receiving at its gate the output signal from inverter IF; an n channel MOS transistor Q17 connected between node F and node VBB to which the negative voltage is applied, and having its gate connected to node G; and an n channel MOS transistor Q18 connected between node G and node VBB to which the negative voltage is applied and having its gate connected to node F. The first control signal IFG1 is output from node F, and the second control signal Gcnt1 is output from node G.

The circuit constituted by MOS transistors Q15 to Q18 has the same structure as the circuit portion of a level converter included in control circuits 30 and 40 shown in FIG. 1. Therefore, when the node F is at the level of the power supply voltage VCC, node G is at the level of the negative voltage VBB, and if node G is at the level of the power supply voltage VCC, the node F is at the level of the negative voltage VBB. As is apparent from the diagram of waveforms shown in FIG. 2, control signals IFG1 and Gcnt1 are complementary to each other. Therefore, by generating mutually complementary control signals IFG1 and Gcnt1 by using one control circuit 80 in accordance with the forced monitor mode activating signal TEST1, the operation of internal potential connecting circuit 60 and of clamp circuit 10 can be similarly controlled as in the first embodiment.

In the structure of the second embodiment shown in FIG. 3, similar effects as in the first embodiment shown in FIG. 1 can be obtained, and in addition, the following effects can be obtained. The first and second control signals IFG1 and Gcnt1 can be generated by one control circuit 80, and hence area occupied by the control circuit can be reduced, and the area occupied by the circuits for activating/inactivating the clamping function can be reduced.

Further, since MOS transistor Q13 included in the first internal potential connecting circuit 60 is arranged near the control circuit 80 and the first clamp circuit 10, the distance between MOS transistor Q13 and internal node NA can be reduced, voltage drop (increase) caused by line resistance between MOS transistor Q13 and internal node NA can be reduced, hence the negative voltage VBB at a received voltage level can be transmitted to internal node NA, and the voltage at a desired voltage level can be accurately supplied to the output portion of substrate potential generating circuit 15 (not shown) in FIG. 3 from internal node NA. Further, since the distance between internal node NA and the first internal potential connecting circuit 60 is small, there is small line capacitance, and hence MOS transistor Q13 even with small current supplying power can sufficiently charge (discharge) the internal node NA to the level of the substrate bias voltage (negative voltage) VBB generated by the substrate potential generating circuit 15, and hence the size of the transistor (channel width or the ratio between channel width and the channel length) can be reduced. Accordingly, gate capacitance of MOS transistor Q13 becomes smaller, and what is required for the control circuit 80 is only to transmit mutually complementary control signals to the gates of MOS transistors Q4 and Q13 through a short line. The gate capacitances to be driven are sufficiently small, and hence large driving power is not required for the control circuit 80. In other words, the size of MOS transistors Q15 to Q18 (channel width or ratio between channel width and channel length) constituting the control circuit 80 can be reduced, and hence area occupied by control circuit 80 can be made smaller.

As described above, according to the second embodiment of the present invention, the operation of the first internal potential connecting circuit and of the first clamp circuit are controlled by generating complementary control signals by one control circuit, the area occupied by the control circuit can be reduced.

Third Embodiment

Figure 4:
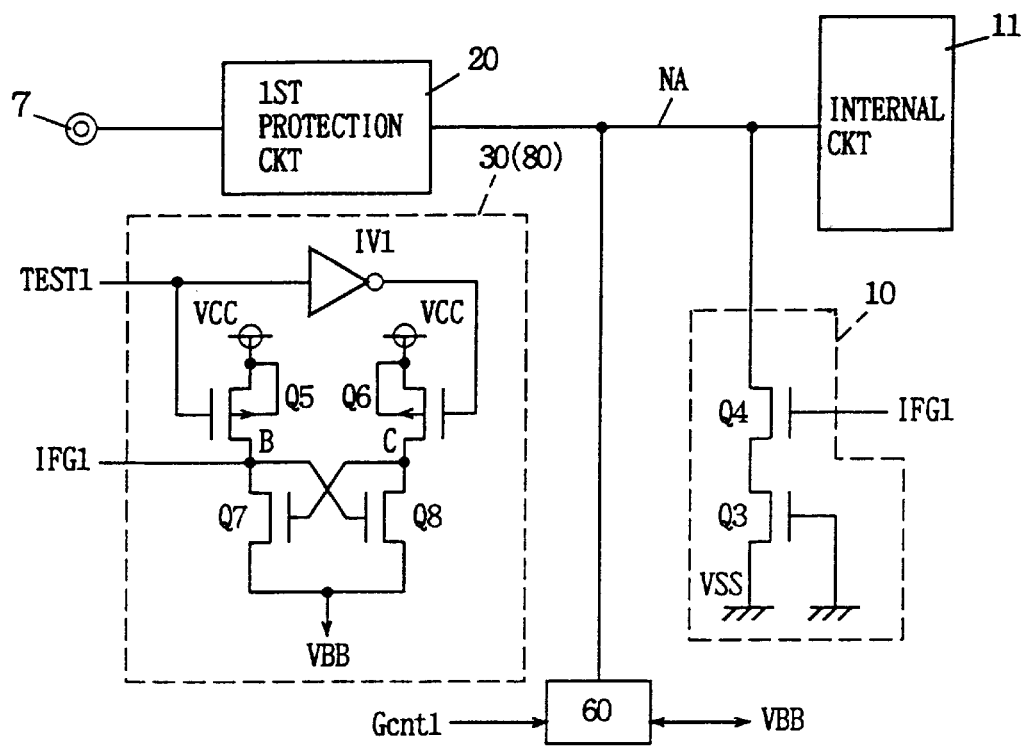
FIG. 4 schematically shows a structure of a main portion of a semiconductor device in accordance with a third embodiment of the present invention.

FIG. 4 shows a structure of a main portion of a semiconductor device in accordance with the third embodiment of the present invention. In the structure of the semiconductor device shown in FIG. 4, the structure of the first clamp circuit 10 differs from that of the first and second embodiments above. The first control signal IFG1 is output from control circuit 30 or 80 shown in FIG. 4. First internal potential connecting circuit 60 for electrically connecting the output portion (denoted by VBB) of the substrate potential generating circuit in response to the second control signal Gcnt1 is provided at internal node NA. The second control signal Gcnt1 may be generated from a second control circuit provided separatedly from control circuit 30 shown in FIG. 4, or it may be generated from the control circuit 80.

The first protection circuit 20 and the internal circuit 11 have the same structures as in the first and second embodiments above.

In the first clamp circuit 10, MOS transistor Q4 receiving at its gate the second control signal IFG1 has one conduction node connected to internal node NA. MOS transistor Q3 is connected between MOS transistor Q4 and ground node VSS. MOS transistor Q3 has its gate connected to ground node VSS.

In the forced monitor mode (in which forced monitor mode activating signal TEST1 is active), when the negative voltage VBB is applied to internal node NA, MOS transistor Q4 is immediately turned off. Therefore, it is possible to maintain the potential level at internal node NA stable at high speed. If MOS transistor Q3 is connected to internal node NA and internal node NA attains to the negative voltage VBB, the negative voltage VBB is transmitted through MOS transistor Q3 to MOS transistor Q4. When the potential at the drain (node connected to MOS transistor Q3) of MOS transistor Q4 attains to the level of the negative voltage VBB, MOS transistor Q4 is turned off. Therefore, in such a structure, there is a difference between the time point at which the voltage at the drain (conduction node connected to MOS transistor Q3) of MOS transistor Q4 reaches the negative voltage VBB by the leakage current of MOS transistor Q3 and the time point at which the prescribed negative voltage VBB is transmitted to internal node NA, which means that a relatively long period of time is necessary until the voltage level of the internal node NA is held at a desired voltage level. Therefore, the voltage at internal node NA cannot be stabilized quickly at the prescribed voltage level quickly. Therefore, if it is necessary to stabilize the voltage at internal node NA at high speed, stabilization at high speed can be accomplished by connecting MOS transistor Q4 receiving at its gate the first control signal IFG1 to internal node NA as shown in FIG. 4.

Except this point, the structure is the same as that described in the first and second embodiments, and similar effects can be obtained.

As described above, according to the third embodiment, the voltage level at the internal node NA can be stabilized at a desired voltage level at high speed.

Fourth Embodiment

Figure 5:
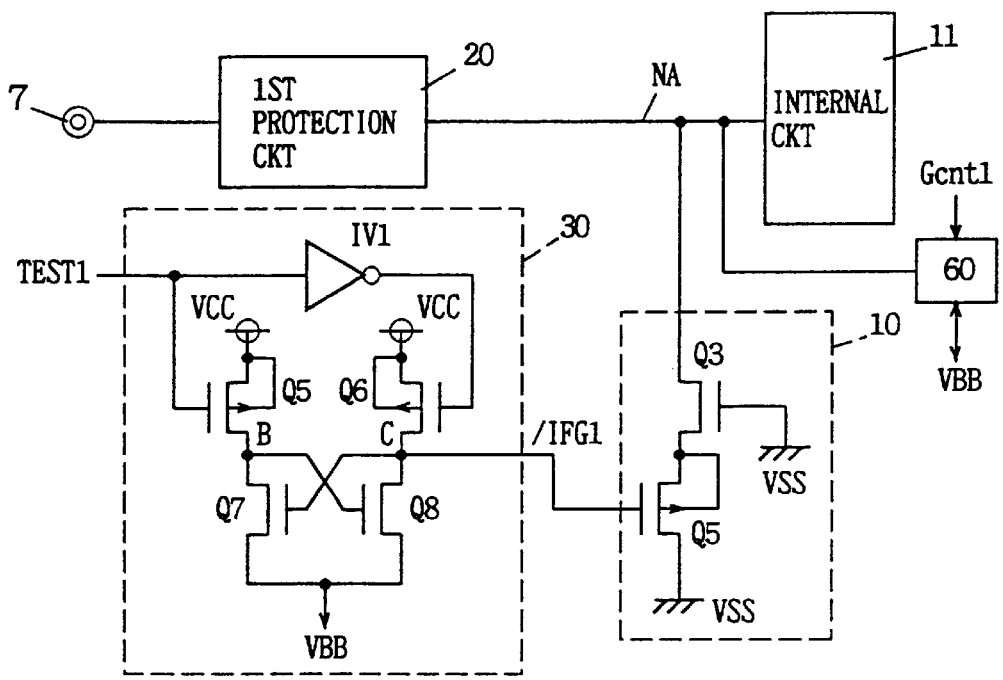
FIG. 5 schematically shows a structure of a main portion of a semiconductor device in accordance with a fourth embodiment of the present invention.

FIG. 5 shows a structure of a main portion of a semiconductor device in accordance with the fourth embodiment of the present invention.

In the semiconductor device shown in FIG. 5, the first clamp circuit 10 includes an n channel MOS transistor Q3 having one conduction terminal connected to internal node NA and its gate connected to ground node VSS; and a p channel MOS transistor Q5 connected between MOS transistor Q3 and ground node VSS. To the gate of p channel MOS transistor Q5, complementary control signal /IFG1 applied from node C of control signal generating circuit 30 is applied. Control signal /IFG1 is complementary to the control signal IFG1 shown in the first to third embodiments above.

In the forced monitor mode, control signal /IFG1 attains to the high level, which is at the level of the power supply voltage VCC, and in other operation modes, the signal /IFG1 attains to the level of the negative voltage VBB. Other structures are the same as those of the first or second embodiments above, and corresponding portions are denoted by the same reference characters.

Figure 6:
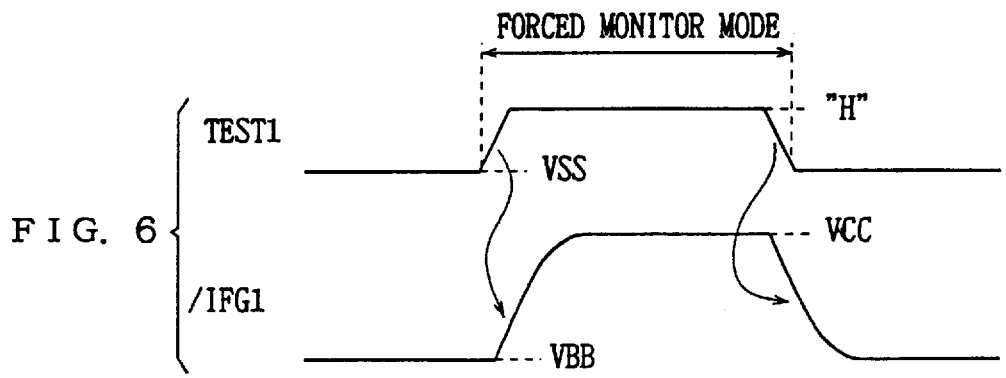
FIG. 6 is a diagram of signal waveforms showing the operation of the semiconductor device shown in FIG. 5.

As shown in FIG. 6, when the forced monitor mode is inactive, the signal /IFG1 attains to the level of the negative voltage VBB. When the negative voltage VBB is applied to node NA, MOS transistor Q5 is turned off only when the potential at one conduction node (conduction node connected to transistor Q3) of MOS transistor Q5 becomes lower than the negative voltage VBB. Therefore, as long as a negative voltage shallower than (having smaller absolute value than) the negative voltage VBB is applied to node NA, MOS transistor Q5 is kept off. Therefore, by applying a negative voltage within this range to internal node NA through external terminal 7, pin contact test can be performed, and voltage level at internal node NA can be clamped in normal operation mode.

When the forced monitor mode is activated, signal /IFG1 attains to the high level of the level of power supply voltage VCC as shown in FIG. 6, cutting current path between MOS transistor Q3 and ground node VSS. In this state, MOS transistor Q5 turns on when the potential of one conduction node (node connected to transistor Q3) becomes higher than the level of the power supply voltage VCC applied to its gate. MOS transistor Q3 receives at its gate the ground voltage VSS, and prevents transmission of a higher voltage than voltage VSS level to MOS transistor Q5. Therefore, when the forced monitor mode is activated, MOS transistor Q5 is surely maintained off, and current path between internal node NA and ground node VSS is surely cut off. When the forced monitor mode is inactive, the signal /IFG1 is at the level of the negative voltage VBB, MOS transistor Q5 is on, and MOS transistor Q3 operates in the diode mode, surely clamping the voltage level at internal node NA at a prescribed potential level. Therefore, in the fourth embodiment also, the pin contact test and forced monitor mode for the negative potential can both be implemented.

The control signal Gcnt1 for the first internal potential connecting circuit 60 changes in same phase with the signal /IFG1, and hence it may be generated from node C of the first control signal generating circuit 30, or it may be generated from a separate control signal generating circuit.

As described above, in accordance with the fourth embodiment, even when the first clamp circuit is formed by n and p channel MOS transistors, the similar effects as in the first or second embodiment can be obtained.

The substrate region of the p channel MOS transistor Q5 is connected to internal node NA through MOS transistor Q3. When MOS transistor Q3 is conductive, there is a voltage drop (voltage increase) in MOS transistor Q3, and hence pn junction between impurity region and the substrate region of MOS transistor Q5 will never be biased in forward direction. However, the substrate region of MOS transistor Q5 may be connected to receive power supply voltage VCC.

Fifth Embodiment

Figure 7:
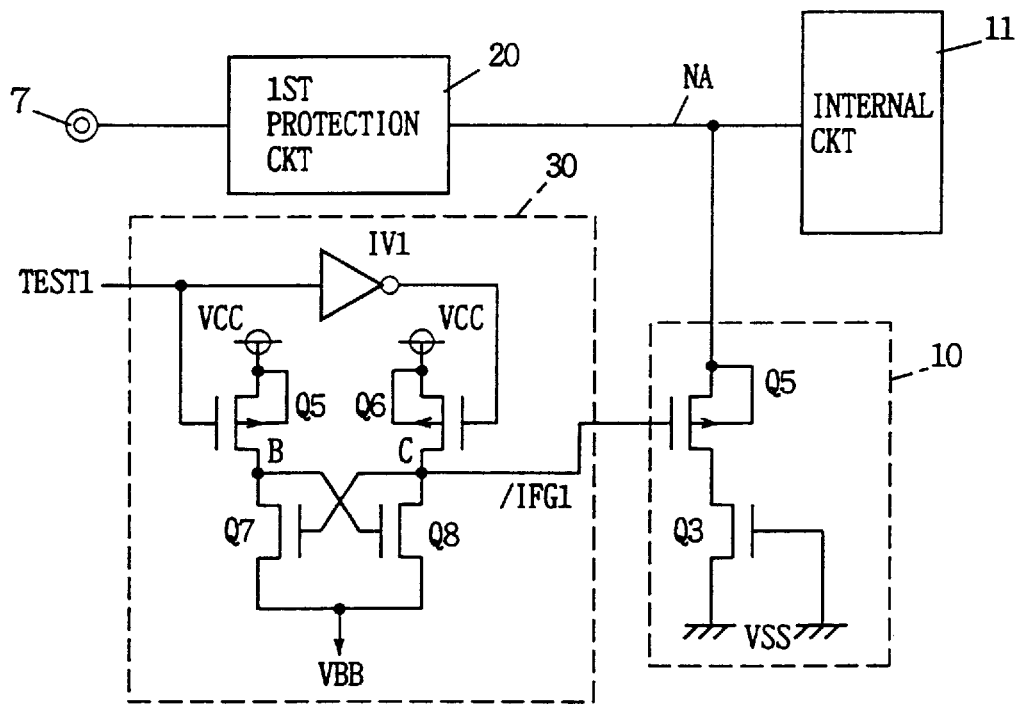
FIG. 7 schematically shows a structure of a main portion of a semiconductor device in accordance with a fifth embodiment of the present invention.

FIG. 7 shows a structure of a main portion of a semiconductor device in accordance with a fifth embodiment of the present invention. In FIG. 7, the substrate potential generating circuit and the internal potential connecting circuit are not shown only for simplification of the figure. The semiconductor device shown in FIG. 7 has the same structure as the semiconductor device shown in FIG. 5 except that in the first clamp circuit 10, positions of MOS transistors Q5 and Q3 are exchanged. In FIG. 7, portions corresponding to the structure of FIG. 5 are denoted by the same reference characters and description thereof is not repeated.

When the forced monitor mode is inactive, the control signal /IFG1 is at the level of the negative voltage VBB. In this state, in the first clamp circuit 10, generally the potential at node NA is higher than the gate potential of MOS transistor Q5, a channel is formed in MOS transistor Q5, and the potential at internal node NA is transmitted to MOS transistor Q3. When the voltage level at internal node NA reaches the level of the negative voltage VBB, the gate and source potentials of MOS transistor Q5 become equal to each other, and MOS transistor Q5 turns off. When pin contact test is to be performed, by applying a voltage between negative voltage VBB and −V3, a current path is formed between internal node NA and ground node VSS, and hence desired pin contact test can be performed. Here, V3 represents the threshold voltage of MOS transistor Q3. In the normal operation mode also, the potential at internal node NA is transmitted to MOS transistor Q3 as long as it is more negative than the potential level of negative voltage VBB, and hence desired clamping function can be realized.

When the forced monitor mode is active, control signal /IGF1 attains to the high level, which corresponds to the level of power supply voltage VCC. As long as the internal node NA is lower than the power supply voltage VCC level, MOS transistor Q5 is kept off, as its gate potential is higher than the source potential. Therefore, when a negative voltage is externally applied to internal node NA or the output portion of a substrate potential generating circuit, not shown, is connected to internal node NA through the internal potential connecting circuit, MOS transistor Q5 is surely off, and hence there is not a leak current to MOS transistor Q3. Therefore, the potential level at internal node NA can be set to a desired voltage level quickly, and hence the start point of test can be made earlier.

As described above, according to the fifth embodiment of the present invention, a p channel MOS transistor is connected to internal node NA and a control signal is applied to its gate, so that when the potential at the internal node attains to the negative potential level of a desired voltage, the p channel MOS transistor Q5 is surely turned off, and hence the voltage level at internal node NA can be stabilized at the prescribed voltage level quickly. As in the first to fourth embodiments, both pin contact test and forced monitor mode can be implemented.

Sixth Embodiment

Figure 8:
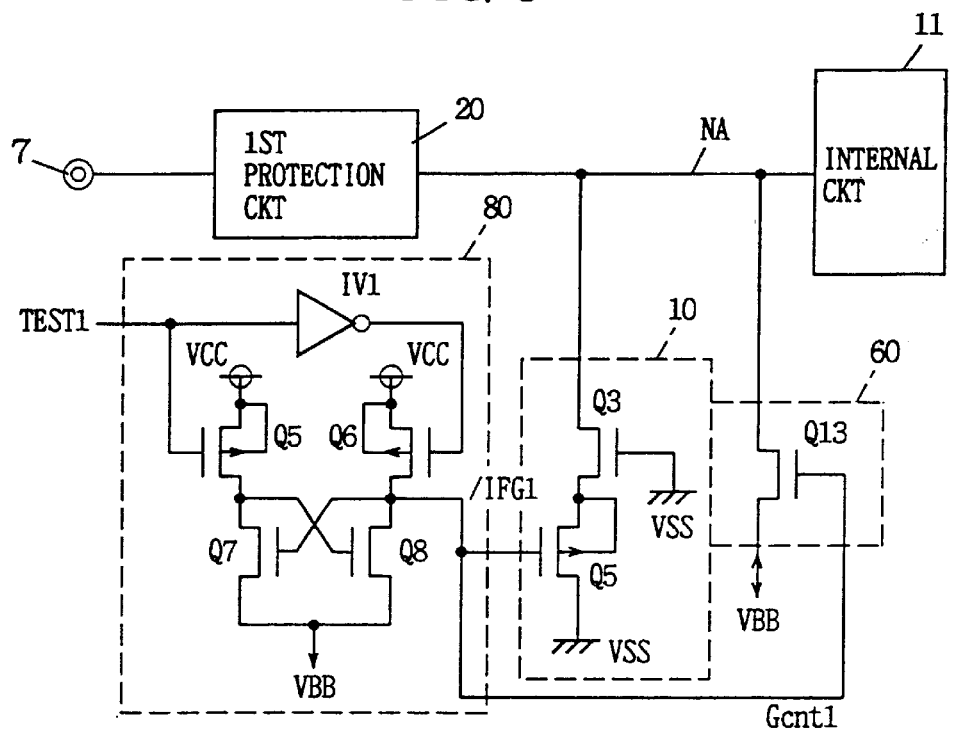
FIG. 8 schematically shows a structure of a main portion of a semiconductor device in accordance with a sixth embodiment of the present invention.

FIG. 8 shows a structure of a main portion of a semiconductor device in accordance with the sixth embodiment of the present invention. The structure shown in FIG. 8 is the same as that of the embodiment shown in FIG. 5 except that the control signal generating circuit 80 generates the first control signal /IFG1 as well as the second control signal (connection control signal) Gcnt1. The first internal potential connecting circuit 60 includes an n channel MOS transistor Q13. The p channel MOS transistor Q5 included in first clamp circuit 10 and n channel MOS transistor Q13 in the first internal potential connecting circuit 60 are turned on/off complementarily. Therefore, by applying signals /IFG1 and Gcnt1 changing in the same phase to the gates of MOS transistors Q5 and Q13, these MOS transistors Q5 and Q13 can be turned on/off complementarily.

In the structure of the sixth embodiment shown in FIG. 8, two control signals are generated by one control signal generating circuit 80, and area occupied by the circuit can be reduced. Further, since operations of first clamp circuit 10 and first internal potential connecting circuit 60 are both controlled by one control signal generating circuit, activation/inactivation of these circuits can be surely performed complementarily, and therefore it becomes unnecessary to adjust timings for activating/inactivating these circuits.

In the sixth embodiment, it is possible to reduce the length of internal interconnection between internal node NA and the first internal potential connecting circuit 60, and accordingly, as in the second embodiment above, the size (channel width) of MOS transistor Q13 can be made smaller. Control signal generating circuit 80 have only to drive a small gate capacitance, and hence size of components (channel width, ratio of channel width and channel length) can be reduced, and hence scale of the control signal generating circuit 80 can be reduced. Therefore, area of occupation can be made smaller.

In the structure shown in FIG. 8, the positions of MOS transistors Q3 and Q5 may be exchanged.

Seventh Embodiment

Figure 9:
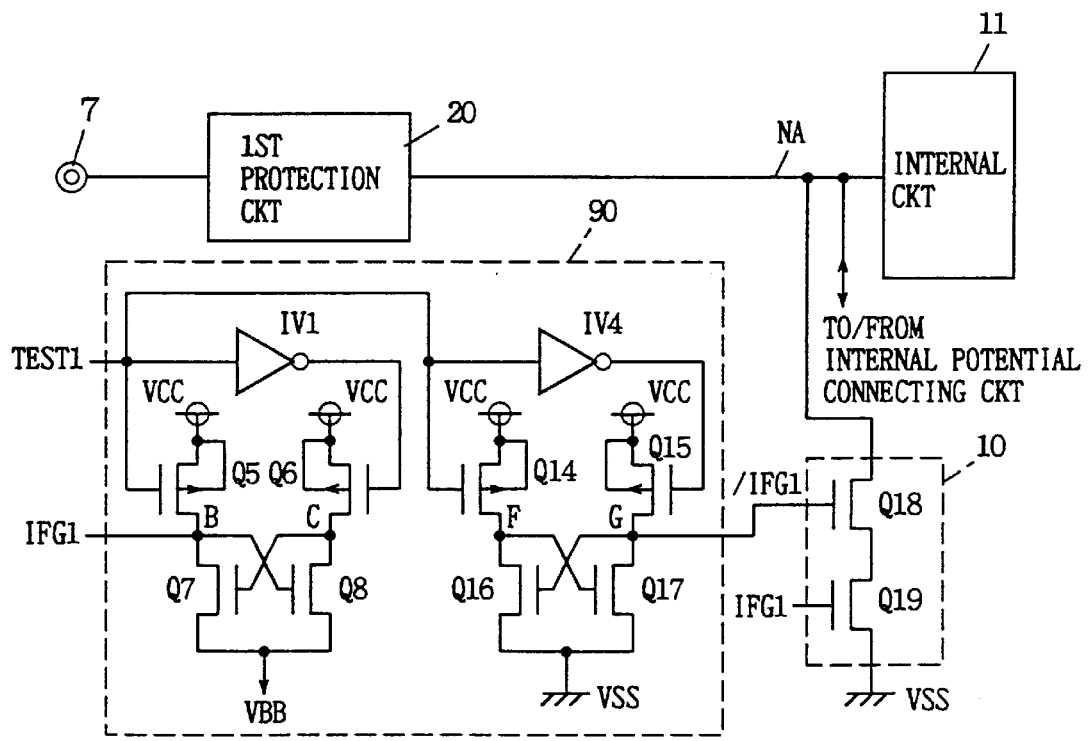
FIG. 9 schematically shows a structure of a main portion of a semiconductor device in accordance with a seventh embodiment of the present invention.

FIG. 9 shows a structure of a main portion of a semiconductor device in accordance with the seventh embodiment of the present invention. In FIG. 9, the internal potential connecting circuit and the substrate potential generating circuit are not explicitly shown, for the simplicity of the figure. The first protection circuit 20 and the internal circuit 11 have the same structures as those described in the embodiments above. The first clamp circuit 10 for clamping the potential (negative potential) at internal node NA at a prescribed potential level includes an n channel MOS transistor Q18 coupled to internal node NA and receiving at its gate the control signal /IFG1, and an n channel MOS transistor Q19 connected between MOS transistor Q18 and the ground node VSS and receiving at its gate the control signal IFG1.

The control signals /IFG1 and IFG1 for controlling activation/inactivation of clamping operation of the first clamp circuit 10 are output from a control circuit 90. Control circuit 90 includes an inverter IV1 receiving the forced monitor mode activating signal TEST1; a p channel MOS transistor Q4 connected between power supply node VCC and internal node B and receiving at its gate the signal TEST1; a p channel MOS transistor Q6 connected between power supply node VCC and node C and receiving at its gate an output signal from inverter IV1; an n channel MOS transistor Q7 connected between node B and node VBB to which the negative voltage is applied, and having its gate connected to node C; and an n channel MOS transistor Q8 connected between node C and node VBB to which the negative voltage is applied and having its gate connected to node B. Control signal IFG1 is output from node B. Transistors Q5 to Q8 have level converting function, and control signal IFG1 changes between power supply voltage VCC and negative voltage VBB.

Figure 10:
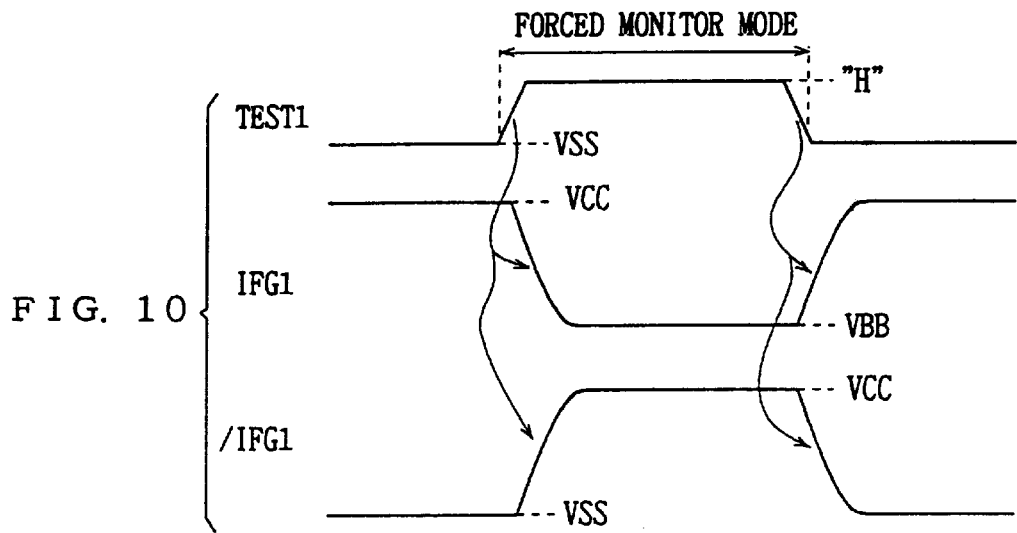
FIG. 10 is a diagram of signal waveforms representing the operation of the semiconductor device shown in FIG. 9.

Control circuit 90 further includes an inverter IV4 receiving forced monitor mode activating signal TEST1; a p channel MOS transistor Q14 connected between power supply node VCC and node F and receiving at its gate the signal TEST1; an n channel MOS transistor Q16 connected between node F and ground node VSS and having its gate connected to node G; and an n channel MOS transistor Q17 connected between node G and ground VSS and having its gate connected to node F. Control signal /IFG1 is output from node G. Control signal /IFG1, therefore, changes between power supply voltage VCC and ground voltage VSS. The operation of the circuit shown in FIG. 9 will be described with reference to FIG. 10, which is a diagram of signal waveforms.

When the forced monitor mode is inactive, forced monitor mode activating signal TEST1 is at the low level, and output signals from inverters IV1 and IV4 are at the high level which corresponds to the level of the power supply voltage VCC. In this state, MOS transistor Q5 is on and MOS transistor Q6 is off. When the potential at node B increases and the gate-source voltage of MOS transistor Q8 exceeds the threshold voltage thereof, MOS transistor Q8 is rendered conductive, and potential at node C is discharged to node VBB to which negative voltage is applied, and hence the potential at node C lowers. As the potential at node C lowers, conductance of MOS transistor Q7 becomes smaller, thus making smaller the current flowing from node B to node VBB. By repetition of this operation, node C attains to the level of the negative voltage VBB, and node B attains to the level of the power supply voltage VCC. In this state, MOS transistor Q7 turns off and MOS transistor Q8 turns on. The control signal IFG1 output from node B is set to a high level corresponding to the level of the power supply voltage VCC. In the level converting portion constituted by MOS transistors Q14 to Q17, MOS transistors Q14 and Q17 turned on while MOS transistors Q15 and Q16 turned off, and node G attains to the level of the ground voltage VSS. Thus, the control signal /IFG1 applied to the gate of MOS transistor Q18 attains to the level of the ground voltage VSS.

In the first clamp circuit 10, MOS transistor Q19 receives at its gate the control signal IFG1 at the level of the power supply voltage VCC and turns on, and transmits the ground voltage VSS to one conduction node (node to which MOS transistors Q18 and Q19 are connected) of MOS transistor Q18. Therefore, both the gate and the source of MOS transistor Q18 attain to the level of the ground voltage VSS, so that MOS transistor Q18 operates in the diode mode and clamps the negative potential level at node NA at the voltage level of −V18. Here, V18 represents the threshold voltage of MOS transistor Q18. Therefore, by applying a negative voltage VF to external terminal 7 in this state, pin contact test checking whether the external terminal 7 is surely electrically contacted with a pad (not shown) can be performed. When the forced monitor mode is inactive, the internal potential connecting circuit (not shown) is kept non-conductive, and the output portion of substrate potential generating circuit and internal node NA are electrically disconnected.

When the forced monitor mode is active, forced monitor mode activating signal TEST1 attains to a high level, and output signals from inverters IV1 and IV4 attain to the low level, which corresponds to the level of the ground voltage VSS. In this state, MOS transistors Q6, Q7, Q15 and Q16, turn on, and MOS transistors Q5, Q8, Q14 and Q17 turn off.

The control signal IFG1 output from node B attains to the level of the negative voltage VBB, and control signal /IFG1 output from node G attains to the level of the power supply voltage VCC. In the first clamp circuit 10, MOS transistor Q18 turns on by the control signal /IFG1 which is at the level of the power supply voltage VCC, and electrically connects internal node NA to MOS transistor Q19. MOS transistor Q19 is receiving at gate the control signal IFG1 at the level of the negative voltage VBB. Therefore, even when the potential at internal node NA attains to the level of the negative potential VBB, MOS transistor Q19 is still kept off. This is because the source of MOS transistor Q19 is the conduction node connected to internal node NA, and hence the source potential is the same as the gate potential.

In this state, an internal potential connecting circuit, not shown, is rendered conductive in response to the output Gcnt1 of the common or separate control circuit, connecting electrically the output portion of substrate potential generating circuit to internal node NA. Therefore, even when the negative voltage VBB from substrate potential generating circuit is transmitted to internal node NA, MOS transistor Q19 is kept off, and hence the level of the negative voltage VBB transmitted to the internal node NA can be surely determined through external terminal 7. By contrast, when a negative voltage is applied to external terminal 7, MOS transistor Q19 is kept off unless the potential at internal node NA, that is, the externally applied voltage becomes lower by the absolute value of the threshold voltage of MOS transistor Q19 than the negative voltage VBB, and hence the potential at internal node NA can be correctly transmitted to the output portion of the substrate potential generating circuit through the internal potential connecting circuit, not shown. When the potential at the output portion of the substrate potential generating circuit changes, the voltage level applied to the node VBB to which the negative voltage is applied of control circuit 90 changes accordingly. Therefore, in response, the potential level of control signal IFG1 changes, and hence control signal IFG1 is kept equal to the voltage level applied to the internal node NA. Therefore, MOS transistor Q19 can be surely turned off, and voltage of a desired level can be applied to the output portion of the substrate potential generating circuit through internal node NA and internal potential connecting circuit, from external terminal 7.

In the first clamp circuit 10, when the forced monitor mode is inactive, control signal IFG1 is at the level of the power supply voltage VCC, MOS transistor Q19 turns on, and one conduction node of MOS transistor Q18 is electrically connected to the ground node VSS. When the forced monitor mode is activated, control signal /IFG1 attains to the high level which corresponds to the level of the power supply voltage VCC, MOS transistor Q18 turns on, and one conduction node of MOS transistor Q19 is connected to internal node NA. Therefore, connection node between MOS transistors Q18 and Q19 is always electrically connected to the internal node NA or the ground node VSS, and it is never set to a floating state. Therefore, when the forced monitor mode is activated, the connection node of MOS transistors Q18 and Q19 changes at high speed in accordance with the change in potential at the internal node NA, and in response, internal node NA can change its potential level at high speed, following the voltage level applied from the external terminal 7 or from the substrate potential generating circuit.

[Modification]

Figure 11:
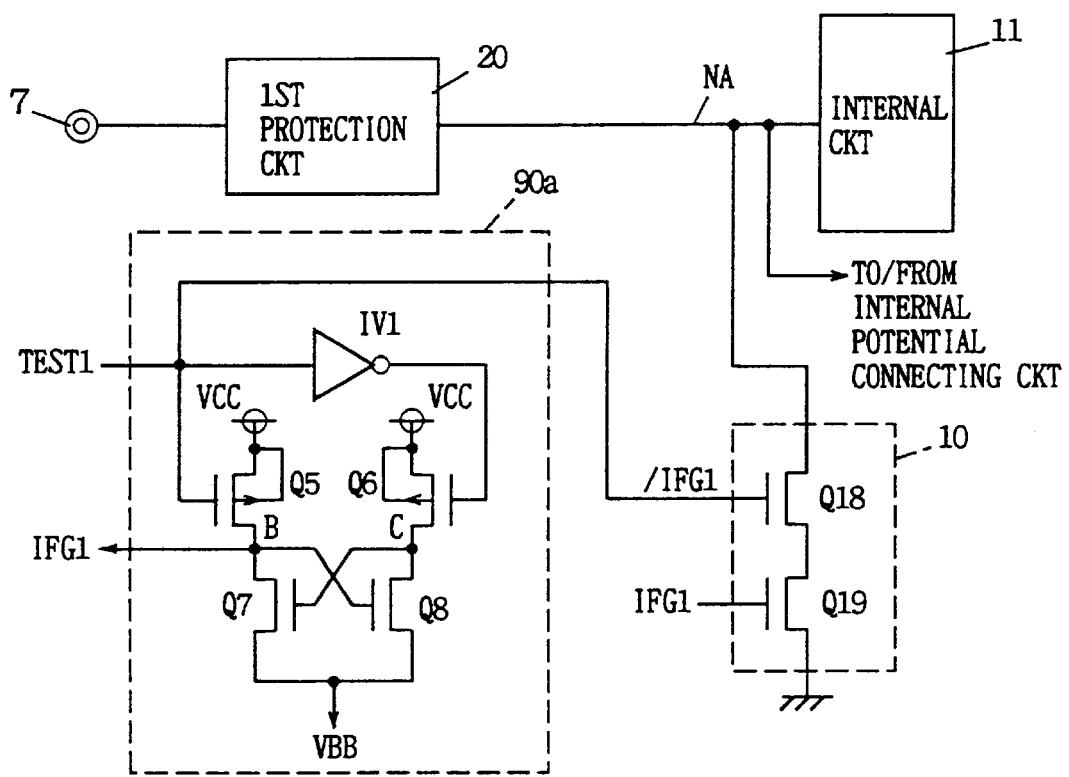
FIG. 11 shows a structure of a modification of the seventh embodiment of the present invention.

FIG. 11 shows a structure of a modification of the seventh embodiment in accordance with the present invention. In the structure shown in FIG. 11, MOS transistor Q18 included in the first clamp circuit 10 receives at its gate the forced monitor mode activating signal TEST1 as control signal /IFG1. Except this point, the structure of FIG. 11 is the same as that shown in FIG. 9. In the structure shown in FIG. 9, the control signals IFG1 and /IFG1 can be changed at the same timing, in accordance with the change in the forced monitor mode activating signal TEST1 (since the control signal generating portion has the same structure). When the forced monitor mode activating signal TEST1 is generated internally (based on timing conditions of a plurality of external signals, for example), the signal TEST1 changes between the levels of power supply voltage VCC and the ground voltage VSS. Therefore, control signal /IFG1 of a necessary voltage level can be generated. Therefore, transistors Q14 to Q17 and inverter IV4 shown in FIG. 9 can be eliminated, and hence area occupied by the control portion can be reduced.

As described above, in accordance with the seventh embodiment of the present invention, in the first clamp circuit, MOS transistors of which on/off states controlled by a control signal are connected in series, there is no node which is electrically floating in the first clamp circuit, and hence it becomes unnecessary to change/discharge the floating node. Therefore, the internal node can be set to a necessary voltage level at high speed.

Eighth Embodiment

Figure 12:
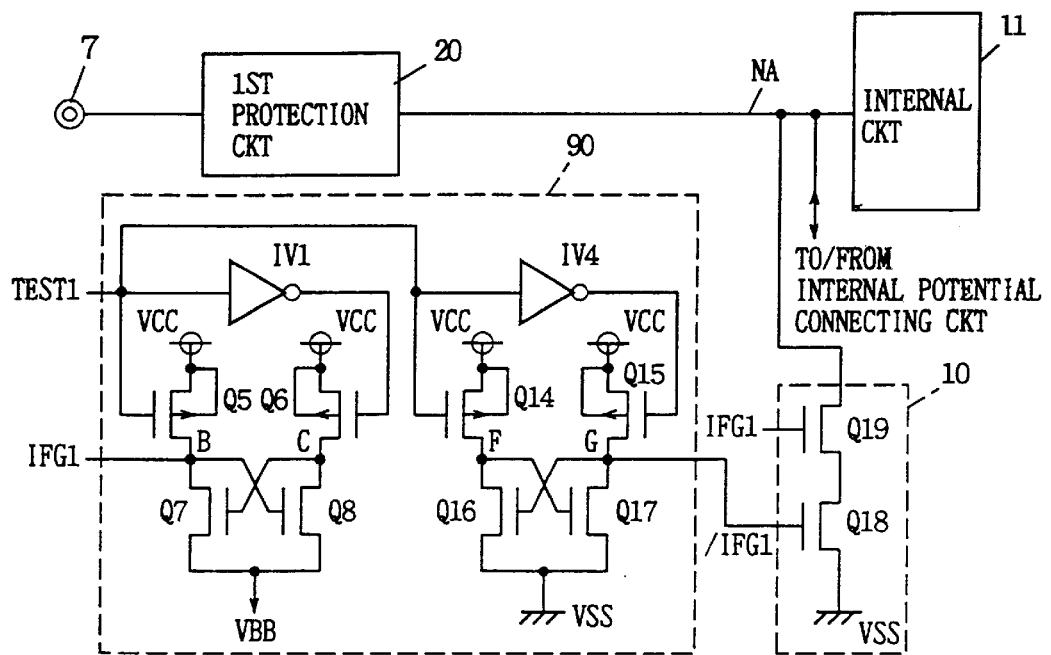
FIG. 12 schematically shows a structure of a main portion of a semiconductor device in accordance with an eighth embodiment of the present invention.

FIG. 12 shows a structure of a main portion of a semiconductor device in accordance with the eighth embodiment of the present invention. In the structure shown in FIG. 12 also, the internal potential connecting circuit for connecting the output portion of substrate potential generating circuit to the internal node NA is not explicitly shown.

The structure shown in FIG. 12 is the same as the structure shown in FIG. 9 except the structure of the first clamp circuit 10, and corresponding portions are denoted by the same reference characters. In the first clamp circuit 10 shown in FIG. 12, n channel MOS transistor Q19 receiving at its gate the control signal IFG1 is connected to internal node NA, and n channel MOS transistor Q18 receiving at its gate the control signal /IFG1 is connected between MOS transistor Q19 and the ground node VSS. MOS transistor Q18 which functions as a clamp element when the forced monitor mode is inactive, is connected to internal node NA through MOS transistor Q19. When the forced monitor mode is active, MOS transistor Q19 is turned off while receiving at its gate the control signal IFG1 at the level of the negative voltage VBB, and prevents leak current from internal node NA to MOS transistor Q18. Therefore, there is no node which is at a floating state associated with the internal node NA, and hence it becomes unnecessary to charge/discharge the internal node which is at the floating state. Therefore, the internal node NA can be set to the level of a prescribed voltage (voltage applied to external terminal 7 or negative voltage transmitted from substrate potential generating circuit (not shown)) at high speed, and hence when the forced monitor mode is activated, the forced monitor mode operation can be executed at high speed.

When the forced monitor mode is inactive, control signal IFG1 is at the level of the power supply voltage VCC, MOS transistor Q19 turns on and electrically connects MOS transistor Q18 which functions as a clamp element to internal node NA. Therefore, pin contact test can be performed by MOS transistor Q18 without any difficulty.

[Modification]

Figure 13:
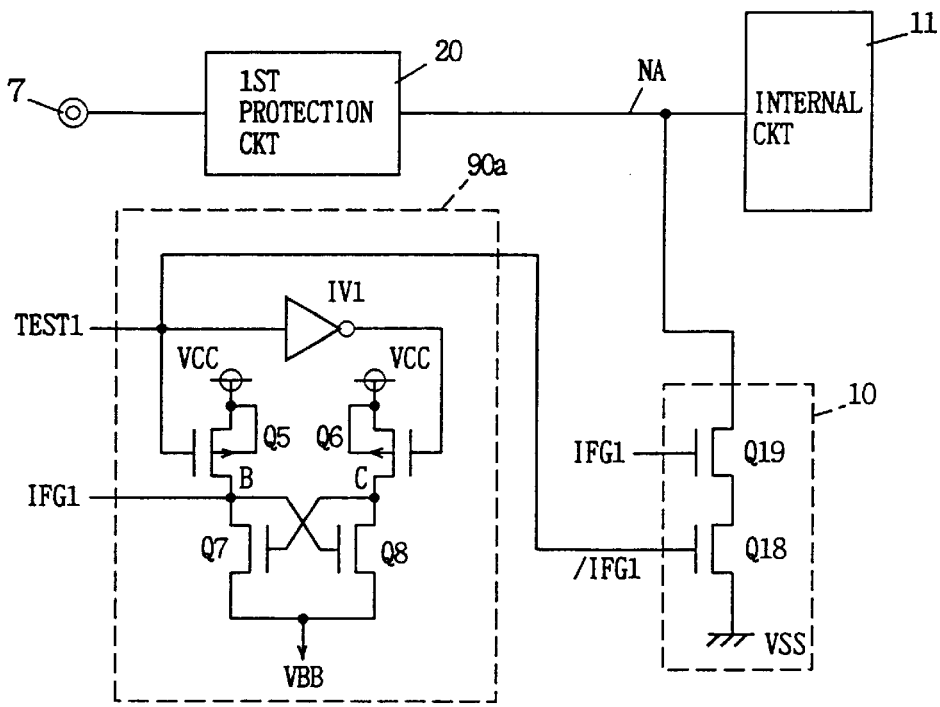
FIG. 13 shows a structure of a modification of the eighth embodiment of the present invention.

FIG. 13 shows a structure of a modification of the eighth embodiment of the present invention. In the structure shown in FIG. 13, the forced monitor mode activating signal TEST1 is applied to the gate of MOS transistor Q18 included in the first clamp circuit 10 as control signal /IFG1. Except for this point, the structure of FIG. 13 is the same as that shown in FIG. 12. Control circuit 90a includes MOS transistors Q5 to Q8, and outputs control signal IFG1 of which level is converted, in response to forced monitor mode activating signal TEST1. In control circuit 90a, as compared with control circuit 90 shown in FIG. 12, MOS transistors Q14 to Q17 become unnecessary, and hence area of occupation can be reduced.

The operation of the circuit shown in FIG. 13 is the same as that of the circuit shown in FIG. 12. When the forced monitor mode activating signal TEST1 is active, even when the voltage level is lower than the level of the power supply voltage VCC, so long as it is higher than the voltage level at which MOS transistor Q18 turns on (that is, a voltage level higher than the threshold voltage of MOS transistor Q18), MOS transistor Q18 turns on, electrically connecting MOS transistor Q19 to ground node VSS, and hence it is possible to prevent any node from being set to the floating state. Therefore, even in such a structure in that the forced monitor mode activating signal TEST1 is directly applied externally, the MOS transistor Q18 can be correctly set to the on/off state in accordance with the operation mode (provided that low level is set to the level of the ground voltage VSS), and necessary function can be correctly implemented.

As described above, in accordance with the eighth embodiment of the present invention, the MOS transistor cutting off the current path in the forced monitor mode is adapted to be connected to the internal node. Therefore, a path through which leak current flows between internal node NA and a floating node or a ground node can be completely cut off, and hence the voltage at the internal node NA can be set to the prescribed voltage level at high speed.

Ninth Embodiment

Figure 14:
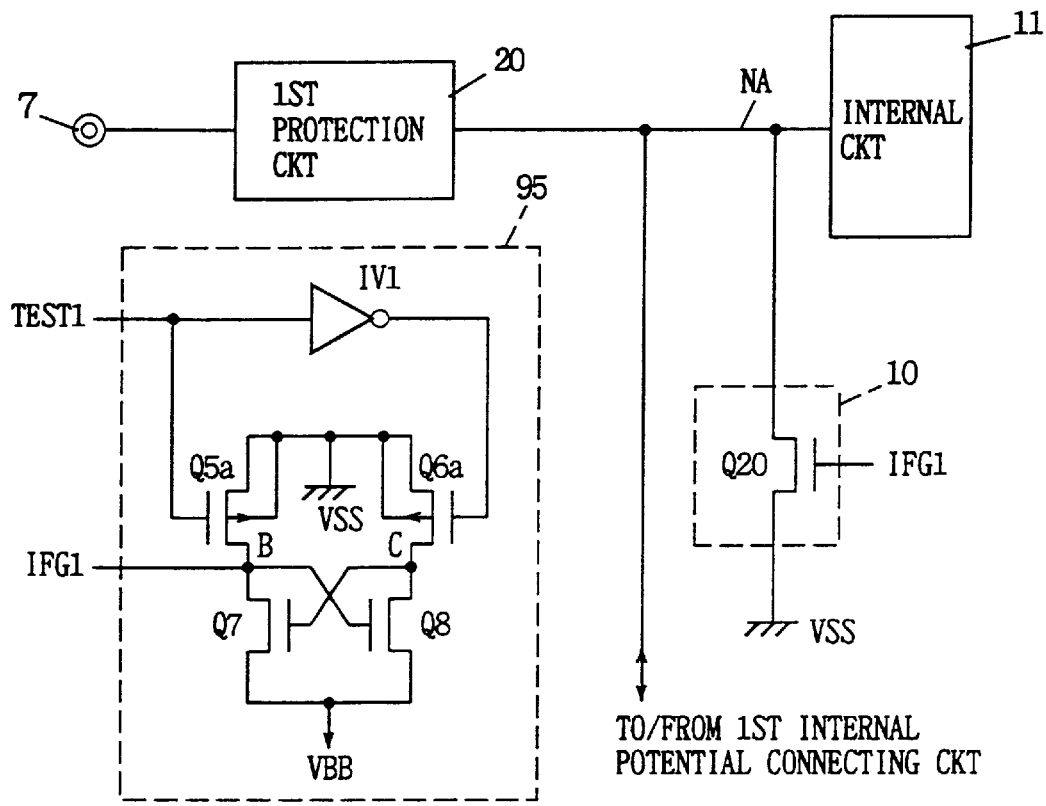
FIG. 14 schematically shows a structure of a main portion of a semiconductor device in accordance with a ninth embodiment of the present invention.

FIG. 14 shows a structure of a main portion of a semiconductor device in accordance with the ninth embodiment of the present invention. In the structure shown in FIG. 14, first clamp circuit 10 is formed by one n channel MOS transistor Q20 connected between internal node NA and the ground node VSS and receiving at its gate the control signal IFG1. Control circuit 95 includes an inverter IV1 receiving forced monitor mode activating signal TEST1; a p channel MOS transistor Q5a connected between the ground node VSS and the node B and receiving at its gate the forced monitor mode activating signal TEST1; a p channel MOS transistor Q6a connected between the ground node VSS and node C and receiving at its gate an output signal from inverter IV1; an n channel MOS transistor Q7 connected between node B and node VBB to which the negative voltage is applied and having its gate connected to node C; and an n channel MOS transistor Q8 connected between node C and node VBB to which the negative voltage is applied, and having its gate connected to node B.

Figure 15:
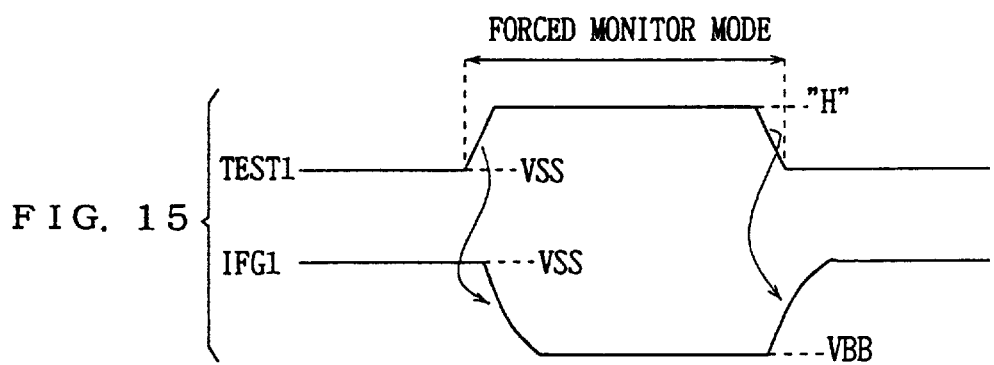
FIG. 15 is a diagram of signal waveforms representing the operation of the semiconductor device shown in FIG. 14.

Control signal IFG1 is output from node B. MOS transistors Q5a and Q6a have the absolute value of the threshold voltage made sufficiently small. Internal circuit 11 and first protection circuit 20 have the same structures as those described with reference to the embodiments above. The operation of the semiconductor device shown in FIG. 14 will be described with reference to FIG. 15, which is a diagram of waveforms.

When the forced monitor mode is inactive, forced monitor mode activating signal TEST1 is at a low level, which corresponds to the level of the ground voltage VSS, and the output signal from inverter IV1 attains to the level of the power supply voltage VCC. MOS transistor Q6a is completely turned off. MOS transistor Q5a is set to a weak on state, and supplies current from ground node VSS to node B. In accordance with the potential at node B, MOS transistor Q8 turns on, and discharges the potential at node C to the voltage level of node VBB to which the negative voltage is applied. When the potential at node C lowers, MOS transistor Q7 changes to the off state responsively, and when the potential at node C finally reaches the level of the negative voltage VBB, MOS transistor Q7 is completely turned off. It requires much time until node B fully reaches the ground voltage VSS by the influence of the threshold voltage of MOS transistor Q5a. The absolute value of the threshold voltage of MOS transistor Q5 is sufficiently made small, and the potential at node B is set approximately at the level of the ground voltage VSS. Accordingly, control signal IFG1 from node B attains to the low level (which is substantially the level of the ground voltage VSS), and MOS transistor Q20 included in the first clamp circuit 10 operates in a diode mode, realizing a prescribed clamping function. Here, if the control signal IFG1 does not fully reach the level of the ground voltage VSS, the gate potential of MOS transistor Q20 becomes a little higher than the level of the ground voltage VSS. However, provided that the absolute value of the threshold voltage of MOS transistor Q5a is made sufficient smaller than the threshold voltage of MOS transistor Q20, necessary clamping function can be realized without any difficulty. If MOS transistors Q20 and Q5a have approximately the same threshold voltage in absolute value, the clamp level of node NA can be set approximately at the level of the ground voltage.

At this time, the first internal potential connecting circuit is rendered non-conductive by forced monitor mode activating signal TEST1, through a path, not shown. Therefore, by applying a desired negative voltage to external terminal 7, it is possible to cause a current to flow through the first clamp circuit 10 (transistor Q20) from internal node NA to the ground node VSS, and hence pin contact test can be performed correctly. Further, when the internal node NA changes to a negative voltage in normal operation mode, MOS transistor Q20 is rendered conductive, and clamps the negative voltage at a prescribed voltage level (−V20+ |VQ5a|), where V20 represents threshold voltage of MOS transistor Q20, and VQ5a represents the threshold voltage of MOS transistor Q5a.

When the forced monitor mode is activated, forced monitor mode activating signal TEST1 attains to a high level, and the output signal of inverter IV1 attains to the low level, which corresponds to the level of the ground voltage VSS. In this state, conversely, MOS transistor Q5a turns off and MOS transistor Q6a turns on. The voltage at node C increases to the level of the absolute value of the threshold voltage of MOS transistor Q6a, and MOS transistor Q7 is turned on. When the potential at node B lowers to the level of the negative voltage VBB, the gate potential and source potential of MOS transistor Q8 become equal to each other, and hence the transistor is completely turned off. Thus lowering of the potential at node C is prevented, MOS transistor Q7 is kept on, and control signal IFG1 output from node B is surely set to the level of the negative voltage VBB. As a result, in the first clamp circuit 10, MOS transistor Q20 is kept off even when the negative voltage VBB is transmitted to internal node NA from external terminal 7 or from the first internal potential connecting circuit. This enables transmission of a negative voltage from external terminal 7 to the output portion of the substrate voltage generating circuit, and external monitoring of the voltage level at the output portion of the substrate voltage generating circuit.

When a voltage VF which is deeper (more negative) than the negative voltage VBB is to be applied to external terminal 7, the deep negative voltage VF is transmitted to the output portion of the substrate potential generating circuit through the first internal potential connecting circuit connected to internal node NA. Therefore, in this case, the voltage level attains to deeper negative voltage VF than at the node VBB, to which the negative voltage is applied, of control circuit 95, and accordingly, control signal IGF1 attains to the level of the negative voltage VF. Therefore, in the first clamp circuit 10, even when MOS transistor Q20 once turns on in response to the deep negative voltage VF which has been transmitted to internal node NA, it is quickly turned off, leakage at MOS transistor Q20 can be prevented, and the potential at internal node NA is stably kept at the level of the voltage of VF which is externally applied.

In this manner, both external monitoring of the internal voltage level and external setting of the internal voltage become possible.

According to the ninth embodiment, the first clamp circuit 10 is formed only by one MOS transistor, and hence compared with the structures of the first to eighth embodiments, the area occupied by the clamp circuit can be reduced. Therefore, a clamp circuit in which activation/inactivation of clamping function is controlled can be implemented by occupying an area comparable to that occupied by a conventional one diode-connected clamp element.

Tenth Embodiment

Figure 16:
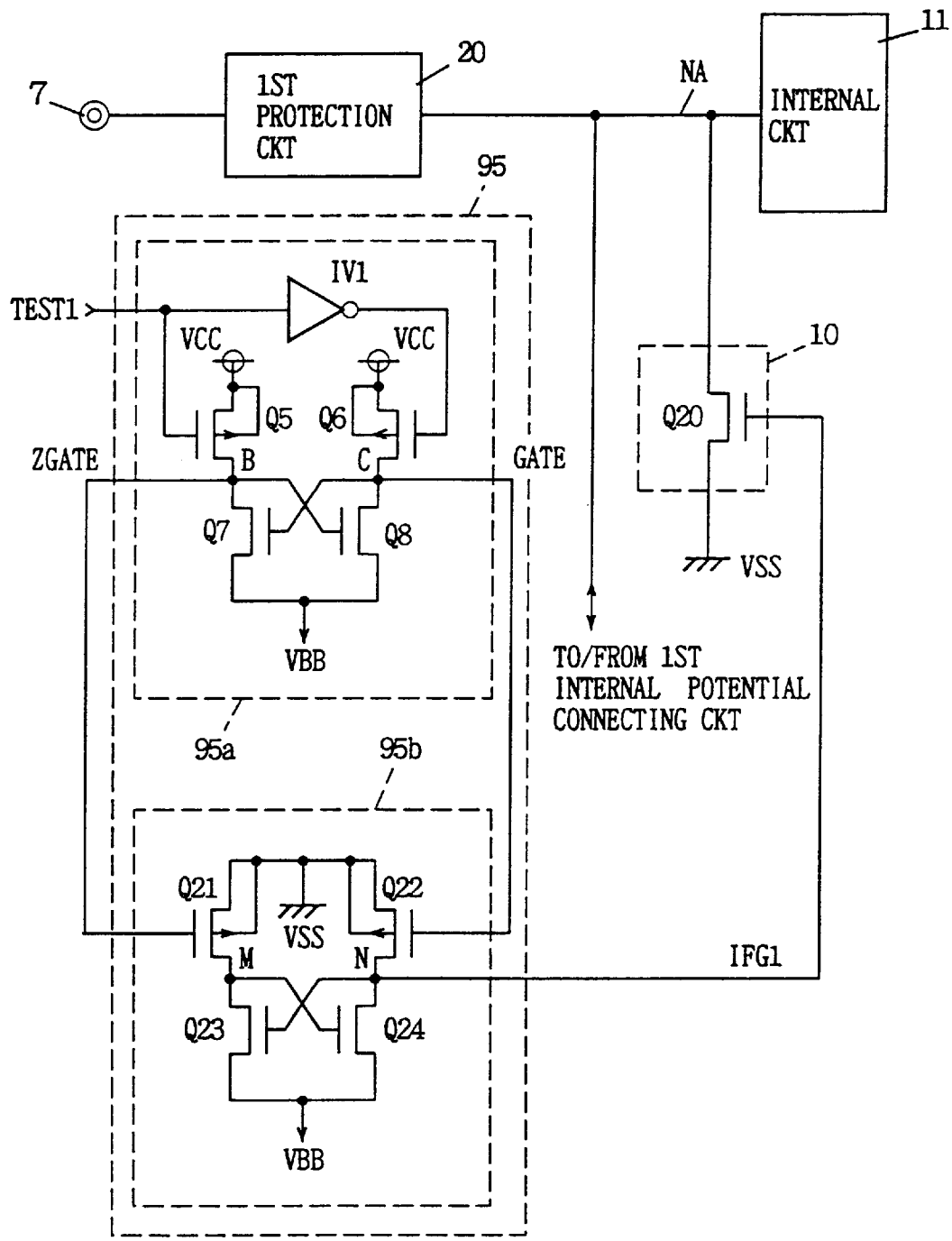
FIG. 16 schematically shows a structure of a main portion of a semiconductor device in accordance with a tenth embodiment of the present invention.

FIG. 16 shows a structure of a main portion of a semiconductor device in accordance with the tenth embodiment of the present invention. Control circuit 95 generating control signal IFG1 includes a first control signal generating circuit 95a responsive to forced monitor mode activating signal TEST1 for outputting complementary signals GATE and ZGATE at the levels of power supply voltage VCC and negative voltage VBB, respectively; and a second control signal generating circuit 95b for outputting control signal IFG1 changing between the levels of ground voltage VSS and negative voltage VBB in accordance with the complementary signals GATE and ZGATE from the first control signal generating circuit 95a. The first clamp circuit 10 includes an n channel MOS transistor Q20 connected between internal node NA and ground node VSS and receiving at its gate the control signal IFG1. Except the structure of control circuit 95, the structure shown in FIG. 16 is the same as that shown in FIG. 14, and corresponding portions are denoted by the same reference characters.

The first control signal generating circuit 95a includes an inverter IV1 receiving the forced monitor mode activating signal TEST1; a p channel MOS transistor Q5 connected between power supply node VCC and node B and receiving at its gate the forced monitor mode activating signal TEST1; a p channel MOS transistor Q6 connected between supply voltage node VCC and node C and receiving at its gate an output signal from inverter IV1; an n channel MOS transistor Q7 connected between node B and node VBB to which the negative voltage is applied and having its gate connected to node C; and an n channel MOS transistor Q8 connected between node C and node VBB to which the negative voltage is applied and having its gate connected to node B. The absolute value of threshold voltages of MOS transistors Q5 and Q6 need not be made smaller. The signal GATE is output from node C, and the signal ZGATE is output from node B.

The second control signal generating circuit 95b includes a p channel MOS transistor Q21 connected between ground node VSS and a node N and receiving at its gate the signal ZGATE; a p channel MOS transistor Q22 connected between ground node VSS and a node N and receiving at its gate the signal GATE; an n channel MOS transistor Q23 connected between node M and node VBB to which the negative voltage is applied and having its gate connected to node N; and an n channel MOS transistor Q24 connected between node N and node VBB to which the negative voltage is applied and having its gate connected to node M. Control signal IFG1 is output from node N.

Figure 17:
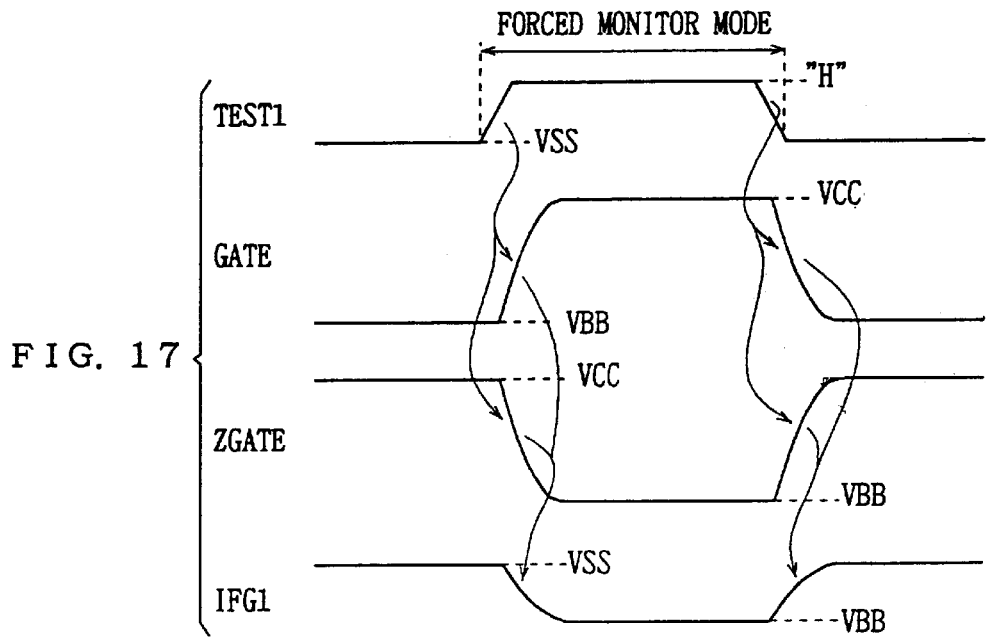
FIG. 17 is a diagram of signal waveforms representing the operation of the semiconductor device shown in FIG. 16.

The operation of the control circuit shown in FIG. 16 will be described with reference to FIG. 17, which is a diagram of waveforms. When the forced monitor mode is inactive, the signal TEST1 is at the low level, which corresponds to the level of the ground voltage VSS, and the output signal from inverter IV1 attains to the high level, which corresponds to the level of the power supply voltage VCC. In this state, MOS transistor Q5 turns on and MOS transistor Q6 turns off. When the potential at node B increases and a potential difference between the potential at node B and the potential at node VBB to which the negative voltage is applied exceeds the threshold voltage of MOS transistor Q8, MOS transistor Q8 turns on, lowering the potential at node C. As the potential at node C lowers, MOS transistor Q7 comes to have smaller conductance, and when the potential difference between node C and node VBB to which the negative voltage is applied becomes smaller than the threshold voltage of MOS transistors Q7, MOS transistor Q7 turns off. Thus the potential at node B is set to the level of the power supply voltage VCC, and the potential at node C is set to the level of the negative voltage VBB.

In the second control signal generating circuit 95b, by the signal ZGATE at the level of the power supply voltage VCC, MOS transistor Q21 is turned off. Meanwhile, since the signal GATE is at the level of the negative voltage VBB, MOS transistor Q22 is surely set to the on state, increasing the potential at node N to the level of the ground voltage VSS. As the potential at node N increases, MOS transistor Q23 turns on when the gate-source potential becomes higher than its threshold voltage, and lowers the potential at node N. As the potential at node N lowers, MOS transistor Q24 comes to have smaller conductance, and when the potential difference between node N and node VBB to which the negative voltage is applied becomes smaller than the threshold voltage of MOS transistor Q24, MOS transistor Q24 turns off. Finally, MOS transistor Q24 is turned off, MOS transistor Q23 is turned on, and control signal IFG1 attains to the level of the ground voltage VSS. In this state, in the first clamp circuit 10, the gate and source potentials of MOS transistor Q22 are both at the level of the ground voltage VSS, and hence the transistor Q22 operates in the diode mode.

In order for the MOS transistor Q22 to be turned on, it is necessary to set the threshold voltage V22 of MOS transistor Q22 such that the absolute values |V22| is not larger than the absolute value |VBB| of the negative voltage of VBB. As long as this condition is satisfied, MOS transistors Q21 and Q22 can be set to the on/off state in accordance with signal TEST1 and the control signal IFG1 at the level of the ground voltage can be surely generated, even when the difference between negative voltage VBB and the ground voltage VSS is small. When the control signal IFG1 is at the level of the ground voltage, the first internal potential connecting circuit is rendered non-conductive, by a control signal through a path, not shown, and the output portion of the substrate potential generating circuit and internal node NA are electrically disconnected. Therefore, pin contact test can be surely carried out.

When the forced monitor mode is activated, signal TEST1 is set to the high level (which is not always at the level of the power supply voltage VCC). In this state, the output signal from inverter IV1 attains to the low level, which corresponds to the level of the ground voltage VSS. MOS transistor Q5 turns off and MOS transistor Q6 turns on. Node C is charged by MOS transistor Q6, so that its potential rises, and MOS transistor Q7 turns on, lowering the potential at node B. Consequently, finally, MOS transistor Q8 turns off, MOS transistor Q7 turns on, node B attains to the level of the negative voltage VBB and node C attains to the level of the power supply voltage VCC.

In the second control signal generating circuit 95b, by the signal ZGATE at the level of the negative voltage VBB, MOS transistor Q21 is turned on, and by the signal GATE at the level of the power supply voltage VCC, MOS transistor Q22 is turned off. As a result, node N attains to the level of the ground voltage VSS, and MOS transistor Q24 turns on when its gate-source potential becomes larger than its threshold voltage, lowering the node N to the level of the negative voltage VBB. As the potential at node N lowers, MOS transistor Q21 is turned off. Therefore, control signal IFG1 output from node N attains to the level of the negative voltage VBB. At this time, the first internal potential connecting circuit turns on through a separate path (not shown), so that the output portion of the substrate potential generating circuit is connected to internal node NA. Therefore, when the potential at internal node NA is at the level of the negative voltage VBB, the gate and source potentials of MOS transistor Q20 are equal to each other, and hence the transistor Q20 is kept off. Therefore, voltage can be applied from external terminal 7, and the voltage level of the negative voltage VBB from the internal voltage generating circuit can be externally monitored.

For the MOS transistors Q21 and Q22 to be turned on, the absolute value of the threshold voltages of these transistors must be smaller than the absolute value of the negative voltage VBB. As long as this condition is satisfied, MOS transistors Q21 and Q22 can be surely switched on/off, even when the difference between the ground voltage VSS and the negative voltage VBB is small.

In the forced monitor mode, when a negative voltage VF which is deeper or more negative than the negative voltage VBB is applied, MOS transistor Q20 is rendered conductive at the time point of application of this voltage. However, the voltage transmitted to internal node NA is transmitted to the output portion of the substrate potential generating circuit through the first internal potential connecting circuit, and the voltage level of negative voltage VBB lowers to the level of the externally applied voltage VF in response (the driving power for applying the voltage VF externally is sufficiently larger than the current drivability of the substrate potential generating circuit). Therefore, the voltage level of control signal IFG1 also lowers to the level of the negative voltage VF, MOS transistor Q20 can be surely turned off, and leak current path between internal node NA and the ground node VSS can be cut. Therefore, internal node NA can be accurately set to the level of the externally applied voltage VF.

In the structure shown in FIG. 16 also, the first clamp circuit 10 is formed only by one MOS transistor, and hence area of occupation can be reduced. Further, control circuit 95 is constituted by two stages of level converting circuits, and therefore even when the difference between the negative voltage VBB and the ground voltage VSS and/or the difference between the power supply voltage VCC and the ground voltage is small, MOS transistors Q21 and Q22 included in the second control signal generating circuit can be surely switched on/off, and hence control signal IFG1 can be surely changed to the levels of ground voltage VSS and negative voltage VBB. Further, what is required for the MOS transistors Q21 and Q22 is simply to have the absolute value of the threshold voltage made smaller than the absolute value of negative voltage VBB. Making the absolute value of the threshold voltage sufficiently small does not require any additional manufacturing step (the step of ion implantation for compensation of threshold voltage), and therefore a control signal having necessary voltage level can be generated easily.

Eleventh Embodiment

Figure 18:
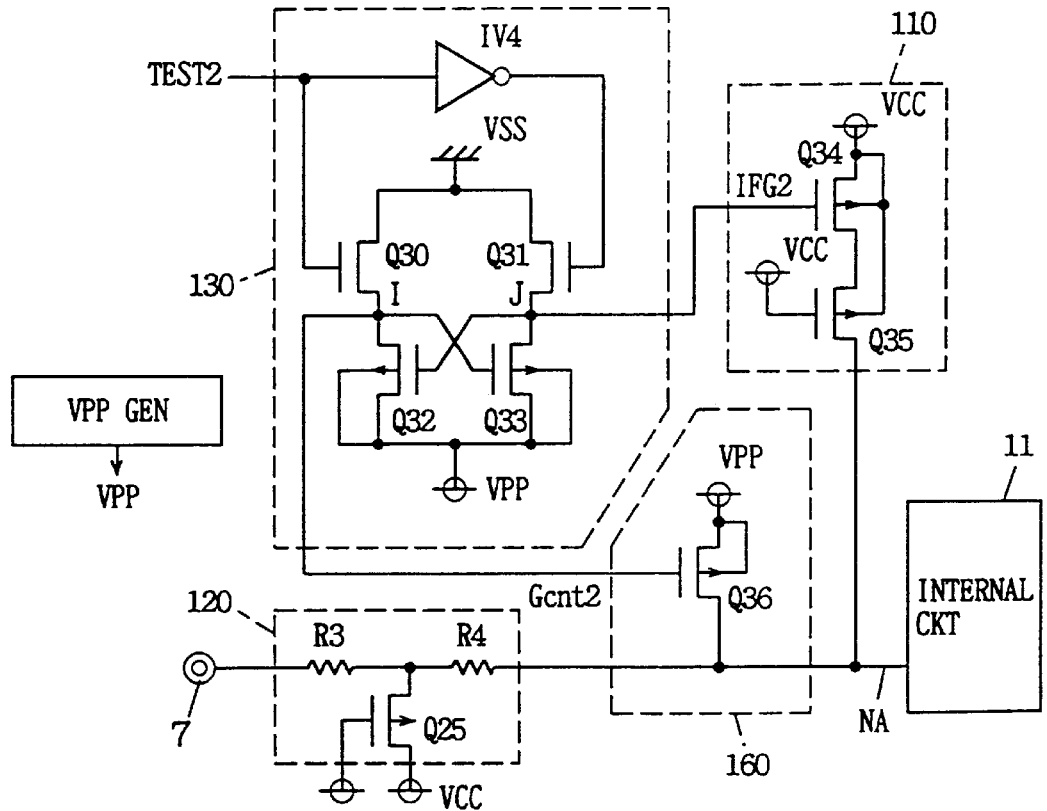
FIG. 18 schematically shows a structure of a main portion of a semiconductor device in accordance with an eleventh embodiment of the present invention.

FIG. 18 shows a structure of a main portion of a semiconductor device in accordance with the eleventh embodiment of the present invention. In a semiconductor memory device, a boosted voltage VPP which is higher than the power supply voltage is utilized. The boosted voltage VPP is used, for example, to set the voltage level of a word line driving signal transmitted to a selected word line to be higher than the power supply voltage VCC in a dynamic random access memory. Further, the boosted voltage may be applied to a control gate or a source region of a memory cell during erasing operation or programming of a non-volatile semiconductor memory device.

Referring to FIG. 18, the semiconductor device includes a second protection circuit 120 arranged between external terminal 7 and internal node NA for absorbing a high voltage applied to external terminal 7; a second clamp circuit 110 connected between internal node NA and power supply voltage node (reference voltage source) VCC for clamping the high potential at internal node NA at a prescribed potential level; and a third control circuit 130 responsive to a second forced monitor mode activating signal TEST2 for inactivating the clamping function of the second clamp circuit 110. The third control circuit 130 generates signal IFG2 for controlling activation/inactivation of the clamping function, and in addition, a connection control signal Gcnt2. The semiconductor device further includes a second connection control circuit 160 responsive to the connection control signal Gcnt2 for electrically connecting internal node NA to a boosted node VPP. The boosted node VPP represents a node to which the boosted voltage generated by an internal boosted voltage generating circuit, not shown, is transmitted. This may be an output portion of the boosted voltage generating circuit.

The second protection circuit 120 includes two resistors R3 and R4 connected in series between external terminal 7 and internal node NA, and a p channel MOS transistor Q20 having one conduction node connected to a connection portion between resistors R3 and R4 and its gate and the other conduction node connected to power supply node VCC. MOS transistor Q25 has a field insulating film as a gate insulating film, and has a small negative threshold voltage (threshold voltage of which absolute value is large). When a high voltage is applied to external terminal 7, MOS transistor Q25 is rendered conductive to absorb the high voltage, preventing application of a high voltage which cannot be absorbed by the clamp circuit to the internal circuit. Resistor R3 prevents a large current from flowing to MOS transistor Q25, and resistors R3 and R4 prevent a large current from flowing to the second clamp circuit 110.

The second clamp circuit 110 includes a p channel MOS transistor Q35 connected to internal node NA, and a p channel MOS transistor Q34 connected between MOS transistor Q35 and power supply node VCC. MOS transistor Q35 has its gate connected to power supply node VCC, and MOS transistor Q34 is connected to receive at its gate the control signal IFG2. Substrate regions of MOS transistors Q34 and Q35 are connected to power supply node VCC. When the voltage at internal node NA exceeds power supply voltage VCC, it is discharged through the substrate region, so as to absorb noise at high speed.

The third control circuit 130 includes an inverter IV2 receiving the second forced monitor mode activating signal TEST2; a p channel MOS transistor Q30 connected between ground node VSS and a node I and receiving at its gate the signal TEST2; an n channel MOS transistor Q31 connected between the ground VSS and an internal node J and receiving at its gate an output signal from inverter IV4; a p channel MOS transistor Q32 connected between node I and boosted node VPP and having its gate connected to node J; and a p channel MOS transistor Q33 connected between node J and boosted node VPP and having its gate connected to node I. Control signal IFG2 is output from node J, and control signal Gcnt2 is output from node I. Control circuit 130 has a function of converting and outputting the binary control signal TEST2 to a signal changing between the boosted voltage VPP and the ground voltage VSS.

Figure 19:
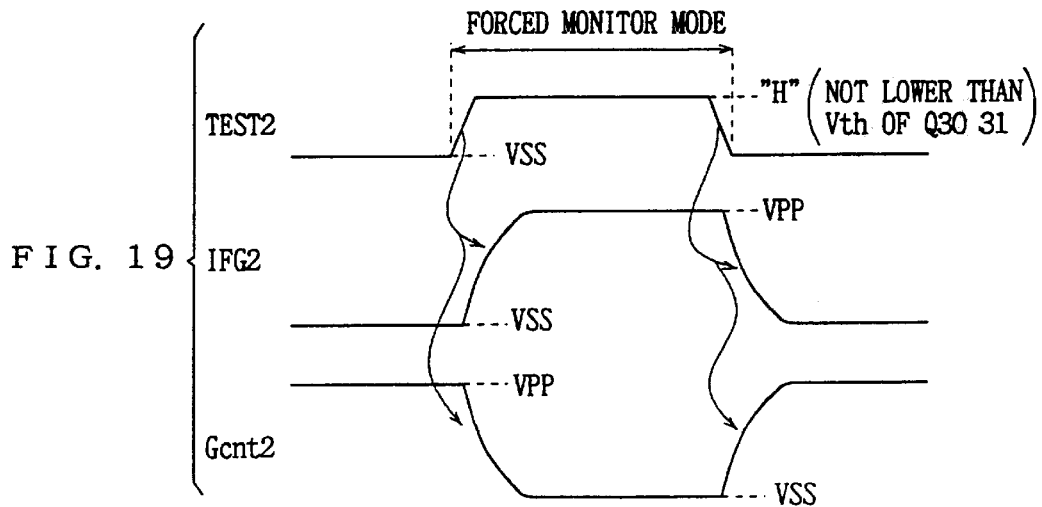
FIG. 19 is a diagram of signal waveforms representing the operation of the semiconductor device shown in FIG. 18.

The second internal potential connecting circuit 160 includes a p channel MOS transistor Q36 connected between boosted node VPP and internal node NA and receiving at its gate the control signal Gcnt2. Substrate region of MOS transistor Q36 is connected to the boosted node VPP. The second internal potential connecting circuit 160 may be formed by using an n channel MOS transistor. However, in that case, in order to transmit the boosted voltage VPP to the internal node NA, it becomes necessary to further boost the control signal Gcnt2. Use of a p channel MOS transistor eliminates a circuit structure for boosting the control signal, and hence circuit structure can be simplified. The structure of the internal circuit 11 is the same as that shown in FIG. 1. The operation of the semiconductor device shown in FIG. 8 will be described with reference to FIG. 19, which is a diagram of signal waveforms.

When the forced monitor mode is inactive, forced monitor mode activating signal TEST2 is at the low level, and in control circuit 130, the output signal from inverter IV4 attains to the high level which corresponds to the level of the power supply voltage VCC. Consequently, MOS transistor Q30 turns off, MOS transistor Q31 turns on, and the potential at node J lowers. MOS transistor Q32 comes to have larger conductance as the potential at node J lowers, and it supplies current from boosted node VPP to node I to raise the potential at node I. As the potential at node I increases, MOS transistor Q33 comes to have smaller conductance. Finally, MOS transistor Q33 turns off, MOS transistor Q32 turns on, the potential at node J reaches the level of the ground voltage VSS, and the potential at node I attains to the level of the boosted voltage VPP.

In the first clamp circuit 110, MOS transistor Q34 turns on, receiving the control signal IFG2 at the level of the ground voltage VSS at its gate, and transmits the power supply voltage VCC to MOS transistor Q35. Consequently, MOS transistor Q35 operates in the diode mode, and functions as a clamp element. When the voltage at node NA becomes higher than VCC+Vthp, MOS transistor Q35 is rendered conductive, electrically connecting node NA to power supply node VCC, so that the voltage level at internal node NA lowers. Here, Vthp represents the absolute value of the threshold voltage of MOS transistor Q35.

Meanwhile, in the second internal potential connecting circuit 160, the control signal Gcnt 2 at the level of the boosted voltage VPP is being applied to the gate of MOS transistor Q36, and MOS transistor Q36 is kept off unless the potential at node NA becomes higher than the boosted voltage VPP. If MOS transistors Q36 and Q35 have the same threshold voltage, MOS transistor Q36 turns on when the potential at node NA attains to VPP+Vthp, while MOS transistor Q35 turns on when the potential at internal node NA attains to VCC+Vthp or higher. Therefore, if the current drivability of MOS transistor Q35 is set larger than that of MOS transistor Q36, even when the potential at internal node NA is abruptly increased because of noise, the potential level at internal node NA can be lowered by the second clamp circuit 110, and hence MOS transistor Q36 in the second internal potential connecting circuit 160 can be surely maintained off. Therefore, in this state, it is possible to apply a high voltage VPP from external terminal 7 and externally determine whether a current flows through the first clamp circuit 110, and hence pin contact test can be performed by using a high voltage. The high voltage VPP have only to satisfy the relation VPP>VP>VCC.

When the forced monitor mode is activated, forced monitor mode activating signal TEST2 is set to the high level. The high level of the forced monitor mode activating signal TEST2 have only to be a level not lower than the threshold voltage Vth of MOS transistors Q30 and Q31, and it need not be at the level of the power supply voltage VCC. However, it is necessary that the signal TEST2 changes exceeding the input logic threshold value of inverter IV4.

In this state, the output signal from inverter IV4 is at the level of the ground voltage VSS, MOS transistor Q31 is off and MOS transistor Q30 is on. Therefore, node I is discharged to the level of the ground voltage by MOS transistor Q30, and when the potential at node I becomes higher than the boosted voltage VPP at the boosted node VPP by the threshold value (that is, lower by the absolute value of the threshold voltage), MOS transistor Q33 turns on, raising the potential at node J. As the potential at node J rises, MOS transistor Q32 comes to have lower conductance, and if the potential difference between node J and the boosted node VPP becomes smaller than the absolute value of the threshold voltage of MOS transistor Q32, MOS transistor Q32 turns off. Consequently, node I attains to the level of the ground voltage, and node J attains to the level of the boosted voltage VPP.

In the second clamp circuit 110, by the control signal IFG2 at the level of the boosted voltage VPP, MOS transistor Q34 is kept off unless a voltage higher than the boosted voltage VPP is transmitted through MOS transistor Q35. Meanwhile, in the internal potential connecting circuit 160, in response to the control signal Gcnt2 at the level of the ground voltage VSS, MOS transistor Q36 turns on, and connects the boosted node VPP to internal node NA. Therefore, it becomes possible to monitor the level of the boosted voltage VPP through external terminal 7.

Even when external terminal 7 and internal node NA attain to the level of the boosted voltage and MOS transistor Q35 turns on, the leak current applied through MOS transistor Q35 is cut off by MOS transistor Q34. Therefore, after the leak current through MOS transistor Q35 is stopped, it is possible to monitor the voltage level of the boosted voltage VPP through external terminal 7.

When the high voltage VP is externally applied, even when a voltage level higher than the boosted voltage VPP generated by the boosted voltage generating circuit is applied, the high voltage is applied to the boosted node VPP from internal node NA through MOS transistor Q36, the voltage level at boosted node VPP gradually rises, and in response, the boosted voltage of control signal IFG2 rises to the level of the high voltage VP. Therefore, even when MOS transistor Q35 turns on and leak current is generated, the gate potential of MOS transistor Q34 is surely kept at the level of the high voltage VP, and the drain potential (conduction node connected to MOS transistor Q35) can be made lower than the level of the high voltage VP and the drain is connected to node NA through MOS transistor Q35. Therefore, MOS transistor Q34 can be surely kept off, and a high voltage of a desired voltage level can be externally applied to the boosted node VPP accurately.

In the structure shown in FIG. 18, by control circuit 130, control signals IFG2 and Gcnt2 for the second clamp circuit 110 and the second internal potential connecting circuit 160 are generated. In this case, control circuits may be separatedly provided for the second clamp circuit 110 and the second internal potential connecting circuit 160 so that control signals IFG2 and Gcnt2 are generated separatedly.

Further, as already described with reference to the embodiments above, in the second clamp circuit 110, positions of MOS transistors Q34 and Q35 may be exchanged. By exchanging the positions, the leak current through MOS transistor Q35 can be prevented, and internal node NA can be set to a desired voltage level at high speed.

Further, p channel MOS transistor Q34 may be replaced by an n channel MOS transistor. In this case, control signal Gcnt2 is applied to the gate of n channel MOS transistor.

Further, structures utilized in the first to tenth embodiments described with respect to negative voltage VBB are all applicable. By substituting boosted voltage VPP for the negative voltage VBB, substituting p channel MOS transistor for n channel MOS transistor and substituting n channel MOS transistor for p channel MOS transistor, and by substituting the ground voltage VSS and power supply voltage VCC, components necessary for the boosted voltage VPP can all be implemented.

As described above, according to the eleventh embodiment of the present invention, the clamp circuit for clamping the high voltage level at the internal node at a prescribed potential level is adapted to be activated/inactivated in accordance with the test mode, so that for the boosted voltage also, various test modes including pin contact test, external voltage monitoring and external application of a high voltage, can be performed.

Twelfth Embodiment

Figure 20:
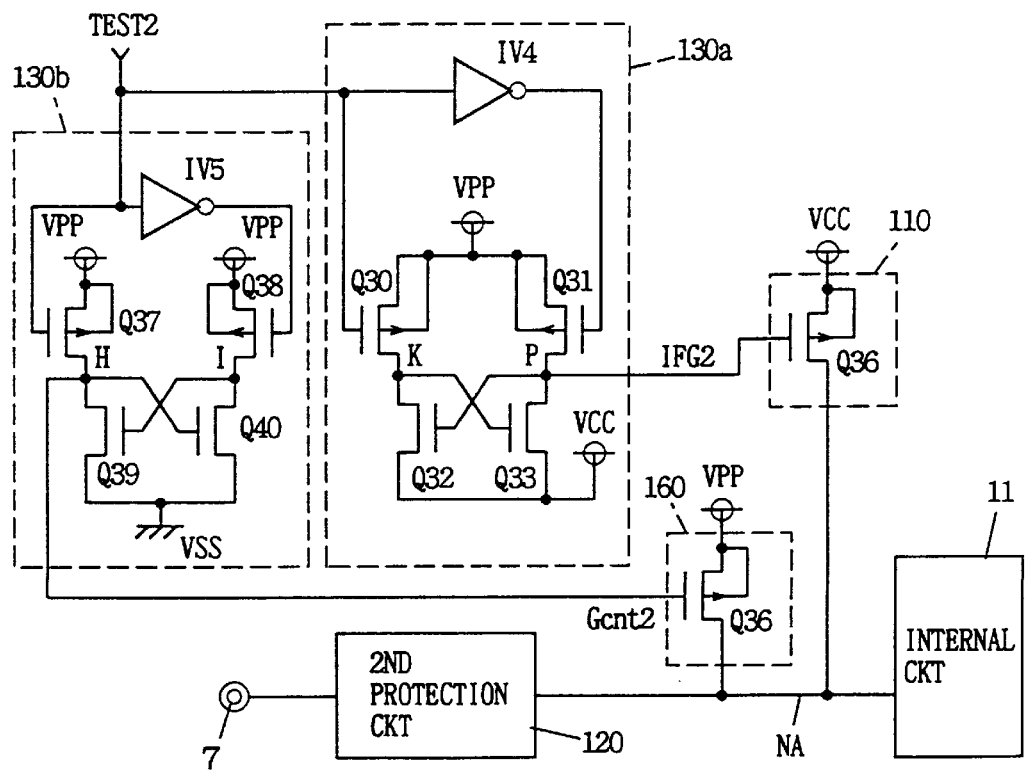
FIG. 20 schematically shows a structure of a main portion of a semiconductor device in accordance with a twelfth embodiment of the present invention.

FIG. 20 shows a structure of a main portion of a semiconductor device in accordance with the twelfth embodiment of the present invention. Referring to FIG. 20, the second clamp circuit 110 includes a p channel MOS transistor Q34 connected between power supply node VCC and internal node NA and receiving at its gate the control signal IFG2. The second internal potential connecting circuit 160 is formed by a p channel MOS transistor Q36 connected between internal node NA and boosted node VPP and receiving at its gate the control signal Gcnt2.

The control signal generating portion includes a control signal generating circuit 130a responsive to the forced monitor mode activating signal TEST2 for outputting control signal IFG2; and a control signal generating circuit 130b responsive to the signal TEST2 for generating the control signal Gcnt2. Control signal generating circuit 130a includes an inverter IV4 receiving the signal TEST2; a p channel MOS transistor Q30 connected between boosted node VPP and a node K and receiving at its gate the signal TEST2; a p channel MOS transistor Q31 connected between boosted node VPP and node P and receiving at its gate an output signal from inverter IV4; an n channel MOS transistor Q32 connected between node K and power supply node VCC and having its gate connected to node P; and an n channel MOS transistor Q33 connected between node P and power supply node VCC and having its gate connected to node K. Control signal IFG2 is output from node P. The absolute value of the threshold voltage of MOS transistors Q30 and Q31 is set to a large value (at least VPP-VCC). The threshold voltage of MOS transistors Q32 and Q33 is made smaller than the difference between boosted voltage VPP and the power supply voltage VCC.

Figure 21:
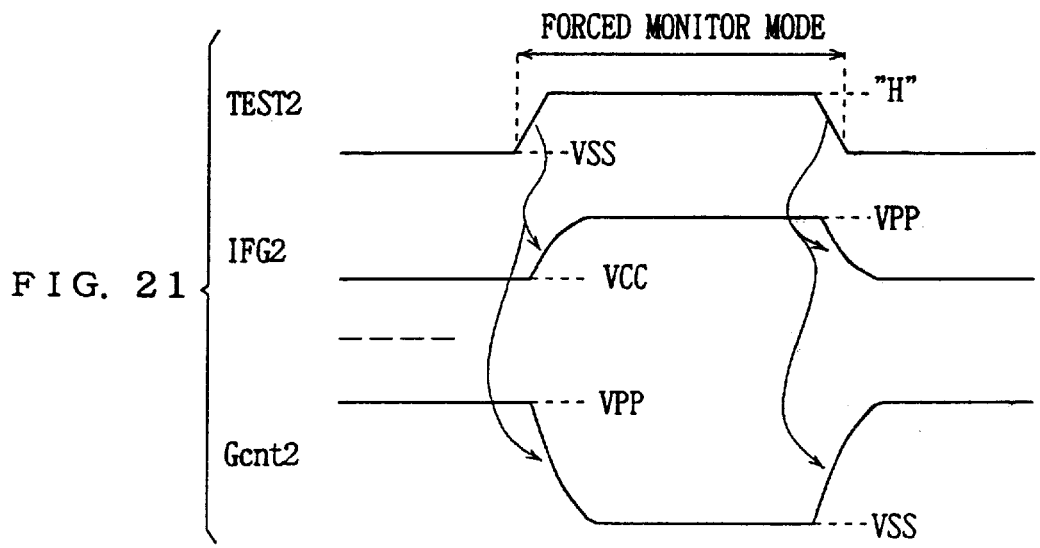
FIG. 21 is a diagram of signal waveforms representing the operation of the semiconductor device shown in FIG. 20.

Control signal generating circuit 130b includes an inverter IV5 receiving signal TEST2; a p channel MOS transistor Q37 connected between boosted node VPP and a node H; a p channel MOS transistor Q38 connected between boosted node VPP and node I and receiving at its gate an output signal from inverter IV5; an n channel MOS transistor Q39 connected between node H and the ground node VSS and having its gate connected to node I; and an n channel MOS transistor Q40 connected between node I and the ground node VSS and having its gate connected to node H. The absolute value of the threshold voltage of MOS transistors Q37 and Q38 is made large (at least VPP-VCC). The operation of the semiconductor device shown in FIG. 20 will be described with reference to FIG. 21, which is a diagram of signal waveforms.

When the forced monitor mode is inactivated, signal TEST2 is at the lower level, and the output signal from inverter IV4 attains to the high level. In control signal generating circuit 130a, MOS transistor Q30 turns on and MOS transistor Q31 turns off. At this time, since the absolute value of the threshold voltage of MOS transistor Q31 is sufficiently large, MOS transistor Q31 is surely turned off in response to the high level output signal from inverter IV4. In this state, when node K is charged by MOS transistor Q30 and its potential level increases and as a result, the difference between the gate potential and source potential (power supply voltage VCC) of MOS transistor Q33 becomes higher than the threshold voltage, MOS transistor Q33 turns on and node P is set to the level of the power supply voltage VCC. Since MOS transistor Q31 is off, the potential at node P is surely set to the level of the power supply voltage VCC by MOS transistor Q33. When the potential at node P attains to the level of the power supply voltage VCC, gate and source potentials of MOS transistor Q32 become equal to each other, and hence the transistor is kept off. Thus node K is maintained at the level of the boosted voltage VPP. Consequently, control signal IFG2 at the level of the power supply voltage VCC is output from node P. In the second clamp circuit 110, MOS transistor Q34 receives the control signal IFG2 at the level of the power supply voltage VCC at its gate, operates in the diode mode and functions as a clamp element.

Meanwhile, in control signal generating circuit 130b, MOS transistor Q37 is turned on and MOS transistor Q38 is turned off. Node H is charged at high speed by MOS transistor Q37, to the level of the boosted voltage VPP. Consequently, MOS transistor Q40 turns on, discharges the node I to the level of the ground voltage VSS, and MOS transistor Q39 is turned off. Thus control signal Gcnt2 output from node H attains to the level of the boosted voltage VPP. In the second internal connection circuit 160, MOS transistor Q36 receives the control signal Gcnt2 at the level of the boosted voltage VPP, and it is kept off unless the potential at internal node NA becomes higher than the sum of the boosted voltage VPP and the absolute value of the threshold voltage MOS transistor Q36. Therefore, in this state, it is possible to perform pin contact test by applying a high voltage VP at an appropriate level from external terminal 7 so as to cause a current to flow from internal node NA through the second clamp circuit 110 to power supply node VCC.

When the forced monitor mode is activated, signal TEST2 attains to the high level, and output signals from inverters IV4 and IV5 attain to the low level, which corresponds to the level of the ground voltage VSS. In control signal generating circuit 130a, conductance of MOS transistor Q31 becomes sufficiently larger than that of MOS transistor Q30, the output from node P is charged at high speed, and, in response, MOS transistor Q32 turns on. Node K is discharged to the level of the power supply voltage VCC through MOS transistor Q32, and in response, conductance of MOS transistor Q33 lowers. Finally, MOS transistor Q33 is turned off, MOS transistor Q32 is turned on, and control signal IFG2 output from node P attains to the level of the boosted voltage VPP.

In control signal generating circuit 130b also, conductance of MOS transistor Q38 becomes sufficiently larger than that of MOS transistor Q37, the potential at node I increases at a higher speed than node H, MOS transistor Q39 is turned on, and MOS transistor Q40 is turned off. Control signal Gcnt2 output from node H is set to the level of the ground voltage VSS by the MOS transistor Q39 which is on. In the first clamp circuit 110, the control signal IFG2 applied to the gate of MOS transistor Q34 is at the level of the high voltage VPP, and MOS transistor Q34 is kept off unless the potential at internal node NA becomes higher than the boosted voltage VPP. Meanwhile, in the second internal potential connecting circuit 160, MOS transistor Q36 turns on while receiving at its gate the control signal Gcnt2 at the level of the ground voltage VSS, and it connects the boosted node VPP to the internal node NA. Therefore, in this state, it is possible to externally monitor the boosted voltage VPP at the boosted node VPP through external node 7. When the high voltage VP is to be applied from external terminal 7 to boosted node VPP, the voltage level at boosted node VPP also changes to the level of the high voltage VP in response, and the voltage level of control signal IFG2 also attains to the level of the high voltage VP. Therefore, when the potential at internal node NA attains to the level of the high voltage VP, the voltage level of control signal IFG2 also attains to the level of the high voltage VP in response, and MOS transistor Q34 can be surely kept off as its gate potential and the source potential are the same with each other. Therefore, it is possible to operate internal circuitry (other than internal circuit 11) by applying a high voltage of a desired voltage level to boosted node VPP.

[Modification]

Figure 22:
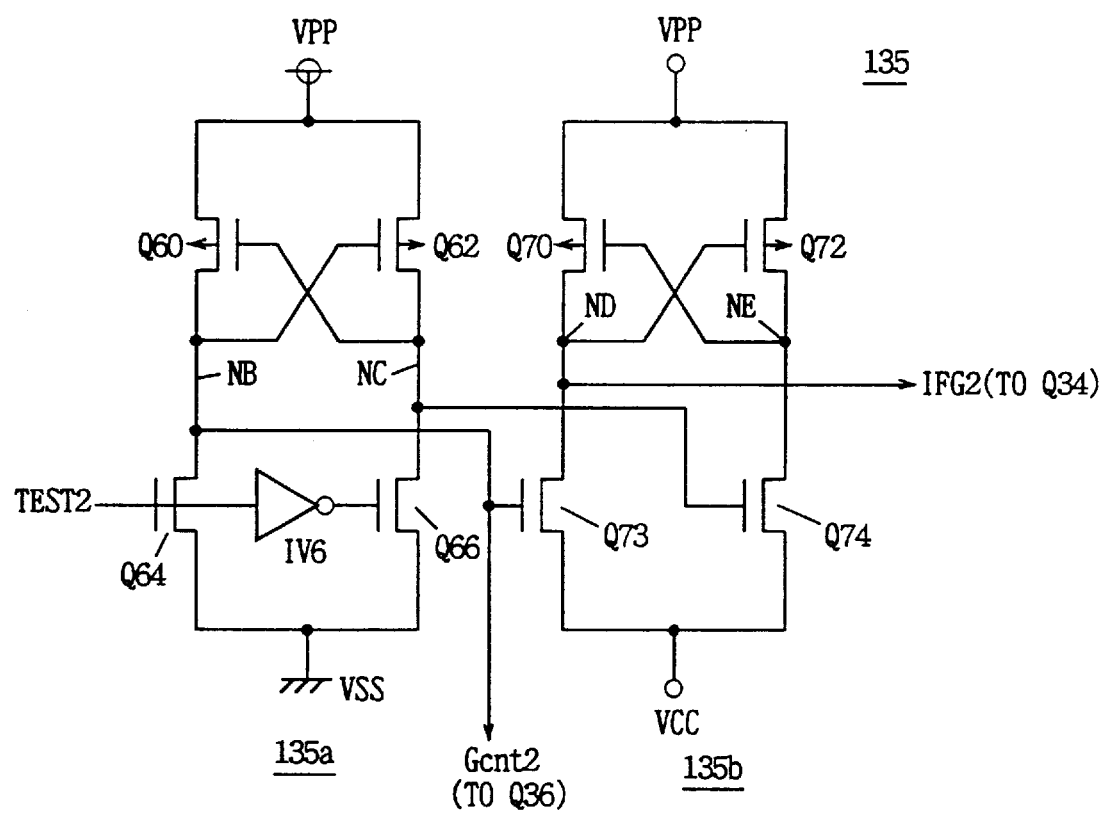
FIG. 22 shows a structure of a modification of the twelfth embodiment of the present invention.

FIG. 22 shows a structure of a modification of the twelfth embodiment of the present invention. FIG. 22 shows a structure of a control circuit 135 which can substitute for control signal generating circuits 130a and 130b. Control circuit 135 includes a control signal generating circuit 135a responsive to the forced monitor mode activating signal TEST2 for outputting control signal Gcnt2, and control signal generating circuit 135b for outputting control signal IFG2 in accordance with signals (complementary signals) output from the control signal generating circuit 135a. Control signal generating circuit 135a includes a p channel MOS transistor Q60 connected between boosted node VPP and node NB and having its gate connected to node NC; a p channel MOS transistor Q62 connected between boosted node VPP and node NC and having its gate connected to node NB; an n channel MOS transistor Q64 connected between node NB and ground node VSS and receiving at its gate the forced monitor mode activating signal TEST2; and an n channel MOS transistor Q66 connected between node NC and ground node VSS and receiving at its gate the forced monitor mode activating signal TEST2 through inverter IV6. Control signal Gcnt2 is output from node NB.

Control signal generating circuit 135b includes a p channel MOS transistor Q70 connected between boosted node VPP and a node ND and having its gate connected to a node NE; a p channel MOS transistor Q72 connected between boosted node VPP and node NE and having its gate connected to node ND; an n channel MOS transistor Q72 connected between node NB and power supply node VCC and having its gate connected to node ND; and an n channel MOS transistor Q74 connected between node NE and power supply node VCC and having its gate connected to node NC. Control signal IFG2 is output from node ND. Control signal IFG2 is applied to the gate of MOS transistor Q34 shown in FIG. 20. Control signal Gcnt2 is applied to the gate of MOS transistor Q36 shown in FIG. 20. The operation will be briefly described.

When the forced monitor mode is inactive, the signal TEST2 is at the low level which corresponds to the level of the ground voltage VSS, MOS transistor Q64 is turned off and MOS transistor Q66 is turned on. In this state, node NC is discharged to the level of the ground voltage VSS through MOS transistor Q66. As the potential at node NC lowers, MOS transistor Q66 turns on, the potential at node NB rises to the level of the boosted voltage VPP, and MOS transistor Q62 turns off. Thus, node NC attains to the level of the ground voltage VSS, and node NB attains to the level of the boosted voltage VPP. Therefore, control signal Gcnt2 at the level of the boosted voltage VPP is output.

In the control signal generating circuit 135b, MOS transistor Q73 receiving at its gate the boosted voltage VPP is turned on and MOS transistor Q74 receiving at its gate the ground voltage VSS is turned off. Therefore, node ND is electrically connected to power supply node VCC, and the potential at node ND is set to the level of the power supply voltage VCC. When the potential difference between boosted node VPP and node ND becomes large, MOS transistor Q72 turns on, and node NE is charged to the level of the boosted voltage VPP. When node NE attains to the level of the boosted voltage VPP, MOS transistor Q70 is turned off, and node ND is set to the level of the power supply voltage VCC by MOS transistor Q73. Therefore, control signal IFG2 output from node ND attains to the level of the power supply voltage VCC.

When the forced monitor mode is activated, signal TEST2 is set to the high level, MOS transistor Q64 is turned on and MOS transistor Q66 is turned off. Therefore, in this state, control signal Gcnt2 output from node ND is set to the level of the ground voltage VSS. Meanwhile, in control signal generating circuit 135b, MOS transistor Q73 turns off while receiving the ground voltage VSS at its gate, MOS transistor Q74 turns on while receiving the boosted voltage VPP at node NC, and node NE is electrically connected to power supply voltage VCC. Therefore, MOS transistor Q70 turns on and node ND is charged to the level of the boosted voltage VPP. When the voltage level at node ND attains to the level of the boosted voltage VPP, MOS transistor Q72 is completely turned off, and node NE is kept at the level of the power supply voltage VCC by MOS transistor Q74. As a result, control signal IFG2 from node ND attains to the level of the boosted voltage VPP.

In the control circuit shown in FIG. 22, it is not necessary to enlarge the absolute value of the threshold voltages of MOS transistors Q60, Q62, Q70 and Q72. What is necessary is simply that the absolute values of the threshold voltages of MOS transistors Q70, Q72, Q73 and Q74 are smaller than the difference between boosted voltage VPP and power supply voltage VCC. Therefore, control signal Gcnt2 which changes between the levels of boosted voltage VPP and ground voltage VSS and control signal IFG2 which changes between boosted voltage VPP and the power supply voltage VCC can be generated easily without requiring an additional step of manufacturing.

As control signal Gcnt2 and control signal IFG2 are generated by separate circuits, internal potential connecting circuit 160 shown in FIG. 20 can be arranged near the boosted voltage generating circuit, and especially, it becomes unnecessary to arrange this connection circuit 160 near the internal node NA. Control signal generating circuit 130b or 130a can be arranged at an appropriate position on the chip. Therefore, it is possible to arrange control signal generating circuit 130a or 135a and internal potential connecting circuit 160 at an empty region on the chip on which the semiconductor device is formed, it becomes unnecessary to arrange the control signal generating circuit, the internal potential connecting circuit and the second clamp circuit collectively in one region, and hence the arrangement can be optimized utilizing empty regions. Therefore, area of occupation can be reduced and hence, area occupied by the input protection circuit portion can be reduced.

Further, in accordance with the twelfth embodiment, the second clamp circuit 110 is constituted by only one MOS transistor. Therefore, area occupied by the clamp circuit can be reduced.

Thirteenth Embodiment

Figure 23:
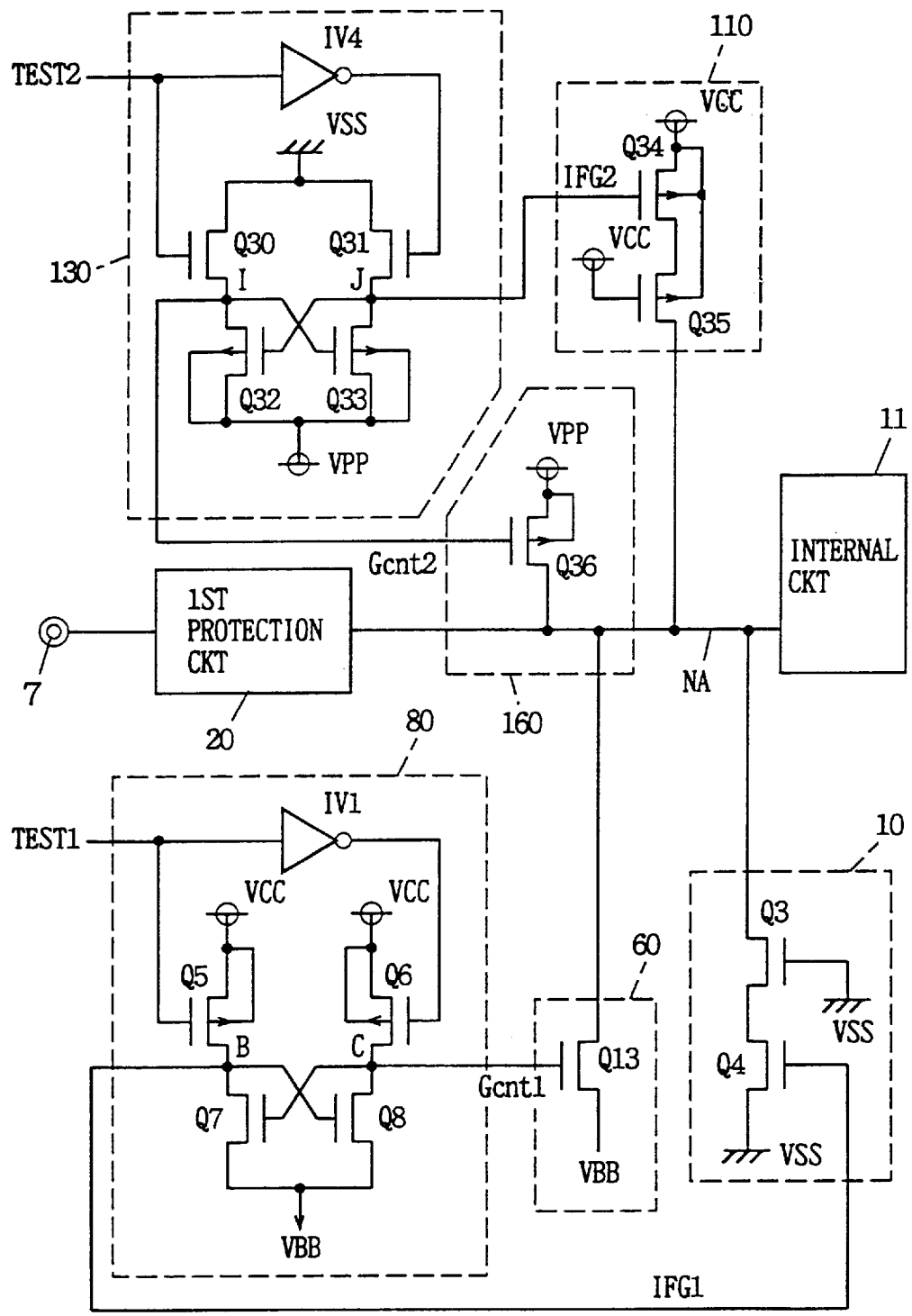
FIG. 23 schematically shows a structure of a main portion of a semiconductor device in accordance with a thirteenth embodiment of the present invention.

FIG. 23 shows a structure of a main portion of a semiconductor device in accordance with a thirteenth embodiment of the present invention. Referring to FIG. 23, the semiconductor device includes a first protection circuit 20 connected between external terminal 7 and internal node NA. The first protection circuit 20 has the same structure as that shown in FIG. 1, and has a function of absorbing a large negative voltage when the large negative voltage is applied to external terminal 7. There is not the second protection circuit for absorbing abnormal high voltage. The reason for this is that in case of electrostatic discharge caused by contact with a human body, for example, what is likely is application of a large negative voltage, and possibility of generation of the abnormally high voltage is very small.

The semiconductor device further includes a control circuit 80 responsive to a first forced monitor mode activating signal TEST1 for generating control signals IFG1 and Gcnt1; a first clamp circuit 10 connected between internal node NA and ground node VSS for selectively clamping the negative potential at internal node NA in accordance with control signal IFG1; and a first internal substrate potential connecting circuit 60 for selectively and electrically connecting internal node NA and a node to which the negative voltage is applied (output portion of the substrate potential generating circuit) in response to the control signal Gcnt1.

The semiconductor device further includes a control circuit 130 responsive to the second forced monitor mode activating signal TEST2 for generating control signals IFG2 and Gcnt2; a second clamp circuit 110 connected between power supply node VCC and internal node NA, of which clamping function selectively activated in accordance with control signal IFG2, for clamping a high potential level at internal node NA at a prescribed potential level; and a second internal potential connecting circuit 160 connected between boosted node VPP and internal node NA, responsive to control signal Gcnt2 for selectively and electrically connecting boosted node VPP and internal node NA with each other.

Control circuit 80 includes an inverter IV1 receiving the first forced monitor mode activating signal TEST1; a p channel MOS transistor Q5 connected between power supply node VCC and node B and receiving at its gate the signal TEST1; a p channel MOS transistor Q6 connected between power supply node VCC and node C and receiving at its gate an output signal from inverter IV1; an n channel MOS transistor Q7 connected between node B and node VBB to which the negative voltage is applied and having its gate connected to node C; and an n channel MOS transistor Q8 connected between node C and node VBB to which the negative voltage is applied and having its gate connected to node B. The structure of control circuit 80 is the same as that shown in FIG. 3. More specifically, when the signal TEST1 is active (high level), control signal Gcnt1 attains to the high level which corresponds to the level of the power supply voltage VCC, and control signal IFG1 attains to the level of the negative voltage VBB. When the signal TEST1 is at an inactive state of low level, signal Gcnt1 attains to the level of the negative voltage VBB, and signal IFG1 attains to the level of the power supply voltage VCC.

The first clamp circuit 10 includes an n channel MOS transistor Q3 having one conduction node connected to internal node NA and a gate electrode node connected to the ground node VSS; and an n channel MOS transistor Q4 connected between MOS transistor Q3 and ground node VSS and receiving at its gate the control signal IFG1. The first internal potential connecting circuit 60 includes an n channel MOS transistor Q13 connected between internal node NA and node VBB to which the negative voltage is applied (or the output portion of the substrate potential generating circuit) and receiving at its gate the control signal Gcnt1. The structure of the first clamp circuit 10 and of the first internal potential connecting circuit 60 are the same as those shown in FIG. 3. In the first internal potential connecting circuit 60, when signal TEST1 is active, MOS transistor Q13 is turned on in response to control signal Gcnt1 which is at the high level, and it electrically connects internal node NA to node VBB to which the negative voltage is applied (output portion of the substrate potential generating circuit). When the signal TEST1 is inactive, signal Gcnt1 attains to the low level which corresponds to the level of the negative voltage VBB, and MOS transistor Q13 turns off. Consequently, internal node NA is electrically disconnected from the node VBB to which the negative voltage is applied (output portion of the substrate potential generating circuit).

In the first clamp circuit 10, when the signal TEST1 is active, MOS transistor Q4 receives at its gate the control signal IFG1 at the level of the negative voltage VBB, cutting off the current path between internal node NA and the ground node VSS. When the signal TEST1 is inactive, signal IFG1 attains to the high level, which corresponds to the level of the power supply voltage VCC, and MOS transistor Q4 turns on, so that MOS transistor Q3 operates in the diode mode.

Control circuit 130 includes an n channel MOS transistor Q30 connected between ground node VSS and node I and receiving at its gate the second forced monitor mode activating signal TEST2; an n channel MOS transistor Q31 connected between ground node VSS and node J and receiving at its gate the signal TEST2 through inverter IV4; a p channel MOS transistor Q32 connected between node I and boosted node VPP and having its gate connected to node J; and a p channel MOS transistor Q33 connected between node J and boosted node VPP and having its gate connected to node I. Control signal IFG2 is output from node J, and control signal Gcnt2 is output from node I. When signal TEST2 is active (high level), node I is set to the level of the ground voltage VSS, and node J is set to the level of the boosted voltage VPP. When the second forced monitor mode is inactive, signal TEST2 attains to the low level, MOS transistor Q30 turns off, MOS transistor Q31 turns on, node I attains to the level of the boosted voltage VPP, and node J attains to the level of the ground voltage VSS.

The second clamp circuit 110 includes a p channel MOS transistor Q35 having one conduction node connected to internal node NA and gate electrode node connected to power supply node VCC; and a p channel MOS transistor Q34 connected between MOS transistor Q35 and power supply node VCC and receiving at its gate the control signal IFG2. The second internal potential connecting circuit 160 includes a p channel MOS transistor Q36 connected between boosted node VPP and internal node NA and receiving at its gate the control signal Gcnt2. The structures of these circuits 110, 130 and 160 are the same as those shown in FIG. 18, and they provide similar functions and effects.

More specifically, when the second forced monitor mode activating signal TEST2 is inactive, signal Gcnt2 attains to the level of the boosted voltage VPP, and control signal IFG2 attains to the level of the ground voltage VSS. Therefore, in this case, voltage node VPP is disconnected from internal node NA, and in the second clamp circuit 110, a current path is formed between MOS transistor Q35 and power supply node VCC, and MOS transistor Q35 function as a clamp element. When the second forced monitor mode activating signal TEST2 is active, signal Gcnt2 is at the level of the ground voltage VSS, and control signal IFG2 is at the level of the boosted voltage VPP. In this case, MOS transistor Q36 turns on, and boosted node VPP is electrically connected to internal node NA. In the second clamp circuit 110, MOS transistor Q34 cuts off a current path between power supply node VCC and internal node NA.

Figure 24:
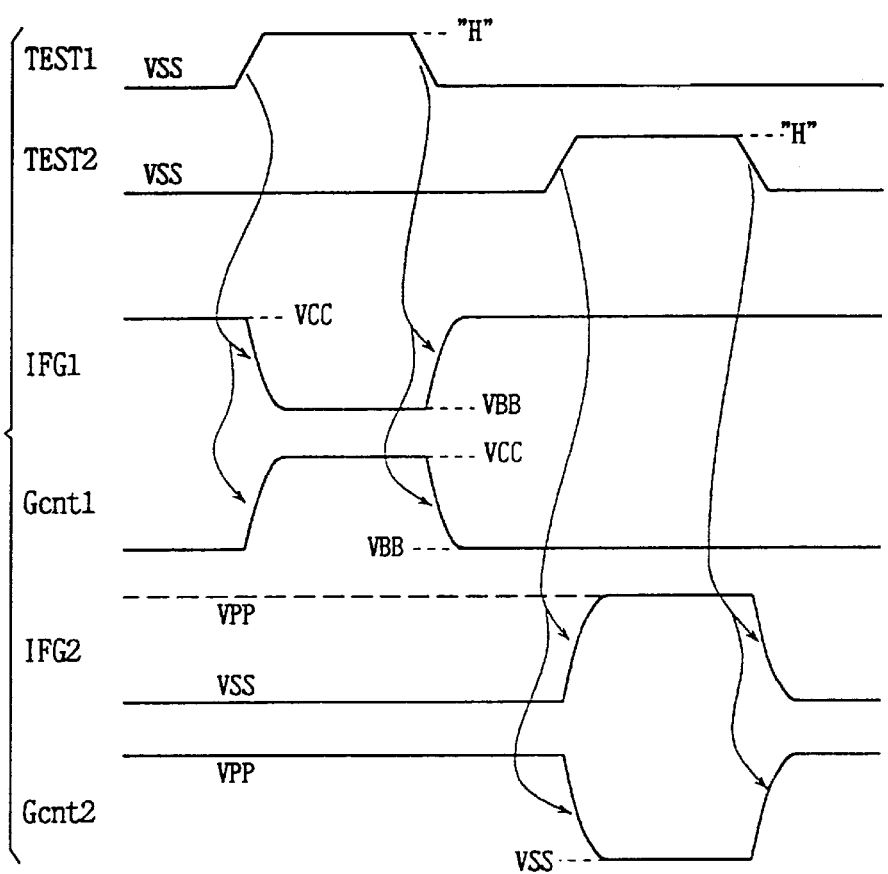
FIG. 24 is a diagram of signal waveforms representing the operation of the semiconductor device shown in FIG. 23.

In the structure of the semiconductor device shown in FIG. 23, only one of the forced monitor mode activating signals TEST1 and TEST2 is rendered active in the test mode operation, as shown by the diagram of waveforms of FIG. 24. These signals are not simultaneously set to the active state of high level. Therefore, by selectively activating forced monitor mode activating signals TEST1 and TEST2, negative voltage VBB and boosted voltage VPP can be externally monitored through external terminal 7. Similarly, it is possible to apply the negative voltage VBB or boosted voltage VPP to a prescribed node through external terminal 7, and to set the voltages VBB and VPP at a desired voltage level.

At the time of pin contact test, forced monitor mode activating signals TEST1 and TEST2 are both set to the inactive state of low level. Therefore, in this state, MOS transistors Q13 and Q36 are both off, while MOS transistors Q3 and Q34 are both on. Therefore, by externally applying a high voltage or a negative voltage to the first and second clamp circuits 10 and 110, pin contact test can be performed.

As described above, according to the thirteenth embodiment of the present invention, a circuit of which clamping function is activated/inactivated selectively is provided for the high voltage portion and negative voltage portion, both the high voltage and the negative voltage can be externally monitored through one pin terminal, and in addition, both the negative voltage and the high voltage can be applied externally to set the voltages at the desired voltage levels. Further, pin contact test is possible by using either the high voltage or the negative voltage.

Fourteenth Embodiment

Figure 25:
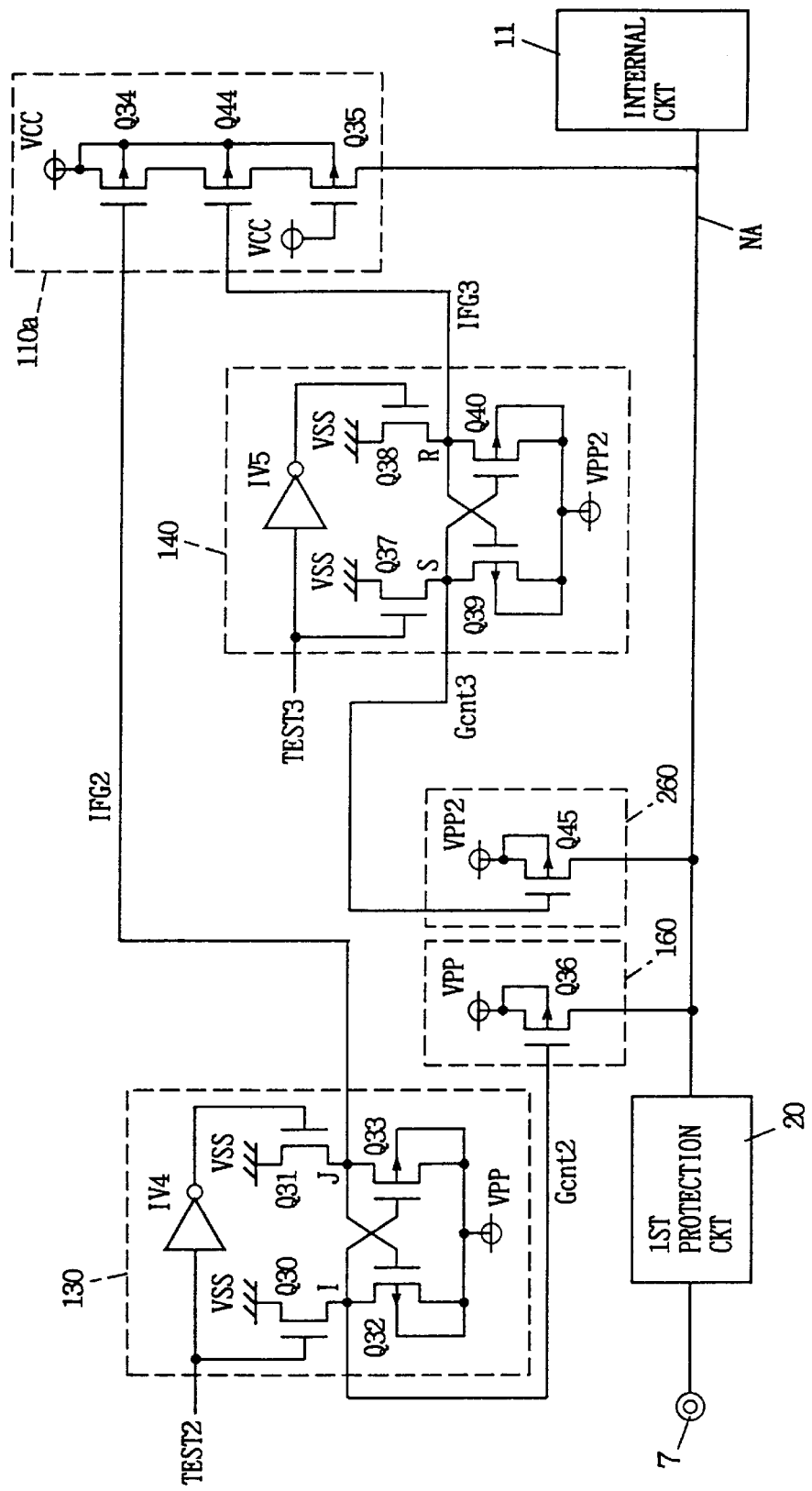
FIG. 25 schematically shows a structure of a main portion of a semiconductor device in accordance with a fourteenth embodiment of the present invention.

FIG. 25 shows a structure of a main portion of a semiconductor device in accordance with the fourteenth embodiment of the present invention. In the structure shown in FIG. 25, two boosted voltages VPP and VPP2 are generated in the semiconductor device. A structure for realizing external monitoring of these two boosted voltages VPP and VPP2 as well as external application is shown.

Referring to FIG. 25, the structure includes a control circuit 130 responsive to forced monitor mode activating signal TEST2 for generating mutually complementary control signals IFG2 and Gcnt2 which change between the levels of boosted voltage VPP and the ground voltage VSS; a second internal potential connecting circuit 160 connected between boosted node VPP and internal node NA, responsive to control signal Gcnt2 for electrically connecting boosted node VPP to internal node NA; a control circuit 140 responsive to a third forced monitor mode activating signal TEST3 for generating mutually complementary control signals IFG3 and Gcnt3 which change between the levels of boosted voltage VPP2 and ground voltage VSS; a third internal potential connecting circuit 260 connected between boosted node VPP2 and internal node NA, responsive to control signal Gcnt3 for selectively and electrically connecting boosted node VPP2 and internal node NA; and a clamp circuit 110a responsive to control signals IFG2 and IFG3 for selectively forming a current path between power supply node VCC and internal node NA.

Control circuit 130 and second internal potential connecting circuit 160 have the same structure as those shown in FIG. 23. Corresponding portions are denoted by the same reference characters and detailed description thereof is not repeated. When the second forced monitor mode activating signal TEST2 is inactivated, control signal IFGs is set to the level of the ground voltage VSS, and control signal Gcnt2 is set to the level of the boosted voltage VPP.

Control circuit 140 includes an n channel MOS transistor Q37 connected between the ground node VSS and a node S and receiving at its gate the signal TEST3; an n channel MOS transistor Q38 connected between a node R and ground node VSS and receiving at its gate the signal TEST3 through inverter IV5; a p channel MOS transistor Q39 connected between node S and boosted node VPP2 and having its gate connected to node R; and a p channel MOS transistor Q40 connected between node R and boosted node VPP and having its gate connected to node S. The structure of control circuit 140 is the same as that of control circuit 130 except that the voltage level applied to the boosted node is different.

Control signal IFG3 is output from node R, and control signal Gcnt3 is output node S.

The third internal potential connecting circuit 260 includes a p channel MOS transistor Q45 connected between boosted node VPP2 and internal node NA and receiving at its gate the control signal Gcnt3.

Clamp circuit 110a includes a p channel MOS transistor Q35 having one conduction node connected to internal node NA and gate electrode node connected to power supply node VCC, and p channel MOS transistors Q34 and Q44 connected in series between MOS transistor Q35 and power supply node VCC. MOS transistor Q34 receives at its gate the control signal IFG2, and MOS transistor Q44 receives at its gate the control signal IFG3. Positions of MOS transistors Q34 and Q44 may be exchanged. Internal node NA is connected to external terminal 7 through first protection circuit 20. To internal node NA, internal circuit 11 is connected, the internal circuit 11 performs a prescribed operation in accordance with a signal potential at internal node NA, generates an internal signal and transmits the generated signal to internal circuitry. The operation of the semiconductor device shown in FIG. 25 will be described with reference to FIG. 26, which is a diagram of signal waveforms.

Signals TEST2 and TEST3 are not simultaneously set to the inactive state. In the test mode, one of these is activated. In the following, for the purpose of simplicity, the operation mode designated when the second forced monitor mode activating signal TEST2 is active will be referred to as VPP mode, and the test mode designated when the third forced monitor mode activating signal TEST3 is activated will be referred to as VPP2 mode.

When VPP mode and VPP2 mode are both inactive, signals TEST2 and TEST3 are both at the low level. In this state, in control circuit 30, MOS transistor Q30 turns off, MOS transistor Q31 turns on, control signal IFG2 attains to the level of the ground voltage VSS, and control signal Gcnt2 attains to the level of the boosted voltage VPP. Similarly, in control circuit 140, as shown in FIG. 26, MOS transistor Q37 turns off, MOS transistor Q38 turns on, control signal IFG3 attains to the level of the ground voltage VSS, and control signal Gcnt3 attains to the level of the boosted voltage VPP2.

Therefore, in clamp circuit 110a, MOS transistors Q34 and Q44 both turn onto transmit the power supply voltage VCC to the other conduction node of MOS transistor Q35. Consequently, MOS transistor Q35 operates in the diode mode, and it is rendered conductive when the potential at internal node NA exceeds VCC+V35 to cause a current to flow from internal node NA to power supply node VCC, so as to lower the potential at internal node NA. Here, V35 represents the absolute value of the threshold voltage of MOS transistor Q35. Therefore, in this state, clamp circuit 110a functions as a common clamping element.

In internal potential connecting circuit 160, MOS transistor Q36 receives at its gate the control signal Gcnt2 at the level of the boosted voltage VPP, and MOS transistor Q36 is kept off until the potential at internal node NA exceeds the boosted voltage VPP. Similarly, in internal potential connecting circuit 260, MOS transistor Q45 receives at its gate the control signal Gcnt3 at the voltage level of boosted voltage VPP2, and MOS transistor Q45 is kept off unless the potential at internal node NA becomes higher than the voltage level of boosted voltage VPP2. Precisely stating, MOS transistor Q36 is rendered conductive when the voltage at internal node NA reaches VPP+V36 or higher, and MOS transistor Q45 is rendered conductive when the potential at internal node NA attains to the voltage level of VPP2+V45 or higher. Here, V36 and V45 represent absolute values of threshold voltages of MOS transistors Q36 and Q45. Therefore, boosted nodes VPP and VPP2 are electrically disconnected from internal node NA. Thus, by applying a high voltage VP (voltage level between boosted voltage VPP and VPP2 and power supply voltage VCC+V35) through external terminal 7, a current path is formed from internal node NA to power supply node VCC through clamp circuit 110a, and by monitoring the current externally, pin contact test is possible.

Figure 26:
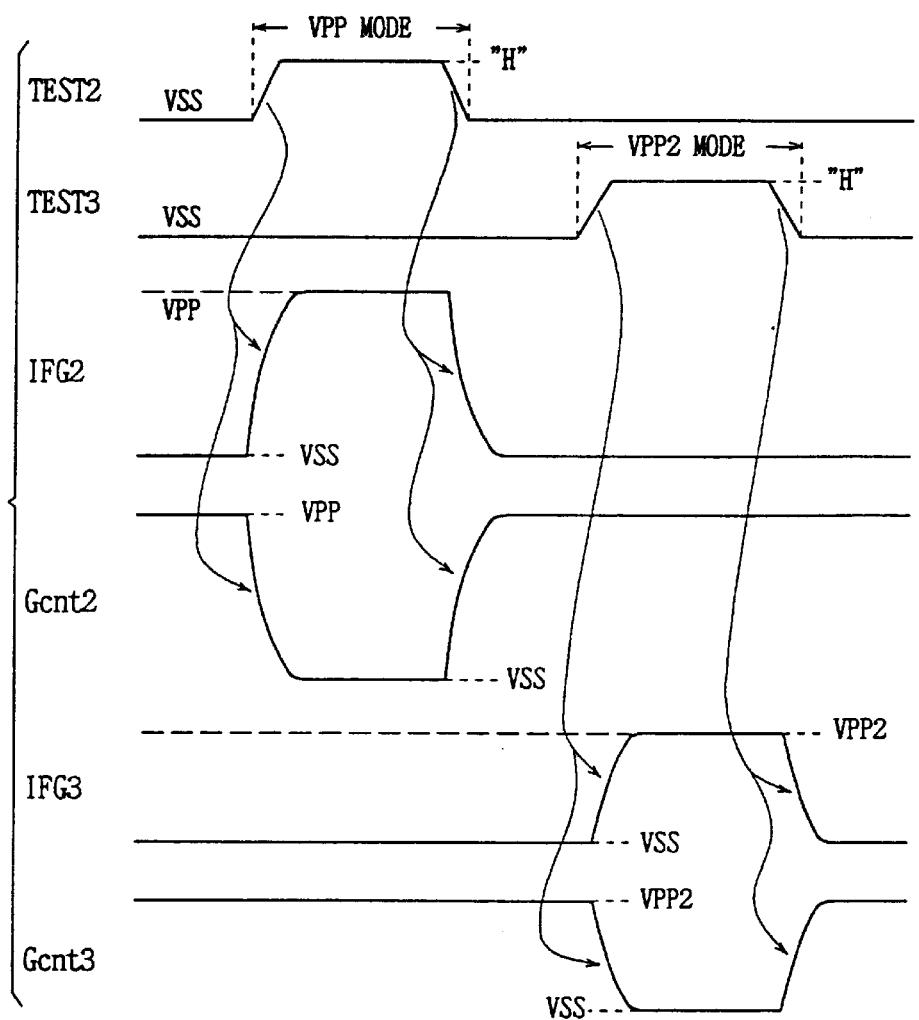
FIG. 26 is a diagram of signal waveforms representing the operation of the semiconductor device shown in FIG. 25.

Then, in the VPP mode, as shown in FIG. 26, signal TEST2 is set to the high level, while signal TEST3 is kept at the level of the ground voltage VSS. In this state, in control circuit 130, MOS transistor Q30 is turned on, MOS transistor Q31 is turned off, control signal IFG2 is set to the level of the boosted voltage VPP and control signal Gcnt2 is set to the level of the ground voltage VSS. In the second internal potential connecting circuit 160, MOS transistor Q36 is rendered conductive, receiving at its gate the control signal Gcnt2 at the level of the ground voltage VSS, electrically connecting boosted node VPP to internal node NA. Meanwhile, in the third internal potential connecting circuit 260, MOS transistor Q45 receives at its gate the control signal Gcnt3 which is at the voltage level of boosted voltage VPP2, and is kept off. Therefore, only the boosted node VPP is electrically connected to internal node NA, and boosted node VPP2 is electrically disconnected from internal node NA.

In clamp circuit 110a, MOS transistor Q34 is receiving control signal IFG2 at the level of the boosted voltage VPP. Meanwhile, MOS transistor Q44 is receiving the control signal IFG3 at the level of the ground voltage VSS at its gate. Therefore, MOS transistor Q34 is kept off unless the potential at internal node NA increases and a voltage higher than the boosted voltage VPP is applied through MOS transistor Q35 to MOS transistor Q34. Therefore, the voltage level of the boosted node VPP can be monitored through external terminal 7. In this state, since there is not a current path formed in clamp circuit 110a, the voltage level of boosted voltage VPP can be precisely monitored externally. When the voltage level of boosted voltage VPP is to be changed from external terminal 7, the voltage level of control signal IFG2 also changes. Therefore, similarly, in clamp circuit 110a, current path is cut off, and the voltage level of the boosted node VPP can be precisely set to the desired voltage level.

When VPP2 mode is active, the signal TEST2 is set to the low level which corresponds to the level of the ground voltage and signal TEST3 is set to the high level. In this state, control signal IFG2 output from control circuit 130 is set to the level of the ground voltage VSS, and control signal Gcnt2 is set to the level of the boosted voltage VPP. Therefore, in the clamp circuit 110a, MOS transistor Q34 turns on to transmit the power supply voltage VCC to one conduction node (drain) of MOS transistor Q44. Meanwhile, in the connecting circuit 160, MOS transistor Q36 is turned off (unless the potential at internal node NA becomes higher than boosted voltage VPP+V36). Therefore, boosted node VPP can be isolated from internal node NA.

Meanwhile, control signal IFG3 from control circuit 140 attains to the voltage level of the boosted voltage VPP2, as MOS transistor Q37 is turned on and MOS transistor Q38 is turned off. Meanwhile, control signal Gcnt3 attains to the level of the ground voltage VSS. In this state, in clamp circuit 110a, MOS transistor Q44 is kept off unless a voltage higher than the boosted voltage VPP2 is transmitted through MOS transistor Q35. Therefore, even when the voltage level of the boosted voltage VPP2 is transmitted to internal node NA, current path between power supply node VCC and internal node NA is cut off in clamp circuit 110a, and therefore external application and external monitoring of boosted voltage VPP2 become possible.

In the connection control circuit 260, the gate of MOS transistor Q45 is at the level of the ground voltage VSS, MOS transistor Q45 is turned on, and it connects the boosted node VPP2 to internal node NA. Consequently, it becomes possible to externally monitor the voltage level of boosted node VPP2 through external terminal 7. Also it becomes possible to change the voltage level of boosted node VPP2 by applying a high level of a prescribed level from external terminal 7. In this case, the voltage level of boosted voltage VPP2 changes in accordance with the applied high voltage, the voltage level of control signal IFG3 also changes in response, so that MOS transistor Q44 can be surely turned off. Thus, a desired high voltage can be accurately applied to boosted node VPP2.

Therefore, according to the structure shown in FIG. 25, external monitoring and external application of a plurality of voltage levels are possible through one external terminal. Dependent on the voltage levels of boosted voltages VPP and VPP2, it may be possible that a connecting circuit which should be turned off is rendered conductive. For example, upon transition to VPP mode, if boosted voltage VPP is sufficiently higher than boosted voltage VPP2, MOS transistor Q45 turns on as it receives at its gate the boosted voltage VPP2, causing current to flow from internal node NA to boosted node VPP2. In order to surely prevent such situation, if the boosted voltage VPP is higher than the boosted voltage VPP2, a p channel MOS transistor receiving at its gate the control signal IFG2 is connected between MOS transistor Q45 and internal node NA. Consequently, in the VPP mode, signal IFG2 attains to the level of the boosted voltage VPP, the additional MOS transistor turns off, and current path between boosted node VPP2 and internal node NA is surely cut off. Therefore, unnecessary change of the boosted voltage VPP2 can be prevented. In the VPP2 mode, control signal Gcnt3 attains to the level of the ground voltage, and hence boosted node VPP2 is electrically connected to internal node NA without any difficulty.

In addition, if the voltages VPP and VPP2 both are desired to be externally forced to a certain voltage regardless of the potential difference between the voltages VPP and VPP2, a p channel MOS transistor having a gate receiving the control signal IFG3 may connected in series between the transistor Q36 and the node NA. In the VPP mode, the control signal IFG3 is at L level, and such additional transistor is turned on. Thus, the boosted voltage VPP can externally be set to a desired voltage independently of the voltage level of the boosted voltage VPP2, similarly to the above developed description.

If the condition of VPP≧VPP2 holds in a normal mode of operation, setting the source potential of p channel MOS transistors Q39 and Q40 to the boosted voltage VPP allows accurate monitoring of the boosted voltage VPP because of complete turn off of the transistor Q45 and externally forced setting of the boosted voltage VPP to an intended voltage under the condition of VPP>VPP2−V45, where V45 denotes an absolute value of the threshold voltage of MOS transistor Q45. The use of VPP for the control circuit 140 in place of VPP2 also allows accurate monitoring of VPP2 because of turning on of the transistor Q45 and external forcing of VPP2 to an intended voltage under the same condition of VPP2<VPP+V45 inhibiting the turning-on of the transistor Q36.

Further, if an additional p channel MOS transistor having a gate receiving the control signal Gcnt2 is connected in series between the MOS transistor Q36 and the internal node NA, and another additional p channel transistor having a gate receiving the control signal Gcnt3, accurate external monitoring and external forced setting of the boosted voltages VPP and VPP2 can be implemented, provided that the condition of VPP2+2·V45>VPP and VPP+2·V36>VPP2 are satisfied, where additional MOS transistor have the same threshold voltage as MOS transistor Q36 and the other additional MOS transistor has the same threshold voltage as MOS transistor Q45.

As described above, according to the fourteenth embodiment of the present invention, in the clamp circuit, p channel MOS transistors receiving at their gates control signals corresponding to different boosted voltages are connected in series. Therefore, when there is a plurality of boosted voltage levels, current path between the power supply node and the internal node in the clamp circuit 110a can be surely kept in the external application mode or external monitor mode, and hence the voltage level of the plurality of boosted voltages can be surely monitored externally, and different voltage levels can be surely set externally.

Further, where the voltage levels of boosted voltages VPP and VPP2 are the same and portions to which the voltages are applied differ from each other (for example, when boosted voltage generating circuits are provided corresponding to a plurality of memory arrays (blocks) in a semiconductor memory device), it is possible to externally monitor and externally apply the boosted voltage to each portion independently from each other. This facilitates defect analysis.

Fifteenth Embodiment

Figure 27:
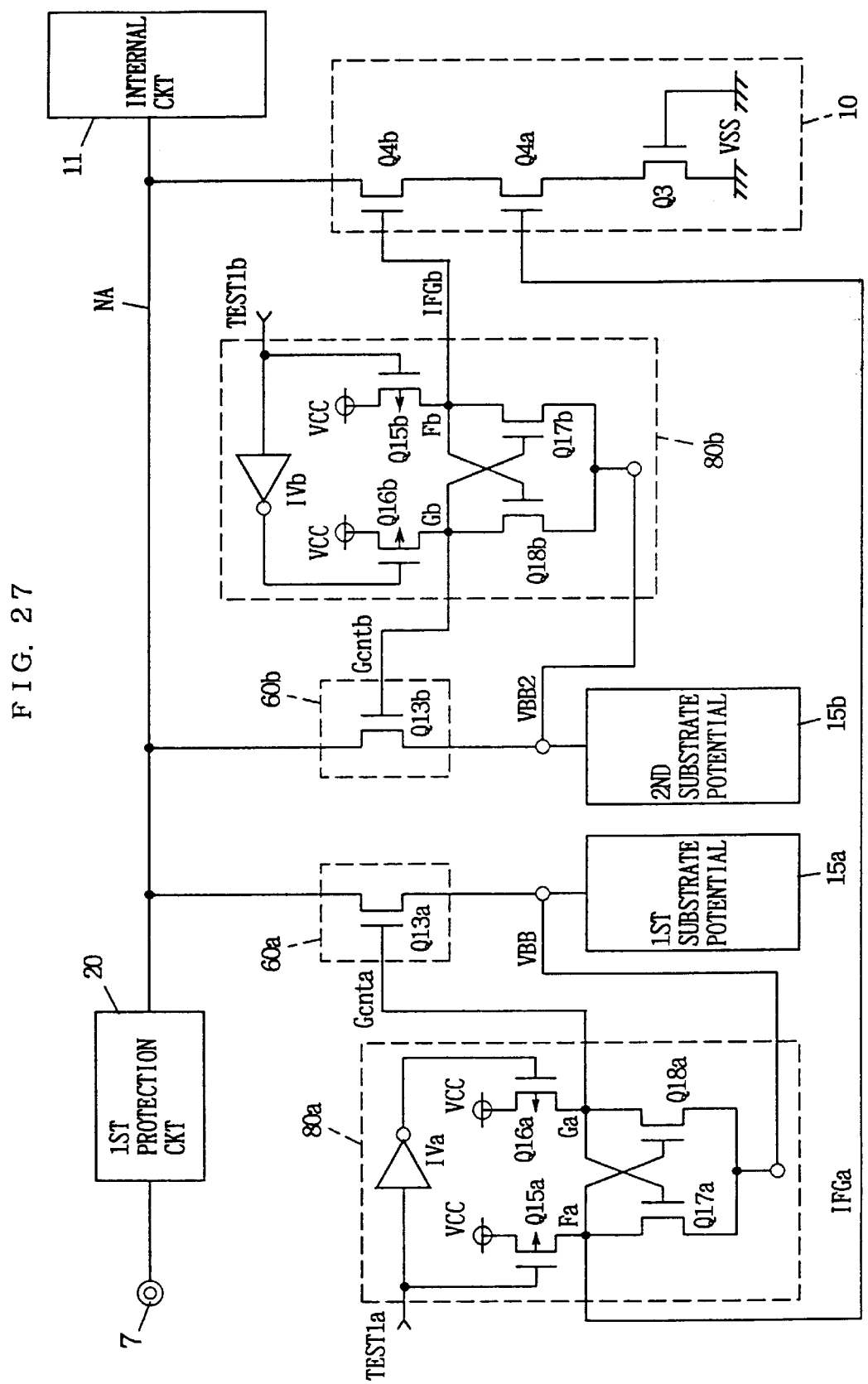
FIG. 27 schematically shows a structure of a main portion of a semiconductor device in accordance with a fifteenth embodiment of the present invention.

FIG. 27 shows a structure of a main portion of the semiconductor device in accordance with the fifteenth embodiment of the present invention. Referring to FIG. 27, the semiconductor device includes a first substrate potential generating circuit 15a generating the substrate potential VBB, and a second substrate potential generating circuit 15b generating the substrate potential VBB2. The substrate potentials VBB and VBB2 are both negative voltages. These potentials may have different voltage levels, or these may be substrate potentials of the same voltage level applied to respective memory arrays (blocks) of the semiconductor memory device.

The semiconductor device further includes a control circuit 80a responsive to the forced monitor mode activating signal TEST1a for generating mutually complementary control signals IFGa and Gcnta changing between the power supply voltage VCC and a negative voltage (substrate potential) VBB; a control circuit 80b responsive to the forced monitor mode activating signal TEST1b for outputting mutually complementary control signals IFGb and Gcntb changing between the power supply voltage VCC and a negative voltage (substrate potential) VBB2; a connecting circuit 60a responsive to the control signal Gcnta from control circuit 80a for connecting the output portion of the first substrate potential generating circuit 15a to internal node NA; and a substrate potential connecting circuit 60b responsive to the control signal Gcntb from control circuit 80b for connecting the output portion of the second substrate potential generating circuit 15b to internal node NA. For simplicity of description, the operation mode designated when the signal TEST1a is active will be referred to as VBB mode and operation mode designated when the signal TEST1b is active will be referred to as VBB2 mode.

The semiconductor device further includes a clamp circuit 10 connected between internal node NA and ground node VSS, responsive to control signals IFGa and IFGb from control circuits 80a and 80b for clamping the negative potential at internal node NA at a prescribed potential level.

Control circuit 80a includes an inverter IVa receiving signal TEST1a; a p channel MOS transistor Q15a connected between power supply node VCC and a node Fa, and receiving at its gate the signal TEST1a; a p channel MOS transistor Q15b connected between power supply node VCC and node Ga and receiving at its gate an output signal from inverter IVa; an n channel MOS transistor Q17a connected between node Fa and the node VBB to which the negative voltage is applied (output portion of the first substrate potential generating circuit 15a) and having its gate connected to node Ga; and an n channel MOS transistor Q18a connected between node Ga and a node VBB to which the negative potential is applied and having its gate connected to node Fa.

Connecting circuit 60a includes an n channel MOS transistor Q13a connected between the output node of the first substrate potential generating circuit 15a and internal node NA and receiving at its gate the control signal Gcnta. Control circuit 80b includes a p channel MOS transistor Q15b connected between power supply node VCC and a node Fb and receiving at its gate the signal TEST1b; a p channel MOS transistor Q16b connected between power supply node VCC and a node Gb and receiving at its gate the signal TEST1b through inverter IVb; an n channel MOS transistor Q17b connected between node Fb and the node VBB2 to which the negative voltage is applied (output portion of the second substrate potential generating circuit) and having its gate connected to node Gb; and an n channel MOS transistor Q18b connected between node Gb and node VBB2 to which the negative voltage is applied and having its gate connected to node Fb.

Connecting circuit 60b includes an n channel MOS transistor Q13b connected between internal node NA and node VBB2 to which the negative voltage is applied (output portion of the second potential generating circuit 15b) and receiving at its gate the control signal Gcntb.

Figure 28:
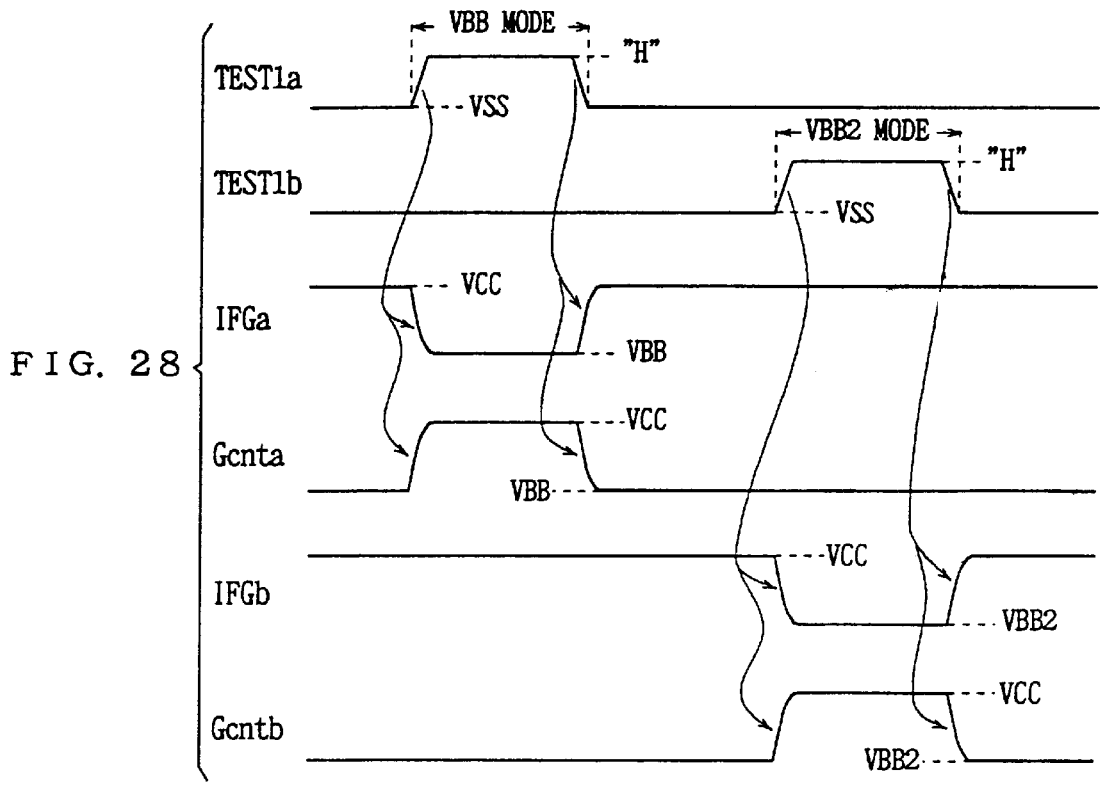
FIG. 28 is a diagram of signal waveforms representing the operation of the semiconductor device shown in FIG. 27.

Ground circuit 10 includes an n channel MOS transistor Q3 having one conduction node and a gate connected to ground node VSS and n channel MOS transistors Q4a and Q4b connected in series between internal node NA and MOS transistor Q3. MOS transistor Q4a receives control signal IFGa at its gate, and MOS transistor Q4b receives control signal IFGb at its gate. In clamp circuit 10, the order of arrangement of MOS transistors Q3, Q4a and Q4b is arbitrary, provided that these are connected in series between internal node NA and ground VSS. The operation of the semiconductor device shown in FIG. 27 will be described with reference to FIG. 28, which is a diagram of signal wave forms.

When the VBB mode and VBB2 mode are both inactive, the signals TEST1a and TEST1b are both at the low level which corresponds to the level of the ground voltage VSS. In this state, in control circuit 80a, MOS transistor Q15a is on, MOS transistor Q16a is off, control signal IFGa is at the high level corresponding to the level of the power supply voltage VCC, and control signal Gcnta is at a low level which corresponds to the level of the negative voltage VBB. Similarly, in control circuit 80b, control signal IFGb at the high level corresponding to the level of the power supply voltage VCC, and control signal Gcntb is at the low level which corresponds to the level of the negative voltage VBB2. Therefore, in control circuits 60a and 60b, MOS transistors Q13a and Q13b are both off, and output portions of substrate potential generating circuits 15a and 15b are both electrically disconnected from internal node NA.

In clamp circuit 10, MOS transistors Q4a and Q4b both turn onto connect internal node NA electrically to the other conduction node (drain) of MOS transistor Q3, and MOS transistor Q3 operates in the diode mode. Therefore, in this state, clamp circuit 10 operates using MOS transistor Q3 as a clamp element. Therefore, by applying a negative voltage (which is shallower (having a smaller absolute value) than negative voltages VBB and VBB2) from external terminal 7, a current flows between internal node NA and ground node VSS through the circuit 10, and by monitoring the current externally, whether or not the external terminal 7 is surely electrically connected to internal node NA can be determined.

In the forced monitor mode, only one of the VBB mode and a VBB2 mode is activated, and the other is kept inactive. When the VBB mode is to be performed, the signal TEST1a attains to the high level, while the signal TEST1b is kept at the low level which is at the level of the ground voltage VSS. In this state, in control circuit 80a, MOS transistor Q15a is turned off, MOS transistor Q16a is turned on, control signal Gcnta attains to the high level corresponding to the level of the power supply voltage VCC, and control signal IFGa is set to the low level which corresponds to the level of the negative voltage VBB. Control signal IFGb is kept at the level of the power supply voltage VCC, and control signal Gcntb is kept at the voltage level of the negative voltage VBB2. In this state, in control circuit 60a, MOS transistor Q13a turns on, and the output portion of the first substrate potential generating circuit 15a is electrically connected to internal node NA. In clamp circuit 10, MOS transistor Q4b is on, and it connects internal node NA electrically to a conduction node of MOS transistor Q4a. MOS transistor Q4a is kept off unless the potential at internal node NA becomes lower than the negative voltage VBB (MOS transistor Q4a turns on when the potential at internal node NA becomes lower than the negative voltage VBB further by the threshold voltage of MOS transistor Q4a).

In connecting circuit 60b, MOS transistor Q13b, which is receiving at its gate the negative voltage VBB2, is kept off, and the output portion of the second substrate potential generating circuit 15b is electrically disconnected from internal node NA. Therefore, in this state, the negative voltage VBB generated by the first substrate potential generating circuit 15a is transmitted to internal node NA, and therefore the voltage level of the negative voltage VBB can be monitored through external terminal 7. Conversely, it is possible to set the voltage level of the negative voltage VBB generated by the first substrate potential generating circuit 15a at a desired voltage level by applying a negative voltage from external terminal 7. In this state, since control signal IFGa changes in response to the negative voltage level applied externally, in clamp circuit 10, MOS transistor Q4a is kept off, and current path between internal node NA and ground node VSS is surely cut off. By the series of operations, in the VBB mode, both external monitoring of negative voltage VBB and external setting of the voltage level of the negative voltage VBB can be performed.

When the VBB2 mode is active, the signal TEST1a is set to the low level, which corresponds to the level of the ground voltage VSS, and signal TEST1b is set to the high level. In this state, in control circuit 80a, MOS transistor Q15a is turned on and MOS transistor Q16a is turned off. Therefore, the control signal Gcnta is set to the low level which corresponds to the level of the negative voltage VBB, and control signal IFGa is set to the high level which corresponds to the power supply voltage VCC. Consequently, in connecting circuit 60a, MOS transistor Q13a is turned off, and the output portion of the first substrate potential generating circuit 15a is electrically disconnected from internal node NA. Meanwhile, in control circuit 80b, MOS transistor Q15b is turned off, and MOS transistor Q16b is turned on. Therefore, control signal Gcntb is set to the high level which corresponds to the level of the power supply voltage VCC, and control signal IFGb is set to the low level, which corresponds to the level of the negative voltage VBB2. In connecting circuit 60b, MOS transistor Q13b turns on, electrically connecting the output portion of the second substrate potential generating circuit 15b to internal node NA. In clamp circuit 10, MOS transistor Q4b is receiving at its gate the control signal IFGb which is at the level of the negative voltage VBB2, and it is kept off unless the potential at internal node NA becomes lower than the negative voltage VBB2. Therefore, in this state, it is possible to externally output the negative voltage VBB2 which has been transmitted to internal node NA from the second substrate potential generating circuit 15b, and hence it is possible to monitor the voltage level of the negative voltage VBB2 externally. Conversely, it is possible to apply a negative voltage of a prescribed voltage level from external terminal 7 and to set the voltage level of the negative voltage VBB2 at a desired voltage level. When the voltage level of the negative voltage VBB2 changes, the voltage level of control signal IFGb also changes in response, and hence MOS transistor Q4b is surely kept off, cutting the current path between internal node NA and ground node VSS. By this operation, in VBB2 mode, external monitoring and external application with respect to the negative voltage VBB2 can be performed.

[Modification]

Figure 29:
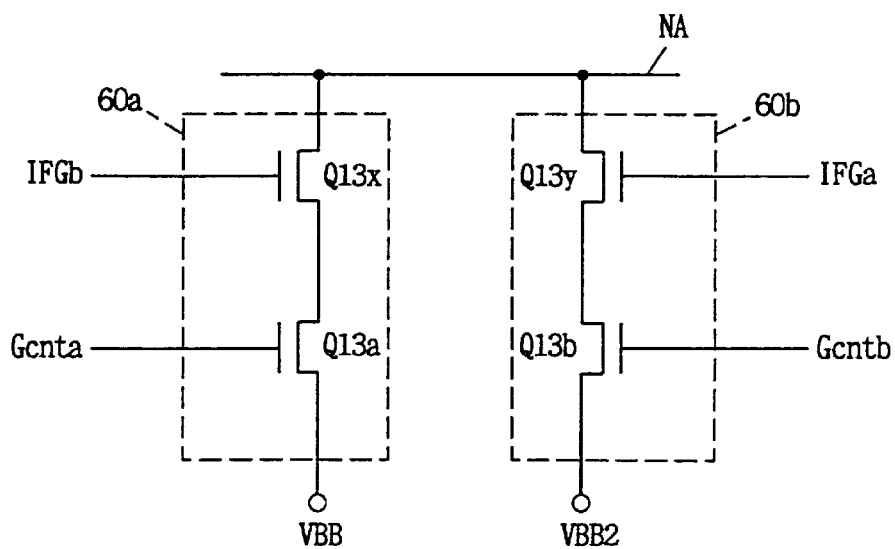
FIG. 29 schematically shows a structure of a modification of the fifteenth embodiment of the present invention.

FIG. 29 shows a structure of a modification of the fifteenth embodiment of the present invention. FIG. 29 shows a structure of the portions of internal potential connecting circuits 60a and 60b shown in FIG. 27. Other portions have the same structure as shown in FIG. 27. Referring to FIG. 29, connecting circuit 60a includes, between MOS transistor Q13a and internal node NA, an n channel MOS transistor Q13x connected in series with MOS transistor Q13a. MOS transistor Q13x receives at its gate the control signal IFGb. MOS transistor Q13a is the same as transistor Q13a shown in FIG. 27, and it receives at its gate the control signal Gcntb.

Connecting circuit 60b includes an n channel MOS transistor Q13y connected in series with MOS transistor Q13b, between MOS transistor Q13b and internal node NA. The operation will be described in the following.

When VBB mode is active, control signal IFGb is at the level of the power supply potential VCC, and MOS transistor Q13x is on, electrically connecting MOS transistor Q13a to internal node NA. Meanwhile, control signal IFGa is at the level of the negative voltage VBB, and MOS transistor Q13y is kept off unless the potential at internal node NA becomes lower than the negative voltage VBB. Control signal Gcnta is at the level of the power supply potential VCC, and to internal node NA, the negative voltage VBB is applied through MOS transistors Q13x and Q13y. At this time, even if the negative voltage VBB is at a voltage level lower than negative voltage VBB2, MOS transistor Q13y is kept off, and hence the negative voltage VBB is not transmitted to MOS transistor Q13b. Therefore, in connecting circuit 60b, even if the negative voltage VBB is at a voltage level lower than the negative voltage VBB2, application of the negative voltage VBB to the node VBB2 can be prevented, and hence internal node NA and node VBB2 to which the negative voltage applied can be surely electrically disconnected. Therefore, external monitoring and external setting of negative voltage VBB only become possible.

On the other hand, in VBB2 mode, control signal IFGb attains to the voltage level of the negative voltage VBB2, and control signal Gcnta at the level of the negative voltage VBB. Meanwhile, control signal IFGa is at the level of the power supply voltage VCC, and control signal Gcntb is at the level of the power supply voltage VCC. Therefore, the negative voltage VBB2 at the node to which the negative voltage is applied (output portion of the second substrate potential generating circuit) is transmitted through the connecting circuit 60b to internal node NA. If the negative voltage VBB2 which has been transmitted to internal node NA is higher than the negative voltage VBB, and if a leak current is transmitted from the negative voltage VBB2 through MOS transistor Q13x to MOS transistor Q13a, MOS transistor Q13a is kept off as its source potential and gate potential are both at the level of the negative voltage VBB, so that transmission of the negative voltage VBB2 to the node VBB can be prevented. Meanwhile, if the voltage level of the negative voltage VBB2 is lower than the negative voltage VBB, the gate potential and the source potential of MOS transistor Q13x become equal to each other and the transistor Q13x is turned off. Therefore, transmission of the negative voltage VBB2 to the node VBB is prevented. Therefore, in either state, current path between internal node NA and node VBB is cut off, and hence the voltage level at internal node NA can be accurately set to the level of the negative voltage VBB2. Therefore, external monitoring and external setting of the negative voltage VBB2 can be accurately performed.

If the relation between the negative voltages VBB and VBB2 is fixed in each of the operation modes, for example, if VBB<VBB2, additional MOS transistor (Q13y) for cutting off current path has to be provided only in the connecting circuit (circuit 60b) transmitting the negative voltage which is higher. In that example case, in the connecting circuit (60a) transmitting the negative voltage which is lower, it is not necessary to provide an additional MOS transistor (Q13x).

As described above, according to the fifteenth embodiment of the present invention, MOS transistors receiving mutually different control signals are connected in series between the internal node and the ground node of the clamp circuit. Therefore, external monitoring and external setting of a plurality of negative voltages become possible, and pin contact test can also be performed.

Sixteenth Embodiment

Figure 30:
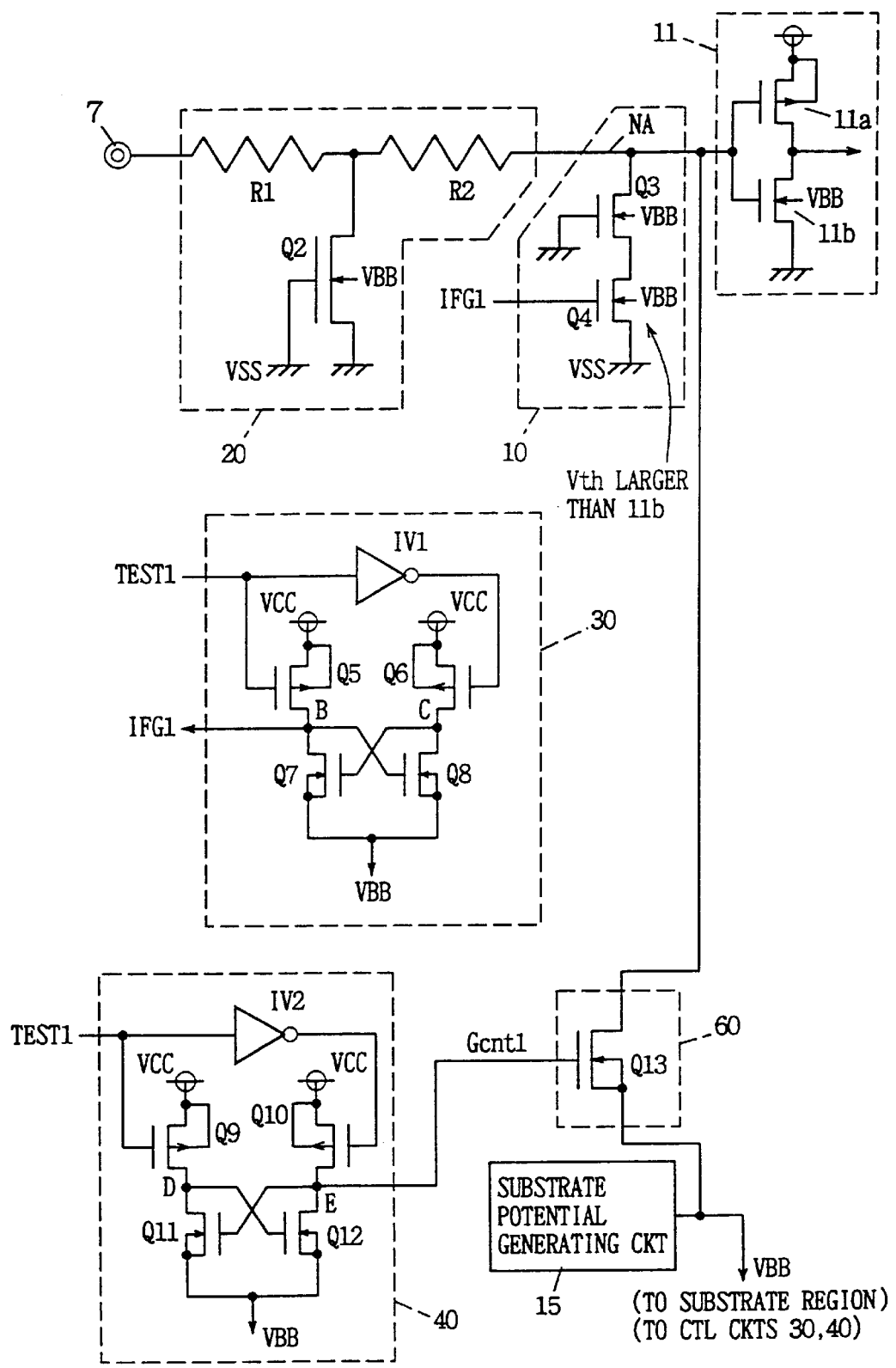
FIG. 30 schematically shows a structure of a main portion of a semiconductor device in accordance with a sixteenth embodiment of the present invention.

FIG. 30 shows a structure of a main portion of the semiconductor device in accordance with the sixteenth embodiment of the present invention. The structure of the semiconductor device shown in FIG. 30 is substantially the same as the structure of the semiconductor device shown in FIG. 1. In the structure shown in FIG. 30, n channel MOS transistors Q2 to Q4, Q7, QB, Q11 to Q13 are connected such that respective substrate regions receive the negative voltage VBB. In internal circuit 11, n channel MOS transistor 11b has a substrate region connected to receive the negative voltage VBB. Control circuits 30 and 40 as well as n channel MOS transistors Q7, QB, Q11 to Q13 included in connecting circuit 60 have respective substrate regions connected to the source regions. Therefore, these MOS transistors do not have the back gate effect, and the threshold voltage thereof does not fluctuate. Meanwhile, n channel MOS transistor 11b of internal circuit 11 receives at its substrate region the negative voltage VBB. In other words, it is influenced by the back gate effect, and hence its threshold voltage becomes higher. Therefore, in the internal circuit 11, leak current through MOS transistor 11b is sufficiently suppressed. In order to generate a leak current comparable to the leak current through MOS transistor 11b in internal circuit 11, the threshold voltages of n channel MOS transistors Q7, Q8, Q11 and Q12 included in control circuits 30 and 40 and of MOS transistor Q13 of connecting circuit 60 are made larger than that of MOS transistor 11b. Therefore, even if the gate potential of these MOS transistors attain to the negative voltage VBB, leak current can be surely suppressed.

Meanwhile, in clamp circuit 10, if the potential at internal node NA is set to the level of the negative voltage VBB, back gate effect on the MOS transistor Q3 is reduced, and hence it tends to have a lower threshold voltage. In this case, MOS transistor Q3 suppresses or clamps the negative potential at internal node NA, and hence even if the threshold voltage thereof becomes smaller, there is no problem. As for the MOS transistor Q4, when the forced monitor mode is activated, control signal IFG1 is set to the level of the negative voltage VBB. When the forced monitor mode is activated, the current path between internal node NA and ground node VSS must be surely cut off. In the forced monitor mode, if the potential at internal node NA lowers and the source potential of MOS transistor Q4 becomes close to the negative voltage VBB, MOS transistor Q4 comes to have smaller back gate effect, and its threshold voltage becomes smaller. This may possibly cause larger leak current through MOS transistor Q4. In order to suppress such leak current, the threshold voltage Vth of MOS transistor Q4 is set higher than the threshold voltage of MOS transistor 11b. This compensates for the reduction in back gate effect to surely prevent leak current, and to stabilize the potential at internal node NA at a prescribed potential level stably and at high speed in the forced monitor mode.

The MOS transistor Q4 shown in FIG. 30 has, when directly connected to internal node NA, completely the same potential at its source and at the substrate region. Therefore, the effect obtained by setting the threshold voltage higher becomes more conspicuous and the leak current can more surely be suppressed.

As for the method of setting higher the threshold voltage of n channel MOS transistor, it can be set easily by increasing p type impurity concentration at the channel region or by lowering the n type impurity concentration. Alternatively, it can be set by making longer the channel length (gate length) of MOS transistor Q4.

As described above, according to the sixteenth embodiment of the present invention, in the clamp circuit, the threshold voltage of the MOS transistor receiving the negative voltage at its gate is set higher than that of the MOS transistors in the internal circuit. Therefore, when the forced monitor mode is active, generation of a leak current can be suppressed, and current path between internal node and a ground node can be surely cut off.

Seventeenth Embodiment

Figure 31:
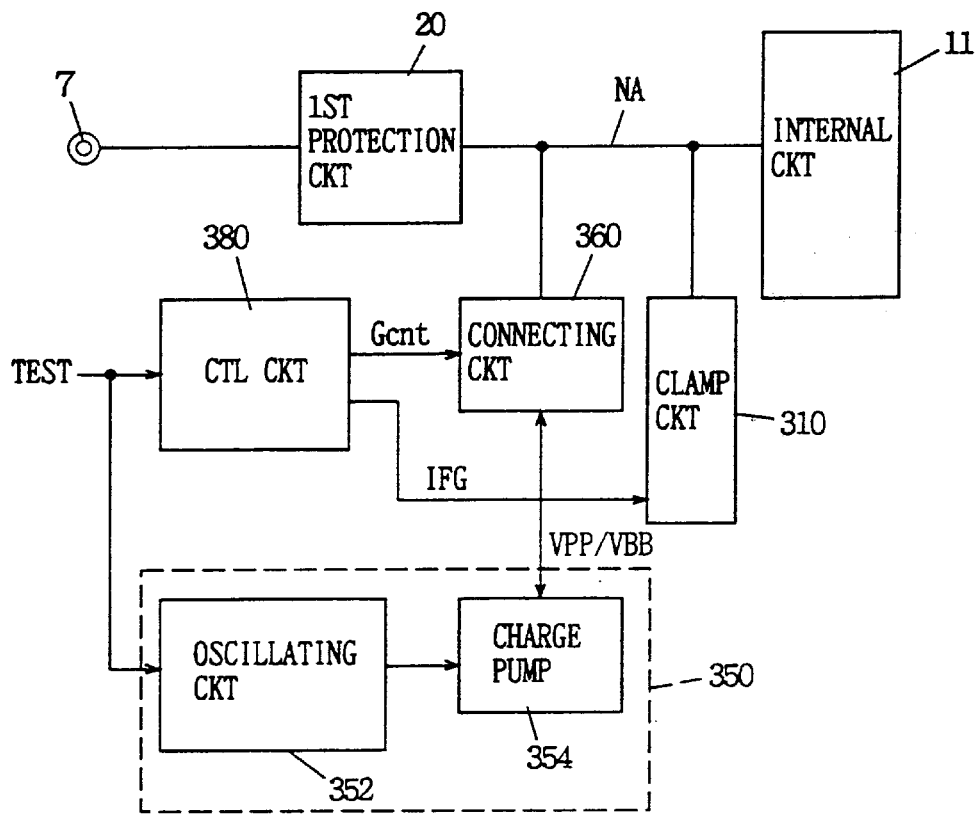
FIG. 31 is a block diagram schematically showing a structure of a main portion of a semiconductor device in accordance with a seventeenth embodiment of the present invention.

FIG. 31 is a block diagram schematically showing a structure of a main portion of the semiconductor device in accordance with the seventeenth embodiment of the present invention. Referring to FIG. 31, the semiconductor device includes a first protection circuit 20 connected between external terminal 7 and internal node NA; internal circuit 11 performing a prescribed process on a signal at internal node NA and transmitting the processed signal to a further internal circuit; control circuit 380 responsive to forced monitor mode activating signal TEST for outputting controlled signals Gcnt and IFG; a clamp circuit 310 connected to internal node NA, of which clamping function is activated/ inactivated in response to control signal IFG from a control circuit 380; an internal voltage generating circuit 350 for generating a prescribed internal voltage VPP/VBB; and a connecting circuit 360 responsive to control signal Gcnt from control circuit 380 for electrically connecting a node at the output portion of internal voltage generating circuit 350 to internal node NA.

The first protection circuit 20 and internal circuit 11 have the same structures as those described with reference to the first to sixteenth embodiments above.

In the semiconductor device shown in FIG. 31, clamp circuit 310 may clamp the voltage at internal node NA either to a high vantage or a negative voltage. Therefore, in FIG. 31, it is shown including both options. Similarly, control circuit 380 outputs control signals IFG and Gcnt for performing the external application and external monitoring of the negative voltage and the boosted voltage as well as for the pin contact test. Therefore, control signals used both for the negative voltage and boosted voltage will be generally referred to as IFG and Gcnt.

Internal voltage generating circuit 350 includes an oscillating circuit 352 which is selectively activated in response to forced monitor mode activating signal TEST, and a charge pump 354 performing charge pumping operation in response to an oscillating signal (clock signal) from oscillating circuit 352 for generating a prescribed internal voltage VPP/VBB. Charge pump 354 is constituted by a capacitor and a diode, and generates a boosted voltage VPP or a negative voltage VBB.

In internal voltage generating circuit 350, when forced monitor mode activating signal TEST designates an external application mode in which a prescribed voltage is externally applied, oscillating operation of oscillating circuit 352 is activated. Therefore, in the external application mode, the voltage at the output portion of the internal voltage generating circuit 350 can be accurately set to the prescribed voltage level easily. More specifically, when a voltage of a desired voltage level is to be externally applied and internal voltage generating circuit 350 is in operation, the external circuit must have considerably large current drivability to set the potential at the internal node at a prescribed voltage level regardless of the operation (especially when the absolute value of the internal voltage is to be reduced). However, in the external application mode, the operation of the internal voltage generating circuit 350 is stopped, and hence the internal node can be externally set to a prescribed voltage level by using a circuit which has relatively small current drivability.

Figure 32:
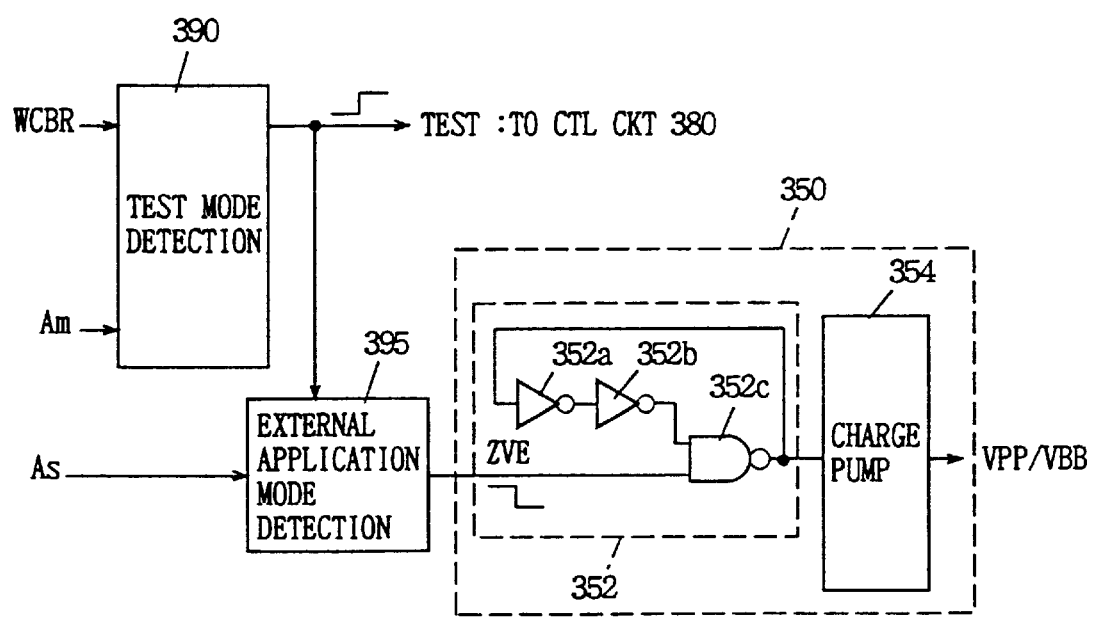
FIG. 32 schematically shows a structure of an internal voltage generating circuit and of a circuit portion generating a forced monitor mode activating signal shown in FIG. 31.

FIG. 32 shows the structure of the internal voltage generating circuit and a structure of a portion generating the test mode designating signal, shown in FIG. 31. Referring to FIG. 32, forced monitor mode activating signal TEST is output from a test mode detecting circuit 390 which receives a signal WCBR and an arbitrary address signal Am. If the semiconductor device is a dynamic random access memory (DRAM), the signal WCBR represents a state in which a write enable signal /WE and a column address strobe signal /CAS are set to the active state of low level prior to the fall of a row address strobe signal /RAS. If the signal /CAS is not used as in a semiconductor memory device having a static column mode, for example, a different signal (for example, a chip select signal) is utilized. What is necessary is that the test mode is designated based on timing relation of a plurality of control signals, and the condition is not limited to WCBR condition.

When WBCR condition is designated and the address signal Am indicates a prescribed value, test mode detection circuit 390 sets the forced monitor mode activating signal TEST to the active state of high level, and applies this signal to control circuit 380 shown in FIG. 31. The forced monitor mode activating signal TEST is activated both for the external application mode in which a voltage is externally applied to the internal node, and for the external monitor mode in which the internal voltage generated by the internal voltage generating circuit is externally monitored.

Oscillating circuit 352 included in internal voltage generating circuit 350 includes an even-number of stages of inverters (in FIG. 32, two stage of inverters) 352a and 352b, and an NAND gate 352c receiving an output signal from inverter 352b and an external application mode activating signal ZVE. An output signal from NAND gate 352 is applied to charge pump 354 as well as to the input portion of inverter 352a. External application mode activating signal ZVE is applied from an external application mode detection circuit 395 which receives the forced monitor mode activating signal TEST from test mode detection circuit 390 and the prescribed address signal As. External application mode detection circuit 395 is formed, for example, by an NAND type decoder. When the forced monitor mode activating signal TEST is active and the address signal As is at a prescribed logic level (for example, high level), the detecting circuit 395 determines that the external application mode has been designated, and sets the external application mode activating signal ZVE to the active state of low level.

When the signal ZVE is at the active state of low level, in oscillating circuit 352, the output signal from NAND gate 352c is fixed at the high level, and charge pump 354 stops the charge pumping operation. Therefore, when the external application mode is designated, oscillation of oscillating circuit 352 can be stopped. When the internal voltage is to be externally monitored, the address signal As is inactive, and hence the signal ZVE output from external application mode detection circuit 395 is maintained at the inactive state of high level. Consequently, NAND gate 352c functions as an inverter, oscillating circuit 352 operates as a ring oscillator constituted by an odd-number of stages of inverters, and thus it generates an oscillation signal having a prescribed period and a prescribed pulse width and applies it to charge pump 354. By the charge pump operation of charge pump 354 based on the oscillating signal, the internal voltage VBB/VPP (negative voltage or boosted voltage) at a prescribed voltage level can be generated.

In the structure shown in FIG. 32, when there is a non-used pin terminal the signal for designating the test mode may be directly applied externally through the non-used pin terminal. Further, the internal structure of change pump 354 may be arbitrarily selected, provided that an internal voltage of a prescribed voltage level can be generated utilizing the charge pumping operation of the capacitor.

The number of stages of the inverters included in oscillating circuit 352 may also be selected arbitrarily.

As described above, in accordance with the seventeenth embodiment of the present invention, when a voltage of a prescribed voltage level is applied externally to the internal node, the operation of the internal voltage generating circuit is stopped. Therefore, the internal node can be set to the prescribed voltage level stably at high speed.

Other Embodiments

In the embodiments described above, a structure in which only a clamp circuit for the negative potential is provided, and a structure in which only a clamp circuit for a positive potential is provided, have been described. However, in each embodiment, the structure in which clamp circuit both for the negative and positive potentials is provided and forced monitor mode is performed, may be adopted.

As an element having clamping function, an insulated gate type field effect transistor operating in the diode mode has been described. However, any element may be used as long as it has clamping function. For example, in place of an MOS transistor receiving at its gate a fixed potential, a pn junction diode may be used. Further, in place of an MOS transistor receiving at its gate a control signal and the MOS transistor receiving at its gate the fixed potential, bipolar transistors may be used.

As for the level converting circuit included in the control circuit which generates a control signal in response to the forced monitor mode activating signal, a level converting circuit having arbitrary structure may be used, so long as it has level converting function. A structure for converting level of a selection signal from a decoder for applying a boosted voltage or a negative voltage to a selected word line in a nonvolatile semiconductor memory device may be utilized.

As for the negative voltage VBB, the substrate bias voltage applied to the semiconductor substrate region has been described as an example. However, the negative voltage may be the negative voltage transmitted to non-selected word lines in the DRAM. In the negative voltage word line method, negative voltage is transmitted to non-selected word lines when a word line is selected, in order to prevent flowing out of memory cell data caused by increase in potential at non-selected word lines because of capacitive coupling.

Further, the negative voltage may be the negative voltage applied to the selected word line in data writing in a nonvolatile semiconductor memory device. Further, the negative voltage may be a body potential applied to the body region of an n channel MOS transistor of the semiconductor substrate formed on an SOI (Silicon On Insulator) substrate.

As the clamp element included in the first protection circuit, a field transistor having a field insulating film as the gate insulating film and a protective resistance are used. However, any structure may be used provided that it has operational potential of which absolute value is larger than the absolute value of the operational potential (at which the clamp circuit is rendered conductive) of the clamp circuit which is rendered conductive when a negative surge potential is applied. For example, a PN diode, or a bipolar transistor having large current amplification rate, hfe, may be used. This also applies to the element for discharging the positive surge potential to the power supply node in the second protection circuit. Any element may be used provided that it has a larger operational potential than the operational potential of the clamping circuit discharging the positive surge potential. The present invention is applicable to any device which has a clamp circuit for protection. Further, by utilizing diffusion resistance as protecting resistance, the PN junction between the diffusion resistance and substrate region can be utilized as a diode for clamp element, and hence protection circuit can be implemented while efficiently using the chip area.

Types of Characteristic Tests

Figure 33A:
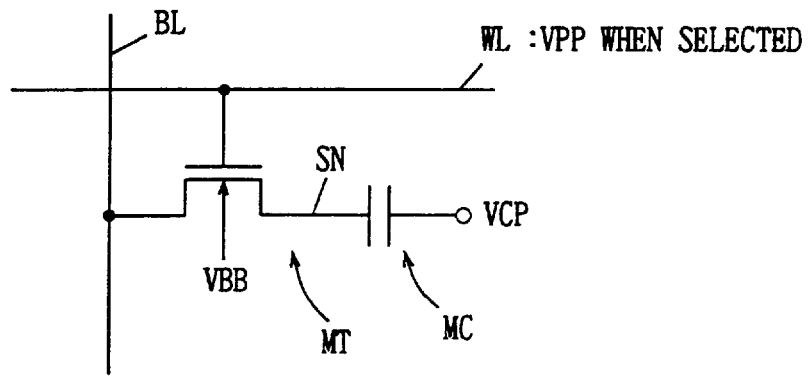
FIGS. 33A to 33C are illustrations related to failure mode acceleration test.

FIG. 33A shows a structure of a memory cell of a dynamic semiconductor memory device. In the semiconductor memory device, the memory cells are arranged in a matrix of rows and columns, and for each row and each column, a word line WL and a pair of bit lines (pair) BL are arranged.

Referring to FIG. 33A, one word line WL and one bit line BL are shown. A memory cell includes a memory capacitor MC which stores information in the form of charges, and an access transistor MT which is responsive to a signal potential on the corresponding word line WL for connecting one electrode node (storage node) SN to the bit line BL, and which is formed by an n channel MOS transistor. To the substrate region of access transistor MT, a negative voltage VBB generated from a substrate potential generating circuit is applied. To the other electrode node (cell place electrode) of memory capacitor MC, cell plate voltage VCP at an intermediate potential level is applied.

When selected, a boosted voltage VPP is applied to the word line WL. Consequently, when a high level data on bit line BL is to be written to memory capacitor MC, lowering of the voltage level of write data caused by threshold voltage loss at the access transistor MT can be prevented. By setting higher the voltage level of the boosted voltage VPP, voltage stress to the gate insulating film of access transistor MT becomes higher, and hence if there is potential defects in the gate insulating film, the defects become apparent. More specifically, by setting higher the voltage level of the boosted voltage VPP, failure mode can be accelerated. Further, by lowering the voltage level of the boosted voltage VPP and transmitting write data to the storage node SN of memory capacitor MC and checking whether or not data is correctly written to the storage node SN, margin defect with respect to the boosted voltage can be determined. Detection of margin defect with respect to the boosted voltage VPP is determined by checking whether data "1" is correctly stored in the memory cell or not.

Figure 33B:
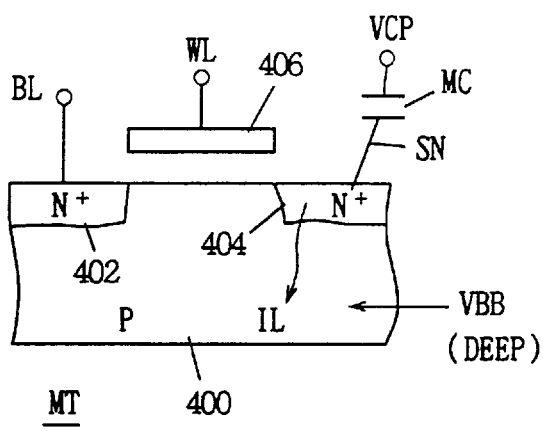

FIG. 33B schematically shows a cross-sectional structural of the access transistor of the memory cell shown in FIG. 33A. Access transistor MT includes highly doped n type impurity regions 402 and 404 formed at a p type semiconductor substrate region 400, and a gate electrode layer 406 formed on a channel region between impurity regions 402 and 404 with a gate insulating film (not shown) interposed. Impurity region 402 is connected to bit line BL, and gate electrode layer 406 is connected to word line WL. Impurity region 404 is coupled to memory capacitor MC. Memory capacitor MC may have a stacked capacitor structure, or it may have a trench capacitor structure. In order to reduce time necessary for pause refresh (static data retention) characteristic test, a negative voltage VBB applied to the semiconductor region 400 is made deep (absolute value is increased).

The pause refresh characteristic represents how accurately the memory cell holds the stored data in a standby state of the memory cell. In the standby state, the potential of the word line WL is set to the low level which corresponds to the ground voltage VSS (or a negative potential level). The bit line BL is held at an intermediate potential level. In the standby state, charges held in the storage node SN decrease, mainly because of a leak current IL at the substrate region 400. In this case, by making the bias voltage VBB more negative, the electric field applied to the PN junction between substrate region 400 and impurity region 404 becomes stronger, and charges held in storage node SN leak to the substrate region 400. Therefore, in a memory cell having poor charge holding characteristic, i.e., having large leak current, there is a large leak current IL because of this strong electric field, and held data is lost quickly. Therefore, by accelerating the failure mode, defective memory cells can be detected at high speed (in short period).

Figure 33C:
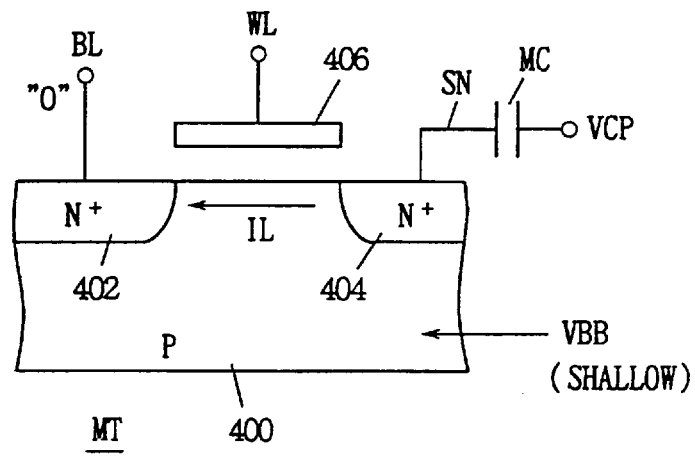

FIG. 33C shows a method of performing a disturb refresh (dynamic data retention) characteristic test. Disturb refresh characteristic represents data retention characteristic of non-selected memory cells when a word lien is selected. In this state, word line WL is set to a non-selected state of low level (ground voltage or negative potential). Potential of the bit line BL changes to the high level or to the low level in accordance with the memory cell data connected to another selected word line, which is not shown. When the potential of the bit line BL is at the low level which corresponds to the level of the ground voltage, high level data is stored in the impurity region 404 (storage node SN) and the threshold voltage of access transistor MT is low, leak current IL flows from impurity region 404 through impurity region 402 to bit line BL. In response, charges stored in storage node SN is lost, and stored data is destroyed. In order to accelerate the failure mode, the negative voltage VBB is made shallower (the absolute value is made smaller). Consequently, threshold voltage of access transistor MT becomes smaller (as the backgate effect becomes smaller), leak current IL is increased, and memory cells having poor charge retention characteristic lose data held therein at high speed, and therefore defects can be detected in a short period of time.

In the embodiments above, the output portion of the boosted voltage generating circuit or the negative voltage generating circuit is connected to the external terminal, by electrical connection to the internal node. However, a structure may be used in which not the output portion of the circuit generating an internal voltage but a node to which a voltage of a prescribed voltage level is transmitted is connected to the external terminal and read to the internal node in the forced monitor mode may be utilized.

In this case, the potential of an arbitrary internal node can be precisely identified externally. Therefore, when there is a defect in the final test of the semiconductor device, by monitoring the voltage to each of the internal nodes externally, defect analysis can be performed in non-destructive manner. This leads to reduced time necessary for defect analysis. For example, when there is a failure in writing of memory cell data, whether or not this is caused by reduced level of the boosted voltage applied to the word line can be determined externally, the cause of the word line writing failure can be easily identified, and the cause of defect can be easily analyzed.

As described above, according to the present invention, clamping function of a clamp circuit used for pin contact tests for the protection circuit provided at an internal node, which is electrically connected to an external terminal, can be selectively activated/inactivated in accordance with the operation mode. Therefore, pin contact test can be performed utilizing the clamp circuit, internal potential can be precisely monitored externally, and in addition, a voltage of a desired level can be applied to the internal node externally. Therefore, whether the internal voltage is acceptable or not can be determined and operation margin test of the semiconductor device by changing internal potential can be easily performed in non destructive manner. Therefore, in a test before shipment, acceleration tests other than the burn in mode in which a failure mode is accelerated can be performed easily and accurately, and hence time necessary for the final test before shipment can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

first clamping means coupled between an internal node coupled to an external terminal and a first reference voltage source node, for clamping potential at said internal node at a first prescribed potential level; and control means responsive to a test mode designating signal for generating and applying to said first clamping means, a control signal for inhibiting clamping operation of said first clamping means regardless of the voltage level at said internal node when said test mode designating signal is active.

2. The semiconductor device according to claim 1, wherein
said first clamping means includes at least one first insulated gate type field effect transistor and at least one second insulated gate type field effect transistor connected in series to each other between said internal node and said first reference voltage source node,
said at least one first insulated gate type field effect transistor receiving at a gate thereof a voltage on said first reference voltage source node, and
said at least one second insulated gate type field effect transistor receiving at a gate thereof the control signal from said control means.

3. The semiconductor device according to claim 2, wherein
said at least one first insulated gate type field effect transistor is connected to said internal node, and said at least one second insulated gate type field effect transistor is connected between said first insulated gate type field effect transistor and said first reference voltage source.

4. The semiconductor device according to claim 2, wherein
the second insulated gate type field effect transistor is connected to said internal node, and said at least one first insulated gate type field effect transistor is connected between said internal node and said at least one second insulated gate type field effect transistor.

5. The semiconductor device according to claim 2, wherein
said at least one first insulated gate type field effect transistor and said at least one second insulated gate type field effect transistor both have a first conductivity type.

6. The semiconductor device according to claim 1, wherein
said first clamping means includes one insulated gate type field effect transistor connected between said internal node and said first reference voltage source node and receiving at a gate thereof said control signal from said control means.

7. The semiconductor device according to claim 1, further comprising:
internal voltage generating means operating with the first reference voltage as one operating voltage for generating an internal voltage greater in absolute value than the voltage at said first reference voltage node;
internal voltage connecting means responsive to activation of said test mode designating signal for coupling an output portion of said internal voltage generating means to said internal node, and
said control means includes means for generating said control signal at a voltage level of the output portion of said internal voltage generating means when said test mode designating signal is active.

8. The semiconductor device according to claim 1, wherein
said first clamping means includes at least first and second insulated gate type field effect transistors connected in series between said internal node and said first reference voltage source node; and
said control means includes
first control signal generating means responsive to said test mode designating signal for generating and applying to the gate of said first insulated gate type field effect transistor, a first control signal which attains to such a voltage level that renders conductive said first insulated gate type field effect transistor when said test mode designating signal is active and attains to a voltage level generated by said first reference voltage source when said test mode designating signal is inactive, and
second control signal generating means responsive to said test mode designating signal for generating and applying to the gate of said second insulated gate type field effect transistor, a second control signal which attains to a voltage level transmitted to said internal node when said test mode designating signal is active and attains to the voltage level of said first reference voltage source node when said test mode designating signal is inactive.

9. The semiconductor device according to claim 6, wherein
said control means includes means for generating, as said control signal, a voltage at a voltage level of said first reference voltage source node when said test mode designating signal is inactive, and generating a voltage at a voltage level transmitted to said internal node when said test mode designating signal is active.

10. The semiconductor device according to claim 1, further comprising:
internal voltage generating means for generating an internal voltage greater in absolute value than the voltage of said first reference voltage source node; and
connecting means responsive to said control signal for coupling an output portion of said internal voltage generating means to said internal node.

11. The semiconductor device according to claim 2, further comprising:
internal voltage generating means for generating an internal voltage greater in absolute value than the voltage of said first reference voltage source node; and
connecting means responsive to said control signal for coupling an output portion of said internal voltage penetrating means to said internal node, wherein
said connecting means includes an n channel insulated gate type field effect transistor, and said second insulated gate type field effect transistor is an n channel insulated gate type field effect transistor;
said control means includes means responsive to said test mode designating signal for generating mutually complementary signals for application to the gate of the insulated gate type field effect transistor of said connecting means and to the gate of said second insulated gate type field effect transistor, respectively;
said second insulated gate type field effect transistor receives at the gate thereof a second reference voltage when said test mode designating signal is inactive, difference between the second reference voltage and the first reference voltage being greater than the absolute value of each threshold voltage of the insulated gate type field effect transistors, and receives at the gate a voltage at the output portion of said internal voltage generating means when said test mode designating signal is active; and the insulated gate type field effect transistor of said connecting means receives at the gate thereof a signal at a voltage level of the output portion of said internal voltage generating means when said test mode designating signal is inactive, and receives at the gate thereof a control signal at said second reference voltage level when said test mode designating signal is active.

12. The semiconductor device according to claim 10, wherein said first reference voltage source node supplies a ground voltage, and said internal voltage generating means generates a negative voltage lower than said ground voltage.

13. The semiconductor device according to claim 10, wherein said first reference voltage source node supplies a power supply voltage and said internal voltage generating means generates a high voltage higher than said power supply voltage.

14. The semiconductor device according to claim 2, wherein said first and second insulated gate type field effect transistors are p channel insulated gate type field effect transistors, and said first reference voltage source node supplies a power supply voltage.

15. The semiconductor device according to claim 1, wherein said clamping means includes
at least one first insulated gate type field effect transistor of a first conductivity type and at least two second insulated gate type field effect transistors of the first conductivity type connected in series between said internal node and said first reference voltage source node,
said at least one first insulated gate type field effect transistor receiving at a gate thereof a voltage from said first reference voltage source node;

said control means includes
first control signal generating means for applying a first internal voltage to the gate of one of said two second insulated gate type field effect transistors when a first test mode specifying signal of said test mode designating signal is active, and applying to the gate of said one insulated gate type field effect transistor a voltage enabling formation of a channel therein when said first test mode specifying signal is inactive, and
second control signal generating means for generating a second internal voltage for application to the gate of the other one of said at least two second insulated gate type field effect transistors when a second test mode specifying signal of said test mode designating signal is active, and for generating a voltage allowing formation of a channel in said the other insulated gate type field effect transistor for application to the gate of said the other insulated gate type field effect transistor when said second test mode specifying signal is inactive; wherein when said test mode designating signal is inactive, one of said first and second test mode specifying signals is activated and the other is kept inactive.

16. The semiconductor device according to claim 15, further comprising:

a first connection gate responsive to activation of said first test mode specifying signal for connecting said internal node to an output portion of a first internal voltage generating means generating said first internal voltage; and a second connection gate responsive to activation of said second test mode specifying signal for coupling an output portion of a second internal voltage generating means generating said second internal voltage to said internal node.

17. The semiconductor device according to claim 1, further comprising:

second clamping means coupled between said internal node and a second reference voltage source node different from said first reference voltage source node for clamping voltage at said internal node at a second clamp level; and second control means responsive to activation of a second test mode designating signal for generating and applying to said second clamping means a control signal which inactivates clamping function of said second clamping means.

18. The semiconductor device according to claim 17, wherein said second clamping means includes at least one first insulated gate type field effect transistor receiving at a gate thereof a voltage of said second reference voltage source node, and at least one second insulated gate type field effect transistor in which a channel is selectively formed in response to said control signal, said first and second insulated gate type field effect transistors being connected in series to each other between said second reference voltage source node and said internal node.

19. The semiconductor device according to claim 1, further comprising:

internal voltage generating means for generating an internal voltage greater in absolute value than the voltage supplied at said first reference voltage source node;

connection control means responsive to said test mode designating signal for coupling an output portion of said internal voltage generating means to said internal node; and stopping means responsive to activation of said test mode designating signal for inactivating said internal voltage generating means to stop internal voltage generating operation.

20. A semiconductor device, comprising:

internal voltage generating means for generating an internal voltage of a prescribed level different from a level of an internal operating power supply voltage;

means, responsive to activation of a test mode designating signal, for stopping internal voltage generating operation of said internal voltage generating means; and means for applying an externally applied voltage to output portion of said internal voltage generating means in response to said test mode designating signal being active.

* * * * *